(12) United States Patent
Ikeda

(10) Patent No.: US 10,027,896 B2
(45) Date of Patent: Jul. 17, 2018

(54) IMAGE DISPLAY SYSTEM, OPERATION METHOD OF THE SAME, AND ELECTRONIC DEVICE

(71) Applicant: SEMICONDUCTOR ENERGY LABORATORY CO., LTD., Atsugi-shi, Kanagawa-ken (JP)

(72) Inventor: Takayuki Ikeda, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 16 days.

(21) Appl. No.: 15/392,254

(22) Filed: Dec. 28, 2016

(65) Prior Publication Data
US 2017/0208254 A1   Jul. 20, 2017

(30) Foreign Application Priority Data
Jan. 15, 2016 (JP) ................. 2016-005737

(51) Int. Cl.
| | |
|---|---|
| H04N 5/232 | (2006.01) |
| H01L 27/12 | (2006.01) |
| H01L 27/146 | (2006.01) |
| H01L 27/32 | (2006.01) |
| H01L 29/16 | (2006.01) |

(Continued)

(52) U.S. Cl.
CPC ..... *H04N 5/23293* (2013.01); *H01L 27/1207* (2013.01); *H01L 27/1225* (2013.01); *H01L 27/14612* (2013.01); *H01L 27/3234* (2013.01); *H01L 27/3262* (2013.01); *H01L 29/16* (2013.01); *H01L 29/24* (2013.01); *H01L 29/7869* (2013.01); *H04N 5/3698* (2013.01); *H04N 5/378* (2013.01); *H01L 27/14621* (2013.01); *H01L 27/14627* (2013.01); *H01L 27/14636* (2013.01)

(58) Field of Classification Search
None
See application file for complete search history.

(56) References Cited

U.S. PATENT DOCUMENTS

| | | |
|---|---|---|
| 7,674,650 B2 | 3/2010 | Akimoto et al. |
| 7,732,819 B2 | 6/2010 | Akimoto et al. |

(Continued)

FOREIGN PATENT DOCUMENTS

| | | |
|---|---|---|
| JP | 2007-096055 A | 4/2007 |
| JP | 2007-123861 A | 5/2007 |

(Continued)

*Primary Examiner* — James Hannett
(74) *Attorney, Agent, or Firm* — Nixon Peabody LLP; Jeffrey L. Costellia

(57) ABSTRACT

To provide an image display system in which an imaging device and a display device are combined. The image display system includes the imaging device including a plurality of pixel blocks and the display device including a plurality of display regions. Image data obtained in the first imaging mode is displayed on the display device as an image, and then, the imaging device switches to the second imaging mode to obtain data of whether an object is changed or not. If the object is changed, the imaging device switches to the first imaging mode, obtain image data newly, and then display the new image on the display device. If the object is not changed, display of the image stored in the display region is maintained and image rewriting is not performed.

18 Claims, 49 Drawing Sheets

(51) Int. Cl.
　　　*H01L 29/24* (2006.01)
　　　*H01L 29/786* (2006.01)
　　　*H04N 5/369* (2011.01)
　　　*H04N 5/378* (2011.01)

(56) References Cited

U.S. PATENT DOCUMENTS

| | | | |
|---|---|---|---|
| 7,910,490 B2 | 3/2011 | Akimoto et al. | |
| 7,932,521 B2 | 4/2011 | Akimoto et al. | |
| 8,274,077 B2 | 9/2012 | Akimoto et al. | |
| 8,378,391 B2 | 2/2013 | Koyama et al. | |
| 8,466,463 B2 | 6/2013 | Akimoto et al. | |
| 8,531,618 B2 | 9/2013 | Koyama et al. | |
| 8,629,069 B2 | 1/2014 | Akimoto et al. | |
| 8,669,550 B2 | 3/2014 | Akimoto et al. | |
| 8,790,959 B2 | 7/2014 | Akimoto et al. | |
| 8,796,069 B2 | 8/2014 | Akimoto et al. | |
| 8,854,286 B2 | 10/2014 | Yamazaki et al. | |
| 8,916,869 B2 | 12/2014 | Koyama et al. | |
| 9,099,562 B2 | 8/2015 | Akimoto et al. | |
| 9,331,112 B2 | 5/2016 | Koyama et al. | |
| 9,368,082 B2 | 6/2016 | Yamazaki et al. | |
| 9,455,287 B2 | 9/2016 | Kurokawa | |
| 9,520,411 B2 | 12/2016 | Takahashi et al. | |
| 2005/0052439 A1 | 3/2005 | Liou | |
| 2011/0090204 A1 | 4/2011 | Yamazaki et al. | |
| 2011/0141069 A1 | 6/2011 | Hirakata et al. | |
| 2014/0002516 A1 | 1/2014 | Koyama et al. | |
| 2015/0281560 A1* | 10/2015 | Inoue | H04N 5/23212 348/222.1 |
| 2015/0332568 A1 | 11/2015 | Kurokawa | |
| 2015/0340513 A1 | 11/2015 | Akimoto et al. | |
| 2016/0021314 A1 | 1/2016 | Kurokawa et al. | |
| 2016/0037106 A1 | 2/2016 | Ohmaru | |
| 2016/0232868 A1 | 8/2016 | Yamazaki et al. | |
| 2016/0233252 A1 | 8/2016 | Koyama et al. | |
| 2017/0004788 A1 | 1/2017 | Yamazaki et al. | |
| 2017/0186365 A1 | 6/2017 | Yoneda | |
| 2017/0332008 A1* | 11/2017 | Tsuchiya | H04N 5/23216 |

FOREIGN PATENT DOCUMENTS

| | | |
|---|---|---|
| JP | 2011-119711 A | 6/2011 |
| JP | 2011-141522 A | 7/2011 |

* cited by examiner

FIG. 2A
FIG. 2B
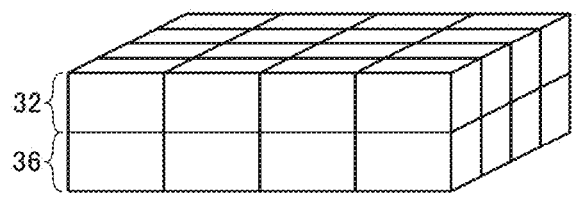
FIG. 2C
FIG. 2D
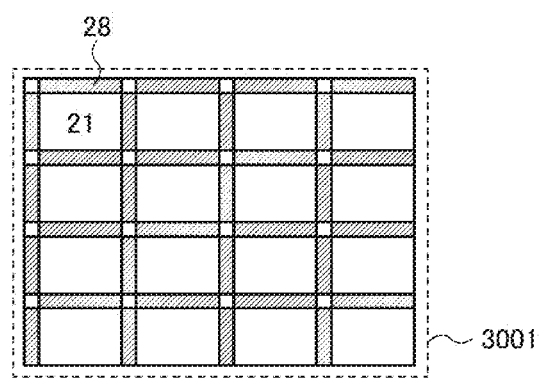

43  44  600

43  660  44

FIG. 17A
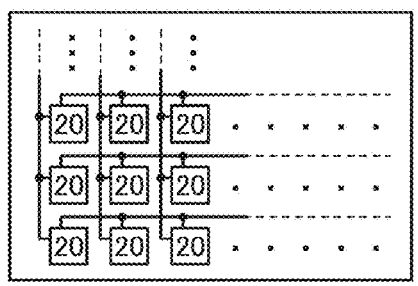
FIG. 17B1
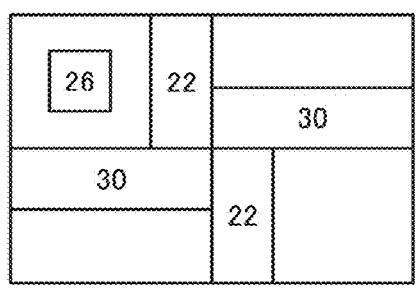
FIG. 17B2
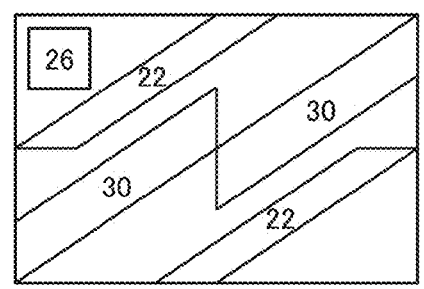
FIG. 17C
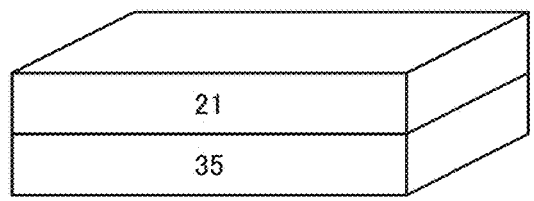

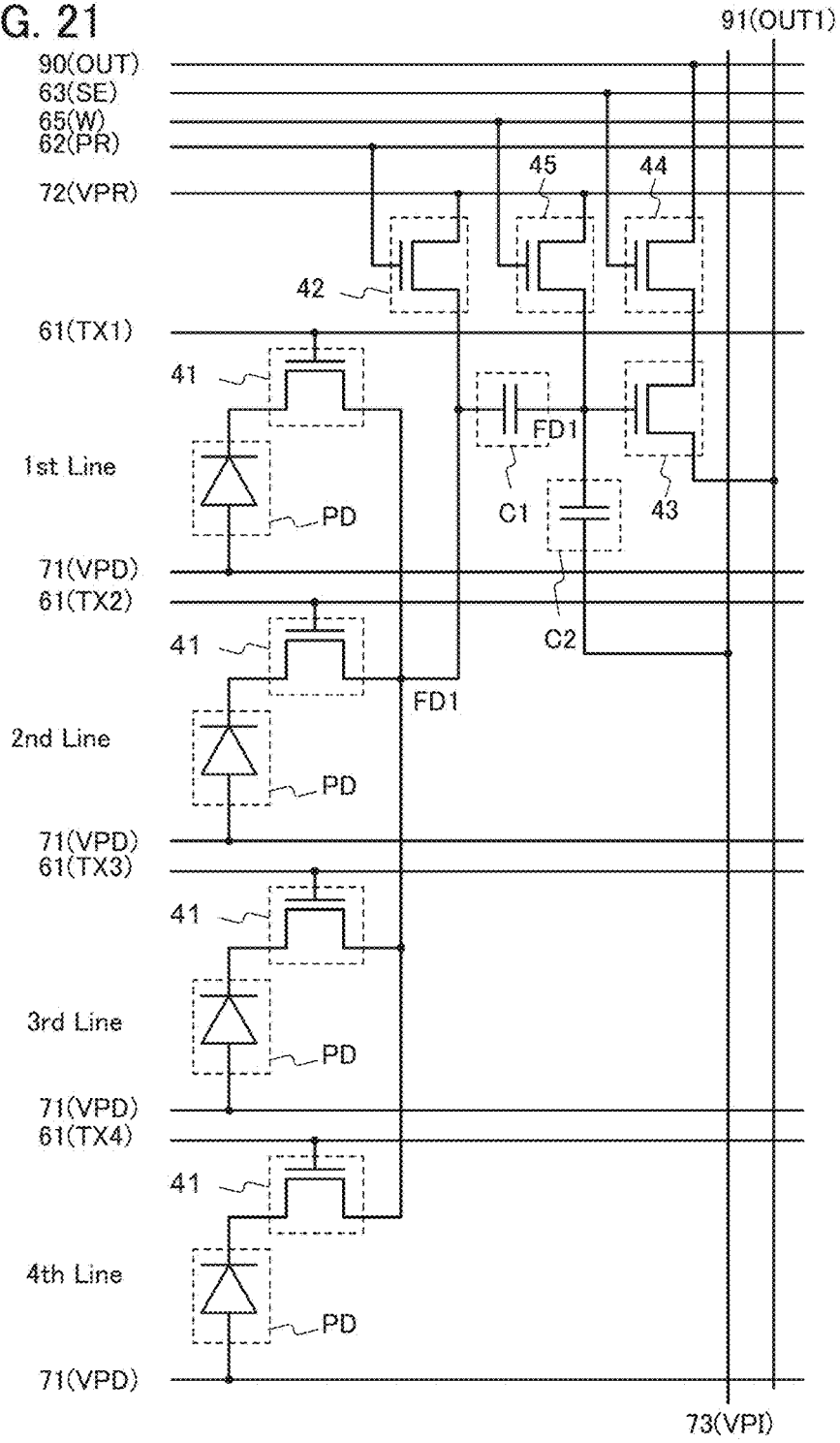

FIG. 22A1
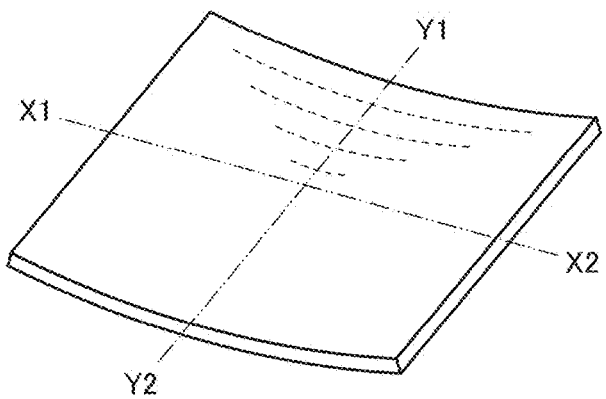
FIG. 22A2
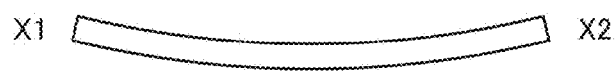
FIG. 22A3
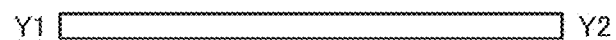
FIG. 22B1
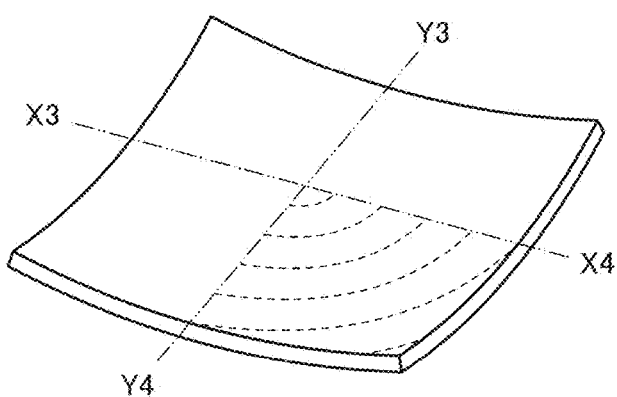
FIG. 22B2
FIG. 22B3
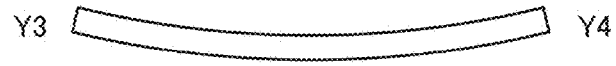

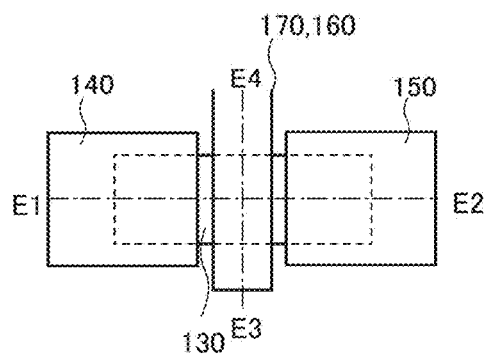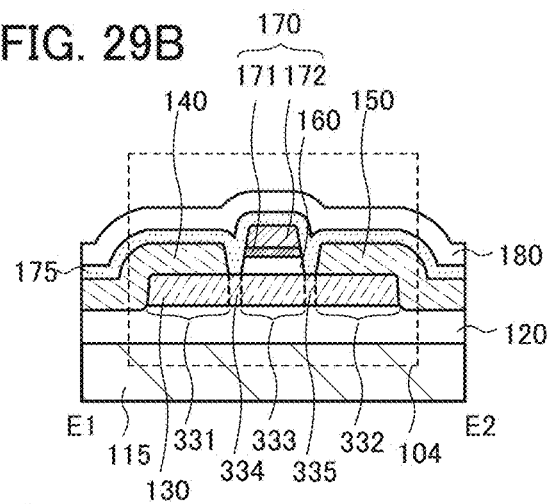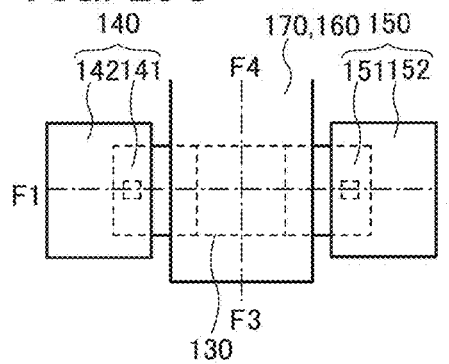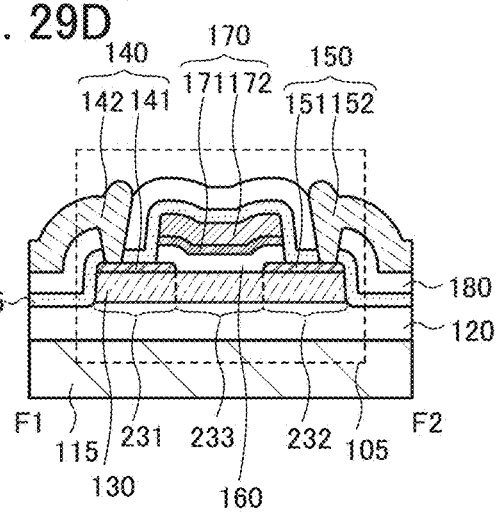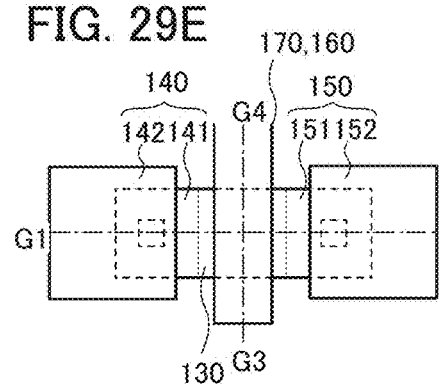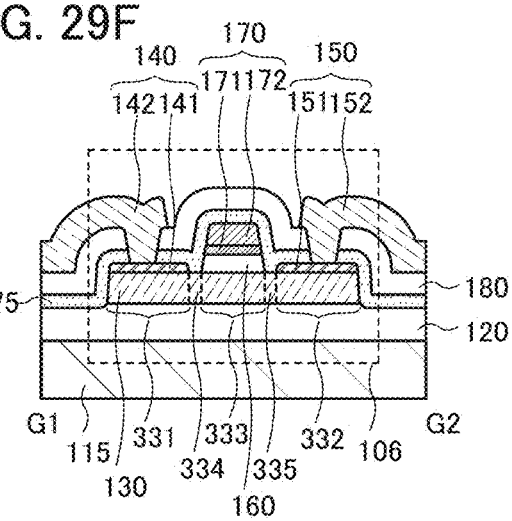

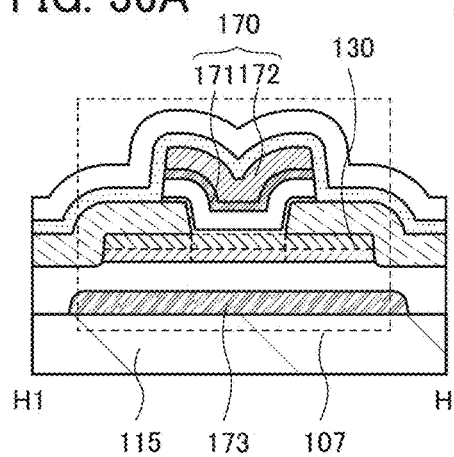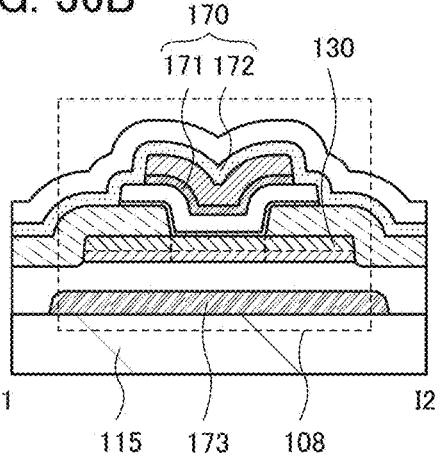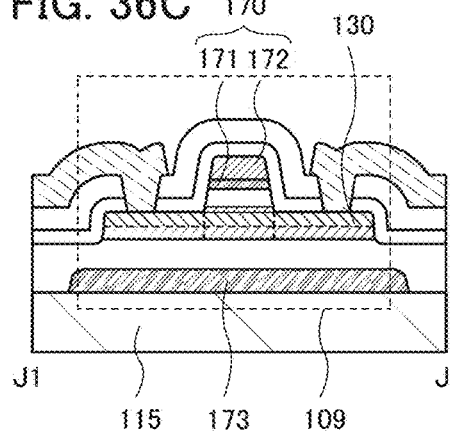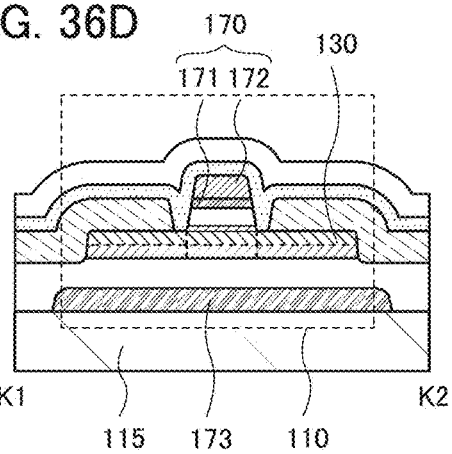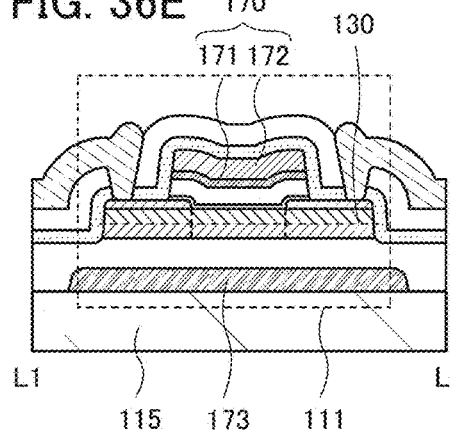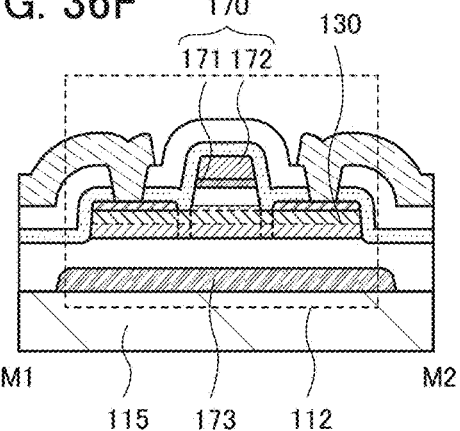

FIG. 43A
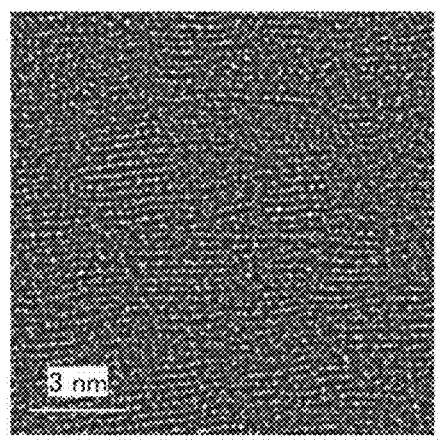
FIG. 43B
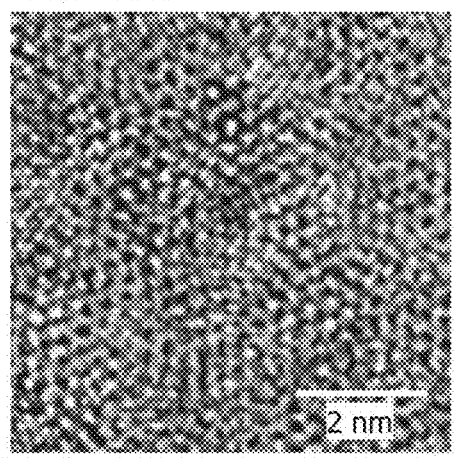
FIG. 43C
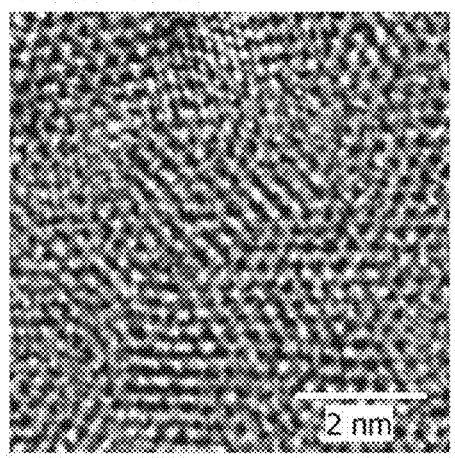
FIG. 43D
FIG. 43E
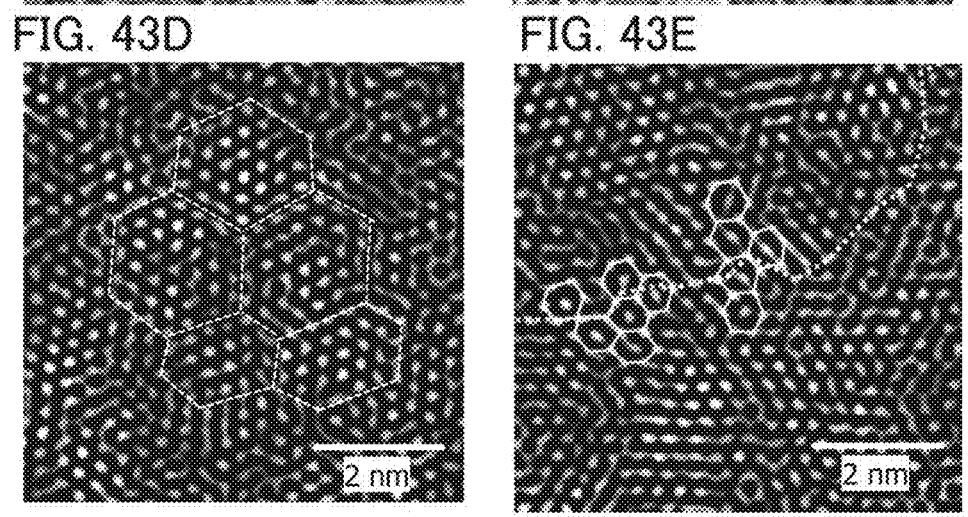

IMAGE DISPLAY SYSTEM, OPERATION METHOD OF THE SAME, AND ELECTRONIC DEVICE

BACKGROUND OF THE INVENTION

1. Field of the Invention

One embodiment of the present invention relates to a system which displays an image with low power consumption.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, an imaging device, a method for operating any of them, and a method for manufacturing any of them.

In this specification and the like, a semiconductor device generally means a device that can function by utilizing semiconductor characteristics. A transistor and a semiconductor circuit are embodiments of semiconductor devices. In some cases, a memory device, a display device, an imaging device, or an electronic device includes a semiconductor device.

2. Description of the Related Art

As a semiconductor material applicable to a transistor, an oxide semiconductor has been attracting attention. For example, a technique for forming a transistor using zinc oxide or an In—Ga—Zn-based oxide semiconductor as an oxide semiconductor is disclosed (see Patent Documents 1 and 2).

Patent Document 3 discloses an imaging device in which a transistor including an oxide semiconductor is used in part of a pixel circuit.

Patent Document 4 discloses a liquid crystal display device in which a transistor including an oxide semiconductor is used in a pixel and an image signal can be retained in the pixel for a long period by turning off the transistor.

REFERENCE

Patent Document

[Patent Document 1] Japanese Published Patent Application No. 2007-123861
[Patent Document 2] Japanese Published Patent Application No. 2007-096055
[Patent Document 3] Japanese Published Patent Application No. 2011-119711
[Patent Document 4] Japanese Published Patent Application No. 2011-141522

SUMMARY OF THE INVENTION

Electronic devices including an imaging device, a display device, or the like are required to image or display a high-definition image. Meanwhile, as an image has higher definition, power consumption of an electronic device is increased because processing of more data is needed.

An object of one embodiment of the present invention is to provide an image display system including an imaging device and a display device. Another object of one embodiment of the present invention is to provide an image display system with low power consumption including an imaging device and a display device. Another object of one embodiment of the present invention is to provide an image display system which includes an imaging device capable of performing pixel division driving and a plurality of display devices arranged in a matrix. Another object of one embodiment of the present invention is to provide an image display system including an imaging device having a difference detection function and a display device which operates while retaining image data. Another object of one embodiment of the present invention is to provide an image display system including a novel imaging device and a novel display device. Another object of one embodiment of the present invention is to provide an operation method of the image display system. Another object of one embodiment of the present invention is to provide a novel semiconductor device or the like.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention relates to an image display system which includes an imaging device including a plurality of pixel blocks and a display device including a plurality of display regions.

One embodiment of the present invention relates to an image display system including an imaging device and a display device. The imaging device includes a first pixel block and a second pixel block. The display device includes a first display region and a second display region. The first pixel block and the second pixel block each include pixels for imaging. The first display region and the second display region each include pixels for display. Image data output from the first pixel block or the second pixel block is displayed as an image on the first display region or the second display region. The imaging device includes a first mode in which the image data is obtained and a second mode in which whether an object is changed or not is detected. Each of the pixels for display is configured to retain image data. The imaging device is configured to, in the first pixel block and the second pixel block, obtain the image data in the first mode and then switch to the second mode, switch the first pixel block and/or the second pixel block in which a change of the object is detected in the second mode to the first mode, and obtain new image data in the first pixel block and/or the second pixel block which is switched to the first mode. The display device is configured to, in the first display region and the second display region, retain the image data obtained in the first mode in the pixels for display, display the image data obtained in the first mode as an image in each of the pixels for display, and rewrite one of the image displayed in the first display region and the image displayed in the second display region.

The pixel block can include the pixels for imaging arranged in a matrix, a driver circuit, a data converter circuit. The pixels for imaging can each include a photoelectric conversion element and a first transistor including an oxide semiconductor in an active layer. The driver circuit can include a second transistor including silicon in an active layer or an active region. The data converter circuit can include a third transistor including silicon in an active layer or an active region. The photoelectric conversion element can include a region overlapping with the first transistor. The photoelectric conversion element can include a region overlapping with the second transistor or the third transistor.

The display region can include the pixels for display arranged in a matrix and a driver circuit, and the pixels for display can each include a fourth transistor including an oxide semiconductor in a semiconductor layer.

The display region may have flexibility.

The oxide semiconductor preferably includes In, Zn, and M (M is Al, Ga, Y, or Sn).

One embodiment of the present invention is a method for operating an image display system including: a first step of operating an imaging device including a plurality of pixel blocks in a first mode and obtaining a plurality of pieces of first image data on an object in each of the plurality of pixel blocks; a second step of transmitting the plurality of pieces of first image data to a display device including a plurality of display regions; a third step of retaining each of the plurality of pieces of first image data in each of the display regions and displaying each of the plurality of pieces of first image as an image; a fourth step of operating the imaging device in a second mode and obtaining data of a change of the object; a fifth step of determining whether the object is changed or not; a sixth step of switching pixel blocks in which it is determined that the object is changed in the fifth step to the first mode and obtaining a plurality of pieces of second image data; a seventh step of transmitting the pieces of second image data to the display device; an eighth step of retaining each of the plurality of pieces of second image data in corresponding display region and displaying each of the plurality of pieces of second image data as an image. The first step to the fifth step are performed in the above order. The sixth step is performed when it is determined that the object is changed in the fifth step. The sixth step to the eighth step are performed in the above order and the imaging device returns to the fourth step. When it is determined that the object is not changed in the fifth step, the imaging device returns to the fourth step.

It is preferable that in a period from the fourth step to the seventh step, image data retained in each of the display regions not be rewritten.

According to one embodiment of the present invention, an image display system including an imaging device and a display device can be provided. An image display system with low power consumption including an imaging device and a display device can be provided. An image display system which includes an imaging device capable of performing pixel division driving and a plurality of display devices arranged in a matrix can be provided. An image display system including an imaging device having a difference detection function and a display device which operates while retaining image data can be provided. An image display system including a novel imaging device and a novel display device can be provided. An operation method of the image display system can be provided. A novel semiconductor device or the like can be provided.

Note that one embodiment of the present invention is not limited to these effects. For example, depending on circumstances or conditions, one embodiment of the present invention might produce another effect. Furthermore, depending on circumstances or conditions, one embodiment of the present invention might not produce any of the above effects.

BRIEF DESCRIPTION OF THE DRAWINGS

FIGS. 2A to 2D illustrate an imaging device.

FIGS. 17A, 17B1, 17B2, and 17C are top views and a perspective view illustrating a structure of an imaging device.
FIG. 21 is a circuit diagram illustrating pixels.
FIGS. 22A1 to 22A3 and 22B1 to 22B3 illustrate bent imaging devices.
FIGS. 29A to 29F are top views and cross-sectional views illustrating transistors.

FIGS. 36A to 36F each illustrate a cross section of a transistor in a channel length direction.

FIGS. 43A to 43E show a cross-sectional TEM image and plan-view TEM images of a CAAC-OS and images obtained through analysis thereof.

DETAILED DESCRIPTION OF THE INVENTION

Figure 1A:
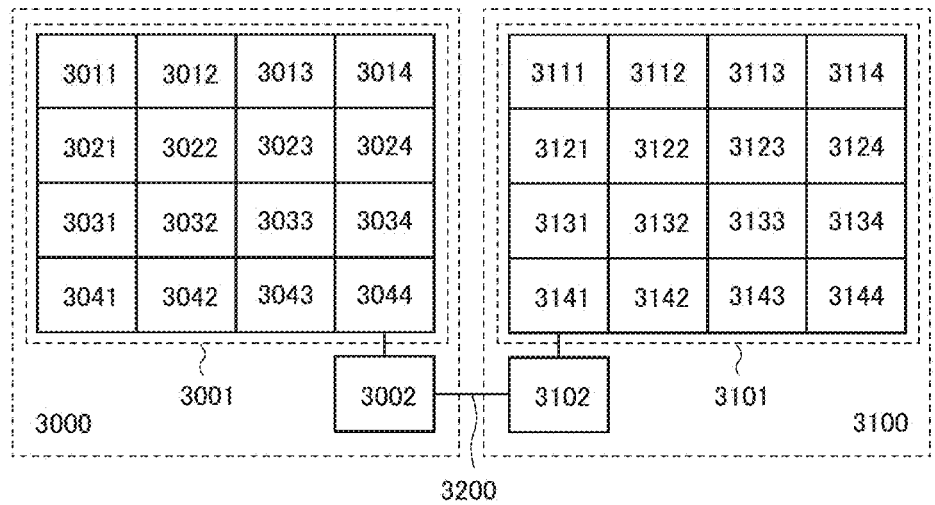
FIGS. 1A to 1E illustrate an image display system.

Embodiments will be described in detail with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments. In structures of the invention described below, the same portions or portions having similar functions are denoted by the same reference numerals in different drawings, and the description thereof is not repeated in some cases. The same components are denoted by different hatching patterns in different drawings, or the hatching patterns are omitted in some cases.

Note that the ordinal numbers such as "first" and "second" are used for convenience and do not denote the order of steps or the stacking order of layers. Therefore, for example, the term "first" can be replaced with the term "second", "third", or the like as appropriate. In addition, the ordinal numbers in this specification and the like do not correspond to the ordinal numbers which specify one embodiment of the present invention in some cases.

For example, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts.

Here, each of X and Y denotes an object (e.g., a device, an element, a circuit, a wiring, an electrode, a terminal, a conductive film, or a layer).

Examples of the case where X and Y are directly connected include the case where an element that enables electrical connection between X and Y (e.g., a switch, a transistor, a capacitor, an inductor, a resistor, a diode, a display element, a light-emitting element, or a load) is not connected between X and Y, and the case where X and Y are connected without the element that enables electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a difference amplifier circuit, a source follower circuit, or a buffer circuit; a signal generation circuit; a storage circuit; or a control circuit) can be connected between X and Y. Note that for example, in the case where a signal output from X is transmitted to Y even when another circuit is provided between X and Y, X and Y are functionally connected. The case where X and Y are functionally connected includes the case where X and Y are directly connected and X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the explicit description "X and Y are connected".

For example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to part of Z1 and another part of Z1 is directly connected to X while a drain (or a second terminal or the like) of the transistor is directly connected to part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in that order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in that order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are connected in that order". When the connection order in a circuit structure is defined by an expression similar to the above examples, a source (or a first terminal or the like) and a drain (or a second terminal or the like) of a transistor can be distinguished from each other to specify the technical scope.

Other examples of the expressions include "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path". It is also possible to use the expression "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path". Still another example of the expressions is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film functions as the wiring and the electrode. Thus, the term "electrical connection" in this specification also means such a case where one conductive film has functions of a plurality of components.

Note that the terms "film" and "layer" can be interchanged with each other depending on circumstances or conditions. For example, the term "conductive layer" can be changed into the term "conductive film" in some cases. In addition, the term "insulating film" can be changed into the term "insulating layer" in some cases.

Note that in general, a potential (a voltage) is relative and is determined depending on the amount relative to a certain potential. Therefore, even when the expression "ground", "GND", or the like is used, the potential is not necessarily 0 V. For example, the "ground potential" or "GND" may be defined using the lowest potential in a circuit as a reference. Alternatively, the "ground potential" or "GND" may be defined using an intermediate potential in a circuit as a reference. In those cases, a positive potential and a negative potential are set using the potential as a reference.

Embodiment 1

In this embodiment, a structure and an operation of an image display system which is one embodiment of the present invention will be described.

One embodiment of the present invention is an image display system which includes an imaging device including a plurality of pixel blocks and a display device including a plurality of display regions. In this specification, a pixel block refers to a region including a pixel for imaging. Moreover, a display region refers to a region including a pixel for display.

For example, pixel blocks included in an imaging device are arranged in a matrix, and pixels for imaging included in the pixel blocks are arranged in a matrix. Display regions included in the display device are arranged in a matrix, and pixels for display included in the display regions are arranged in a matrix.

Image data output from one pixel block is displayed as an image on one display region which is determined in advance.

Each pixel block can operate in a first imaging mode in which image data of an object is obtained or a second imaging mode in which data on whether the object is changed or not is obtained. The pixels for display in the display regions can store image data.

In other words, in the image display system of one embodiment of the present invention, image data obtained in the first imaging mode is displayed as an image on the display device, the imaging device switches to the second imaging mode, and then, data on whether an object is changed or not is obtained. In the case where the object is changed, the imaging device switches to the first imaging mode, image data is newly obtained, and then, the new image is displayed on the display device. In the case where the object is not changed, display of an image retained in the display region is kept and rewriting an image is not performed. Alternatively, an operation in which the frequency of rewriting is reduced is performed.

The imaging device switches to the second imaging mode; thus, power consumption can be reduced. In the case where new image data is obtained, only pixel blocks which are changed switch to the first imaging mode. In each display region included in the display device, the frequency of rewriting image data can be changed in accordance with a signal transmitted from each pixel block of the imaging device, which leads to low power consumption.

FIG. 1A is a block diagram illustrating an imaging device 3000 and a display device 3100 included in the image display system of one embodiment of the present invention.

The imaging device 3000 includes a sensor portion 3001 and a peripheral circuit 3002. The sensor portion 3001 includes a plurality of pixel blocks arranged in a matrix. Although FIG. 1A illustrates an example where pixel blocks 3011 to 3044 are arranged in four rows and four columns, one embodiment of the present invention is not limited thereto. Pixel blocks may be arranged in m rows and n columns (m and n each are a natural number of 1 or more, excluding the case where both of m and n are 1).

The sensor portion 3001 is a stack of a pixel array 32 in which pixel arrays 21a to 21p are arranged in a matrix as illustrated in FIG. 2A and a circuit portion 36 in which circuit portions 35a to 35p are arranged in a matrix as illustrated in FIG. 2B (see FIG. 2C).

In other words, each pixel block includes a pixel array and a circuit portion. Each pixel array can include pixels for imaging, and each circuit portion can include a circuit for driving stacked pixel arrays, a data converter circuit, a noise removal circuit, or the like. For example, the pixel block 3011 illustrated in FIG. 1A includes the pixel array 21a and the circuit portion 35a.

In order to obtain such a structure of the imaging device 3000, the structure in which a pixel array and a circuit portion are stacked as described above is preferably employed. In the structure where the pixel arrays 21 in which a driver circuit or the like is provided at their end portions are arranged in a matrix, a plurality of regions 28 where pixels cannot be arranged at regular intervals are formed in the pixel array as illustrated in FIG. 2D, and when imaging is performed in the entire pixel array, image data is lacked.

Although the whole sensor portion 3001 has a function of obtaining one image, the pixel blocks 3011 to 3044 can independently perform an imaging operation, a data conversion operation, a data output operation, or the like.

Image data or the like output from the sensor portion 3001 is input to the peripheral circuit 3002 having a function of data conversion, communication, control of the sensor portion 3001, or the like and is output to the outside.

The display device 3100 includes a display portion 3101 and a peripheral circuit 3102. The display portion 3101 includes a plurality of display regions arranged in a matrix. Although FIG. 1A illustrates an example where the display regions 3111 to 3144 are arranged in four rows and four columns, one embodiment of the present invention is not limited thereto. Display regions may be arranged in m rows and n columns (m and n each are a natural number of 1 or more, excluding the case where both of m and n are 1).

One display region can serve as one of a plurality of regions obtained by dividing one display panel. Alternatively, one display region can serve as one display panel. In one embodiment of the present invention, the latter case is preferable because control is complicated in the former case.

The peripheral circuit 3102 has a function of data conversion, communication, control of the display portion 3101, or the like. For example, image data input to the peripheral circuit 3102 is converted to appropriate data and is output to the display portion 3101 to be displayed as an image.

Figure 1B:
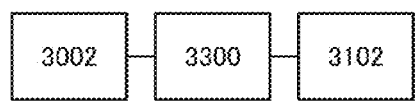
Figure 1C:
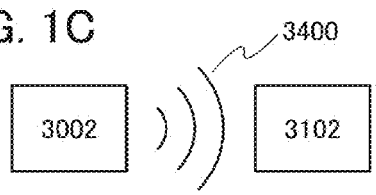
Figure 1D:
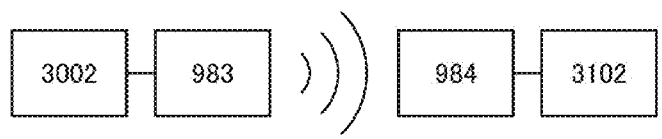
Figure 1E:
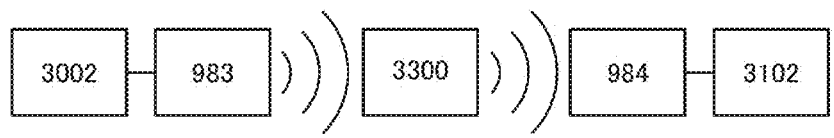

Data transmission from the imaging device 3000 to the display device 3100 can be performed with a transmission line 3200 which connects the peripheral circuit 3002 and the peripheral circuit 3102. Note that there is no limitation to the structure where the peripheral circuit 3002 and the peripheral circuit 3102 are directly connected to each other with the transmission line 3200. As illustrated in FIG. 1B, the peripheral circuit 3002 and the peripheral circuit 3102 may be connected to each other through an external device 3300 including a data converter circuit and/or a memory device. Alternatively, the peripheral circuit 3002 and the peripheral circuit 3102 may have a function of transmitting data by wireless communication using electromagnetic waves 3400 as illustrated in FIG. 1C. Alternatively, as illustrated in FIG. 1D, the peripheral circuit 3002 and a transmitter 983 may be connected to each other with a transmission line, the peripheral circuit 3102 and a receiver 984 may be connected to each other with a transmission line, and data may be transmitted between the transmitter 983 and the receiver 984 by wireless communication. Note that there is no limitation to the structure in which the transmitter 983 and the receiver 984 directly transmit and receive data, and a repeater may be provided between the transmitter 983 and the receiver 984. Alternatively, as illustrated in FIG. 1E, the external device 3300 capable of transmitting and receiving data may be provided between the transmitter 983 and the receiver 984.

Here, the numbers of rows and columns of pixel blocks included in the sensor portion 3001 and those of display regions included in the display device 3100 are preferably the same. Note that the operation can be performed even when the numbers are not the same. The number of effective pixels for imaging included in each pixel block is preferably substantially the same as the number of effective pixels for display included in each display panel. Note that by up-conversion or down-conversion of image data with the peripheral circuits 3002 and 3102 or an external device, the operation can be performed even when the numbers are not the same.

Image data output from one pixel block is displayed as an image on one display region on the corresponding row and the corresponding column. For example, image data obtained by the pixel block 3011 and transmitted to the display device 3100 is displayed on the display region 3111. Note that in the case where an image is displayed in an inverted manner or a special manner, the pixel block does not necessarily correspond to the display region. In other words, image data output from one pixel block can be set to be displayed as an image on a predetermined display region.

A specific operation method of the image display system of one embodiment of the present invention will be described using a flowchart in FIG. 3, FIGS. 5A to 5C, FIGS. 6A and 6B, and FIGS. 7A and 7B.

Note that in the image display system of one embodiment of the present invention, it is possible to select a first operation mode in which image data is obtained repeatedly with regular frame frequencies and the entire image is rewritten with regular frame frequencies or a second operation mode in which an image on part of the display region or the whole of the display region is rewritten when there is a difference from initial image data.

Although the first operation mode is easy to control, power consumption is large because an image is rewritten at regular intervals even in the case where an object for imaging is not changed. The second operation mode by which low power consumption can be achieved utilizing a feature in that the sensor portion 3001 and the display portion 3101 are each divided is described below.

First, the imaging device 3000 performs imaging in the first imaging mode (Si). The first imaging mode refers to a mode in which image data such as gray scale and color is obtained in each pixel, and imaging is performed in all pixel blocks.

Next, image data is transmitted to the display device 3100 through the peripheral circuit 3002 (S2).

Next, initial images are displayed on respective display regions corresponding to pixel blocks (S3).

Figure 4A:
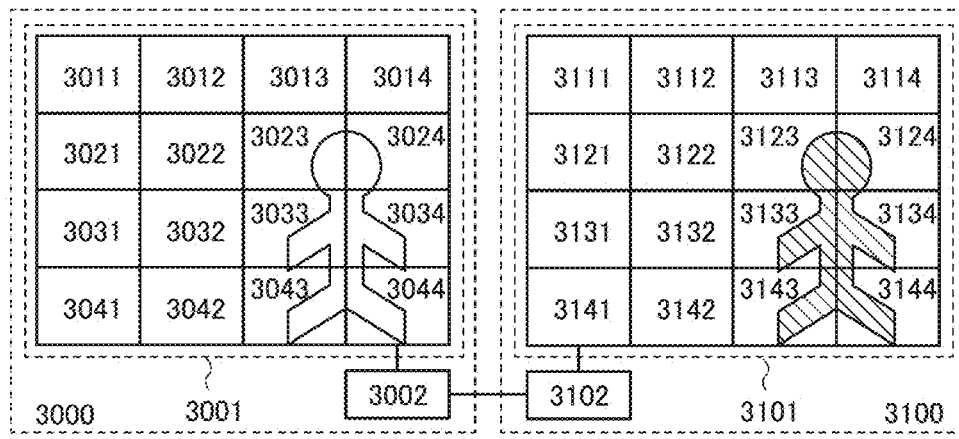
FIGS. 4A to 4C illustrate an operation of an image display system.

The operation from S1 to S3 is described with reference to FIG. 4A. FIG. 4A illustrates an example where a person and a still background are imaged. The pixel blocks 3011 to 3044 operate in the first imaging mode to obtain image data and transmit the image data to the display device 3100.

An image of a person which is divided and imaged by the pixel blocks 3023, 3024, 3033, 3034, 3043, and 3044 is displayed on the corresponding display regions 3123, 3124, 3133, 3134, 3143, and 3144. A background image which is imaged by the other pixel blocks is displayed on other corresponding display regions.

Next, the imaging device switches to the second imaging mode and images the same object (S4). The second imaging mode refers to a mode in which only a change of the position, brightness, and the like of the object is detected, and imaging is performed by all the pixel blocks.

In the second imaging mode, data on the brightness of the object is stored in each pixel first, and whether the brightness is changed or not is determined at regular intervals. The second imaging mode also can be referred to as a difference detection mode because a difference between reference data and current data is detected. In order to operate in such a manner, the imaging device 3000 preferably includes, in a pixel, a transistor including an oxide semiconductor in an active layer (hereinafter referred to as an OS transistor) which has a low off-state current and which is suitable to hold a potential of a charge retention portion.

If whether there is a difference or not is determined (S5) and it is determined that there is no difference, the imaging device returns to S4 and then, difference determination is made again. In a period in which it is determined that there is no difference, display is kept on the display portion 3010 without rewriting the initial image displayed in S3. Alternatively, rewriting an image to data of the initial image stored in the peripheral circuit 3102 is performed with very low frame frequencies (e.g., higher than or equal to $1.16 \times 10^{-5}$ Hz (approximately once per day) and lower than or equal to 1 Hz). In order to operate in such a manner, the display device 3100 preferably includes, in a pixel, an OS transistor which has a low off-state current and which is suitable to hold a potential of a charge retention capacitor. In this specification, such an operation in which the frequency of rewriting an image is significantly reduced is referred to as an idling stop operation.

If whether there is a difference or not is determined (S5) and it is determined that there is a difference, only pixel blocks in which a difference is detected switch to the first imaging mode and the same object is imaged (S6).

Next, image data obtained in the pixel blocks is transmitted to the display device 3100 through the peripheral circuit 3002 (S7).

Next, an image of display regions corresponding to the pixel blocks is rewritten (S8). Then, the imaging device returns to S4 and then, difference determination is made again. Note that in order to prevent a malfunction and ensure display quality, the imaging device may return to S1 at regular intervals regardless of whether there is a difference or not and the entire image may be taken again.

An operation from S4 to S8 is described with reference to FIGS. 4B and 4C.

Figure 4B:
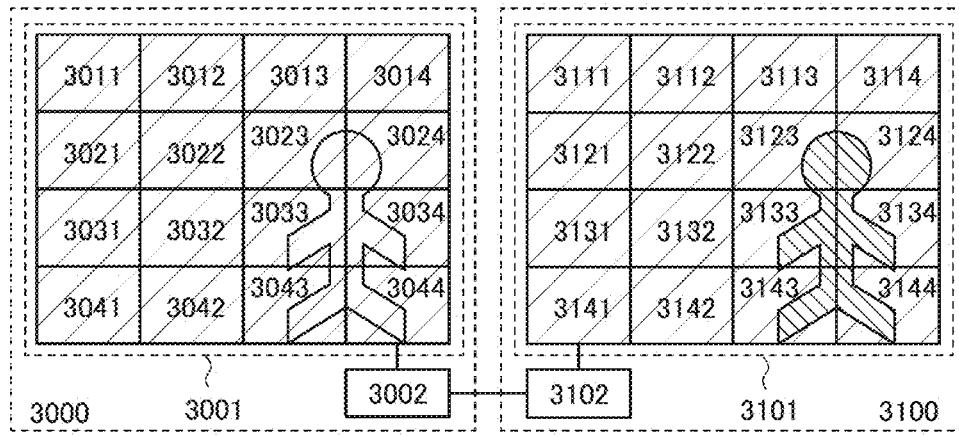

FIG. 4B illustrates an operation in the case where there is no difference (no change in a person and a background) in S4 and S5. The pixel blocks 3011 to 3044 shown by oblique lines operate in the second imaging mode, and the display regions 3111 to 3144 shown by oblique lines perform an idling stop operation. Data without a difference output from all the pixel blocks is transmitted to the display device 3100, and the image displayed in S3 is continuously displayed on the display portion 3101.

Figure 4C:
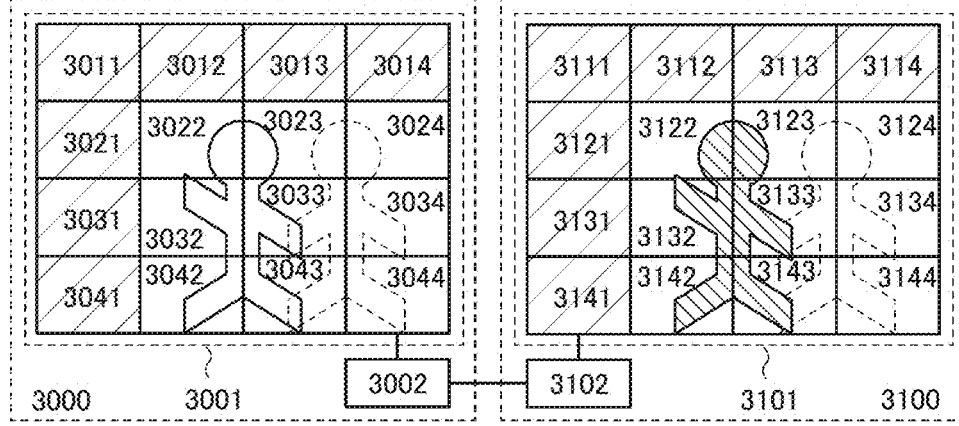

FIG. 4C illustrates an operation in the case where a difference is detected in S4 to S8. Images of a person shown by broken lines on the sensor portion 3001 and the display portion 3101 show initial positions of the person. In nine blocks shown by oblique lines, i.e., pixel blocks 3022, 3023, 3024, 3032, 3033, 3034, 3042, 3043 and 3044, a difference is detected in the second imaging mode because the person has moved, and the imaging device switches to the first imaging mode and new image data is obtained. In seven blocks shown by oblique lines, i.e., the pixel blocks 3011, 3012, 3013, 3014, 3021, 3031, and 3041, the background is not changed; thus, imaging in the second imaging mode is continuously performed.

The image data which is newly imaged in the nine blocks and data without a difference which is obtained in the seven blocks are transmitted to the display device 3100, and images of the display regions 3122, 3123, 3124, 3132, 3133, 3134, 3142, 3143, and 3144 are rewritten. Furthermore, the images displayed in S3 are continuously displayed on the seven blocks, i.e., the display regions 3111, 3112, 3113, 3114, 3121, 3131, and 3141.

As described above, in the imaging device 3000, initial images are obtained by all the pixel blocks in the first imaging mode and all the pixel blocks switch to the second imaging mode, and then, only pixel blocks in which differences are detected switch to the first imaging mode to obtain images again. Then, imaging in the second imaging mode is performed in all the pixel blocks again, and only pixel blocks in which differences are detected repeatedly perform an operation in which images are obtained in the first imaging mode.

In the second imaging mode, the potential of a charge retention node in a pixel for imaging is not necessarily reset even when imaging is performed repeatedly. Furthermore, if a difference is detected, only corresponding pixel blocks switch to the first imaging mode and obtain new images. Therefore, the imaging device can operate with low power consumption. In the second imaging mode, it is acceptable as long as whether there is a difference or not is detected, and in an A/D converter, the number of bits of data to be read is reduced to achieve low power consumption.

The display device 3100 can keep displaying images in an idling stop operation as long as new image data is transmitted from the imaging device 3000 after initial images are displayed. Thus, the frequency of rewriting can be reduced, which leads to low power consumption. Rewriting images not in the whole display portion 3101 but per display region also contributes to low power consumption.

This embodiment can be implemented in appropriate combination with any of the structures described in the other embodiments.

Embodiment 2

In this embodiment, examples of a pixel circuit that can be applied to a pixel included in the imaging device 3000 described in Embodiment 1 and an operation method thereof will be described.

Figure 5A:
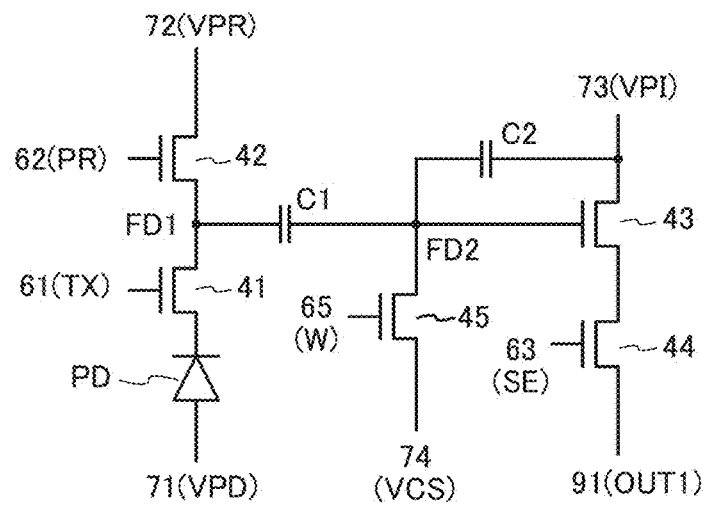
FIGS. 5A to 5C each illustrate a pixel circuit of an imaging device.

FIG. 5A is an example of a pixel circuit of the imaging device 3000. Although an example in which n-channel transistors are used is illustrated in FIG. 5A and the like, one embodiment of the present invention is not limited thereto and some of the n-channel transistors may be replaced with p-channel transistors.

The pixel circuit includes a photoelectric conversion element PD, a transistor 41, a transistor 42, a transistor 43, a transistor 44, a transistor 45, a capacitor C1, and a capacitor C2. Note that the capacitor C2 is not necessarily provided.

One terminal of the photoelectric conversion element PD is electrically connected to one of a source and a drain of the transistor 41. The other of the source and the drain of the transistor 41 is electrically connected to one of a source and a drain of the transistor 42. The other of the source and the drain of the transistor 41 is electrically connected to one terminal of the capacitor C1. The other terminal of the capacitor C1 is electrically connected to one of a source and a drain of the transistor 45. The other terminal of the capacitor C1 is electrically connected to a gate of the transistor 43. The other terminal of the capacitor C1 is electrically connected to one terminal of the capacitor C2. One of a source and a drain of the transistor 43 is electrically connected to one of a source and a drain of the transistor 44. The other terminal of the capacitor C2 is electrically connected to the other of the source and the drain of the transistor 43.

Here, a node to which the other of the source and the drain of the transistor 41, the one of the source and the drain of the transistor 42, and the one terminal of the capacitor C1 are connected is denoted by FD1. A node to which the other terminal of the capacitor C1, the one of the source and the drain of the transistor 45, the gate of the transistor 43, and the one terminal of the capacitor C2 are connected is denoted by FD2.

The other terminal of the photoelectric conversion element PD is electrically connected to a wiring 71 (VPD). The other of the source and the drain of the transistor 42 is electrically connected to a wiring 72 (VPR). The other of the source and the drain of the transistor 45 is electrically connected to a wiring 74 (VCS). The other of the source and the drain of the transistor 43 and the other terminal of the capacitor C2 are electrically connected to a wiring 73 (VPI). The other of the source and the drain of the transistor 44 is electrically connected to a wiring 91 (OUT1).

The wiring 71 (VPD), the wiring 72 (VPR), the wiring 73 (VPI), and the wiring 74 (VCS) can function as power supply lines. For example, the wiring 71 (VPD) and the wiring 74 (VCS) can function as low potential power supply lines. The wiring 72 (VPR) and the wiring 73 (VPI) can function as high potential power supply lines.

A gate of the transistor 41 is electrically connected to a wiring 61 (TX). A gate of the transistor 42 is electrically connected to a wiring 62 (PR). A gate of the transistor 45 is electrically connected to a wiring 65 (W). A gate of the transistor 44 is electrically connected to a wiring 63 (SE).

The wiring 61 (TX), the wiring 62 (PR), the wiring 63 (SE), and the wiring 65 (W) can function as signal lines for controlling conduction of the transistors.

In the above structure, the other terminal of the capacitor C2 may be connected to not the wiring 73 (VPI) but another wiring or the like capable of supplying a fixed potential.

Figure 5B:
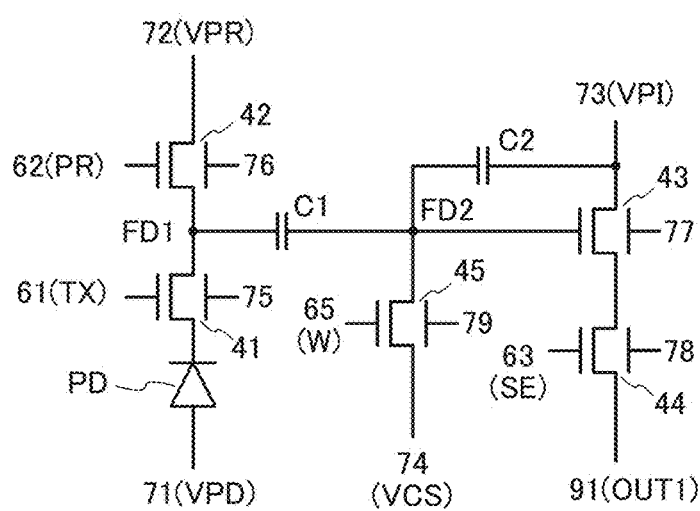

The transistors included in the pixel circuit may have back gates as illustrated in FIG. 5B. FIG. 5B illustrates a configuration of applying a constant potential to the back gates, which enables control of the threshold voltages.

Wirings 75 to 79 connected to the respective back gates can be supplied with a different potential separately. The wirings connected to the back gates of the transistors 43 and 44 may be electrically connected to each other.

In n-channel transistors, the threshold voltage is shifted in a positive direction when a potential lower than a source potential is applied to a back gate. In contrast, the threshold voltage is shifted in a negative direction when a potential higher than a source potential is applied to a back gate. Therefore, in the case where on/off of each of the transistors is controlled by the predetermined gate voltage, the off-state current can be reduced when a potential lower than a source potential is applied to a back gate and the on-state current can be reduced when a potential higher than a source potential is applied to a back gate.

The nodes FD1 and FD2 are desired to have high potential retention capability in the circuits in FIGS. 5A and 5B; accordingly, transistors with a low off-state current are preferably used as the transistors 41, 42, and 45. The off-state current can be reduced when a potential lower than a source potential is applied to the back gates of the transistors 41, 42, and 45. Therefore, the nodes FD1 and FD2 can have high potential retention capability. For example, OS transistors are preferably used as the transistors 41, 42, and 45.

As described above, transistors with a high on-state current are preferably used as the transistors 43 and 44. The on-state current can be increased when a potential higher than a source potential is applied to the back gates of the transistors 43 and 44. Therefore, a reading potential output to the wiring 91 (OUT1) can be defined immediately, that is, the transistors 43 and 44 can operate at high frequency. For example, a transistor including silicon in an active layer or an active region (hereinafter referred to as a Si transistor) is preferably used as the transistors 43 and 44.

Figure 5C:
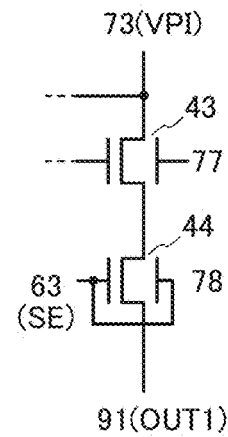

Note that the same potential may be applied to a front gate and the back gate of the transistor 44 as illustrated in FIG. 5C. Alternatively, the transistors 43 and 44 may be OS transistors instead of Si transistors. Although the on-state current of the OS transistor is relatively low, the on-state current can be increased by providing a back gate, and the OS transistor can operate at high frequency.

A plurality of potentials such as a signal potential and a potential applied to the back gate are used inside an imaging device besides power supply potentials. Supply of a plurality of potentials from the outside of an imaging device increases the number of terminals; thus, an imaging device preferably has a power supply circuit generating a plurality of potentials inside the imaging device.

Since the OS transistor has an extremely low off-state current, a period during which charge can be held in the node FD1 and the node FD2 can be extremely long owing to the low off-state current characteristics of the transistors 41, 42, and 43. Therefore, a global shutter system in which a charge accumulation operation is performed in all the pixels at the same time can be used without a complicated circuit structure and operation method. Note that the imaging device of one embodiment of the present invention can also be operated in a rolling shutter system.

The OS transistor has lower temperature dependence of change in electrical characteristics than the Si transistor, and thus can be used in an extremely wide range of temperatures. Therefore, an imaging device and a semiconductor device that include OS transistors are suitable for use in automobiles, aircrafts, spacecrafts, and the like.

Moreover, the OS transistor has higher drain withstand voltage than the Si transistor. To utilize avalanche multiplication, a photoelectric conversion element including a selenium-based material in a photoelectric conversion layer is preferably operated while a relatively high voltage (e.g., 10 V or more) is applied. Therefore, by combination of the OS transistor and the photoelectric conversion element in which the selenium-based material is used for the photoelectric conversion layer, a highly reliable imaging device can be obtained.

The pixel circuit described in this embodiment can perform an operation in the first operation mode in which normal imaging is performed and an operation in the second operation mode in which difference data between image data of an initial frame and image data of a current frame can be retained and a signal based on the difference data can be output. In the second operation mode, the difference data can be output without a comparison process or the like in an external circuit; thus, the pixel circuit is preferably used in the imaging device 3000 described in Embodiment 1.

Figure 6A:
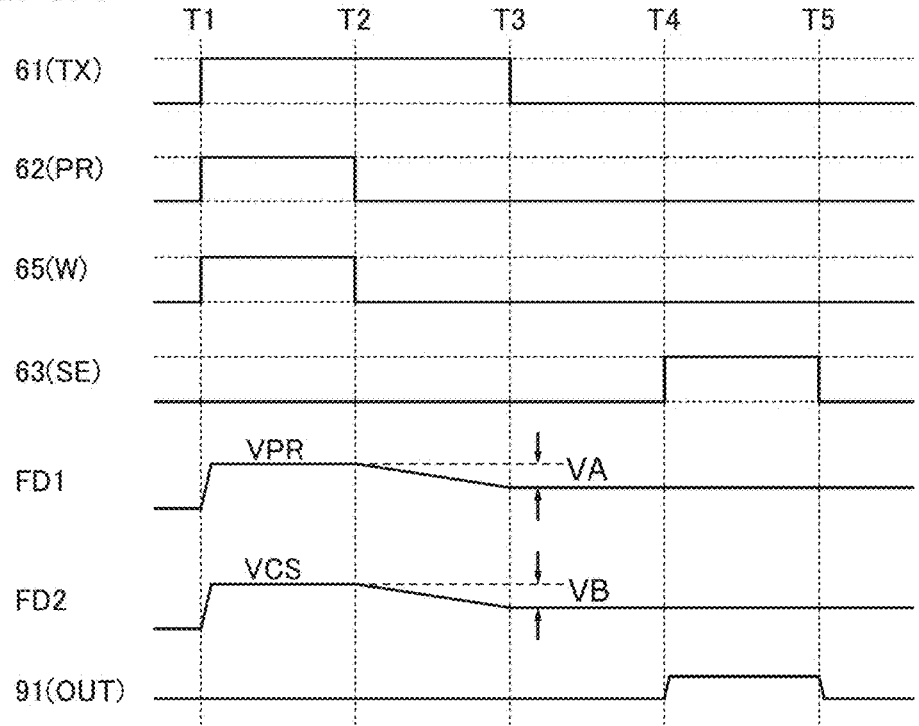
FIGS. 6A and 6B are timing charts illustrating an operation of a pixel circuit of an imaging device.
Figure 6B:
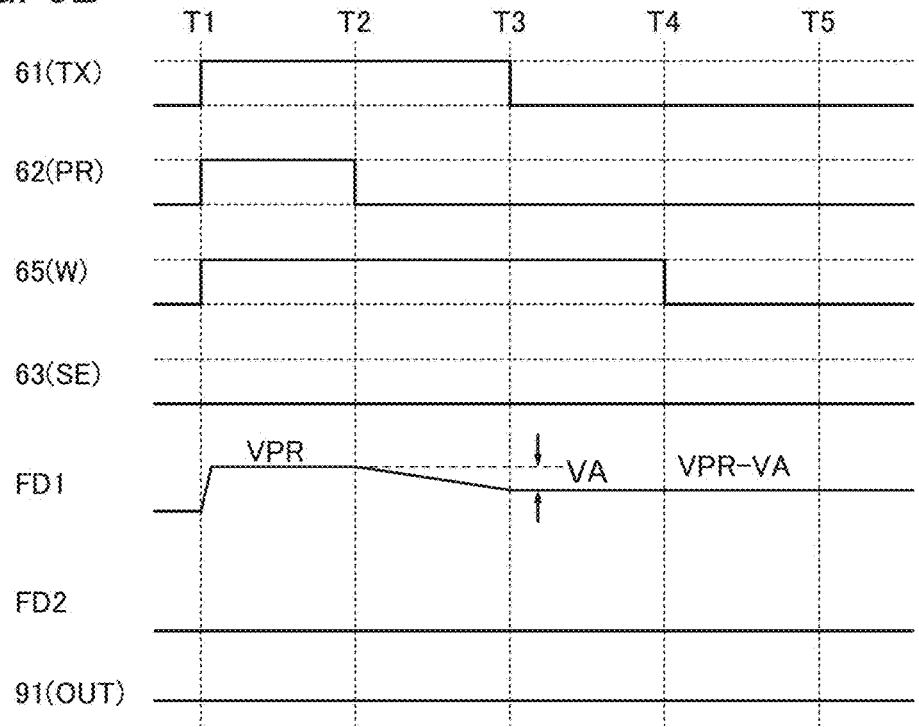

The operation in the first operation mode of the pixel circuit in FIG. 5A is described with reference to a timing chart in FIG. 6A.

In a period from time T1 to time T2, the wiring 61 (TX) is set to "H", the wiring 62 (PR) is set to "H", and the wiring 65 (W) is set to "H". At this time, the potential of the node FD1 is set to the potential VPR of the wiring 72 (VPR) and the potential of the node FD2 is set to the potential VCS of the wiring 74 (VCS) (reset operation).

In a period from time T2 to time T3, the wiring 61 (TX) is kept at "H", the wiring 62 (PR) is set to "L", and the wiring 65 (W) is set to "L". As the potential of the node FD1 decreases in response to light entering the photoelectric conversion element PD, the potential of the node FD2 also decreases due to capacitive coupling. When the amount of decrease in the potential of the node FD1 at time T3 is denoted by VA, the potential of the node FD1 is VPR−VA. The potential of the node FD2 decreases by VB; i.e., the potential of the node FD2 is VCS−VB (accumulation operation). Note that in the circuit structure in FIG. 5A, as the intensity of light entering the photoelectric conversion element PD becomes higher, the potentials of the node FD1 and the node FD2 decrease.

In a period from time T3 to time T4, the wiring 61 (TX) is set to "L", the wiring 62 (PR) is kept at "L", and the wiring 65 (W) is kept at "L"; thus, the potentials of the node FD1 and the node FD2 are held.

When the wiring 63 (SE) is set to "H" in a period from time T4 to time T5, a signal that corresponds to image data is output to the wiring 91 (OUT1) in accordance with the potential of the node FD2 (selection operation). The above is the description of the first operation mode.

Next, an operation in the second operation mode of the pixel circuit in FIG. 5A is described. In the second operation mode, a difference in data between a first frame (reference frame) and a second frame (difference target frame) is output. A data obtaining operation in the first frame is described with reference to a timing chart in FIG. 6B.

In a period from time T1 to time T2, the wiring 61 (TX) is set to "H", the wiring 62 (PR) is set to "H", and the wiring 65 (W) is set to "H". At this time, the potential of the node FD1 is set to the potential VPR of the wiring 72 (VPR) and the potential of the node FD2 is set to the potential VCS of the wiring 74 (VCS).

In a period from time T2 to time T3, the wiring 61 (TX) is kept at "H", the wiring 62 (PR) is set to "L", and the wiring 65 (W) is kept at "H". The potential of the node FD1 decreases in response to light entering the photoelectric conversion element PD. When the amount of decrease in the potential of the node FD1 at time T3 is denoted by VA, the potential of the node FD1 is VPR−VA. Note that in the circuit structure in FIG. 5A, as the intensity of light entering the photoelectric conversion element PD becomes higher, the potential of the node FD1 decreases.

In a period from time T3 to time T4, the wiring 61 (TX) is set to "L", the wiring 62 (PR) is kept at "L", and the wiring 65 (W) is kept at "H"; thus, the potential of the node FD1 is held.

In a period from time T4 to time T5, the potential of the wiring 61 (TX) is kept at "L", the potential of the wiring 62 (PR) is kept at "L", and the potential of the wiring 65 (W) is set to "L"; thus, the potentials of the node FD1 and the node FD2 are held.

Figure 7A:
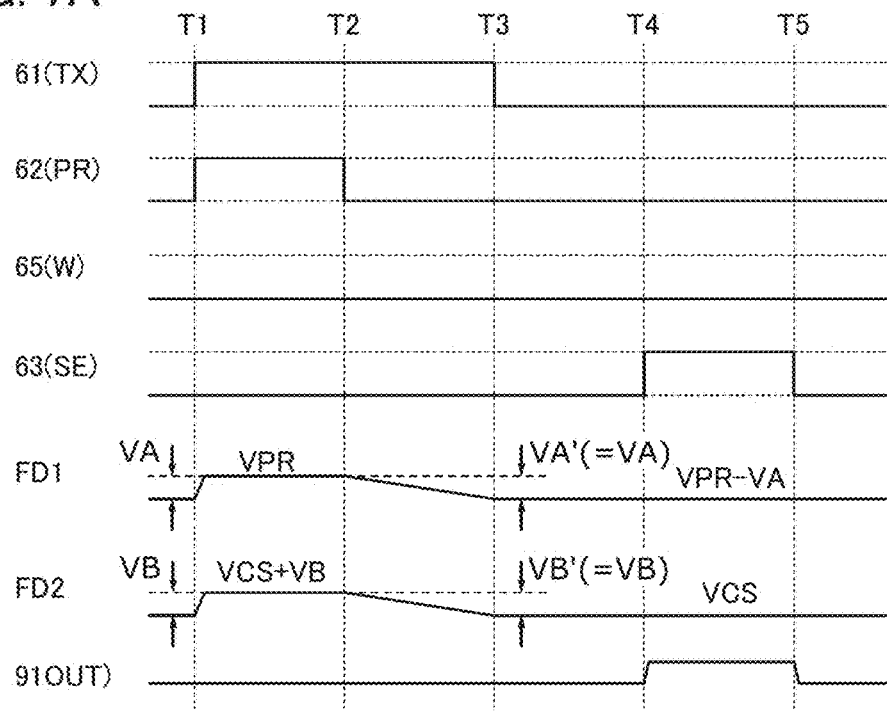
FIGS. 7A and 7B are timing charts illustrating an operation of a pixel circuit of an imaging device.

Next, a data obtaining operation in the second frame is described with reference to a timing chart in FIG. 7A. The case where there is no difference in data between the first frame and the second frame, i.e., the case where the same image is taken in the first frame and the second frame is assumed in FIG. 7A.

In a period from time T1 to time T2, the wiring 61 (TX) is set to "H", the wiring 62 (PR) is set to "H", and the wiring 65 (W) is set to "L". The potential of the node FD1 increases by VA and the potential of the node FD2 increases by VB due to capacitive coupling. Here, VA and VB are potentials that reflect illuminance in the first frame.

In a period from time T2 to time T3, the wiring 61 (TX) is kept at "H", the wiring 62 (PR) is set to "L", and the wiring 65 (W) is kept at "L", so that the potentials of the node FD1 and the node FD2 decrease in response to light entering the photoelectric conversion element PD. When the amount of decrease in the potential of the node FD1 at time T3 is denoted by VA', the potential of the node FD1 is VPR−VA'. Since VA'=VA, the potential of the node FD1 is VPR−VA. The potential of the node FD2 decreases by VB' due to capacitive coupling; i.e., the potential of the node FD2 is VCS+VB−VB'. Since VB'=VB, the potential of the node FD2 is VCS.

In a period from time T3 to time T4, the wiring 61 (TX) is set to "L", the wiring 62 (PR) is kept at "L", and the wiring 65 (W) is kept at "L"; thus, the potentials of the node FD1 and the node FD2 are held.

When the potential of the wiring 63 (SE) is set to "H" in a period from time T4 to time T5, a signal that corresponds to image data is output to the wiring 91 (OUT1) in accordance with the potential of the node FD2. At this time, the potential of the node FD2 is "VCS", the reset potential, and a judgment is made on the basis of the output signal in that there is no significant difference in comparison of data between the first frame and the second frame.

Figure 7B:
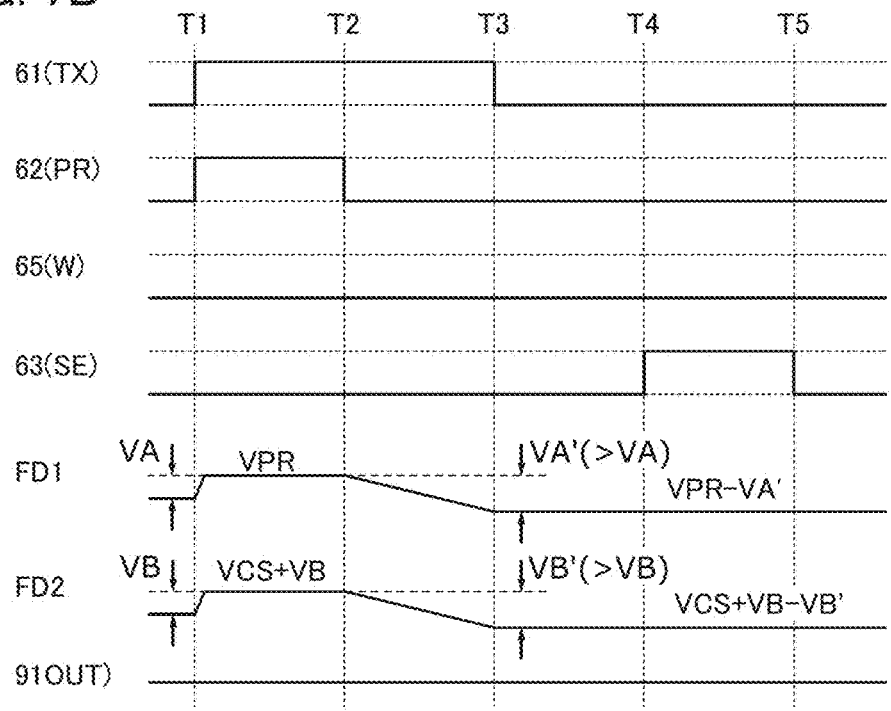

Next, with reference to a timing chart in FIG. 7B, an operation in the case where there is a difference in data between the first frame and the second frame, i.e., an operation in the case where different images are taken in the first frame and the second frame is described. Note that the illuminance of light entering a target pixel in the first frame is lower than that in the second frame.

In a period from time T1 to time T2, the wiring 61 (TX) is set to "H", the wiring 62 (PR) is set to "H", and the wiring 65 (W) is set to "L". The potential of the node FD1 increases by VA and the potential of the node FD2 increases by VB due to capacitive coupling. Here, VA and VB are potentials that reflect illuminance in the first frame.

In a period from time T2 to time T3, the wiring 61 (TX) is kept at "H", the wiring 62 (PR) is set to "L", and the wiring 65 (W) is kept at "L", so that the potentials of the node FD1 and the node FD2 decrease in response to light entering the photoelectric conversion element PD. When the amount of decrease in the potential of the node FD1 at time T3 is denoted by VA', the potential of the node FD1 is VPR−VA'. The potential of the node FD2 decreases by VB' due to capacitive coupling; i.e., the potential of the node FD2 is VCS+VB−VB'.

In a period from time T3 to time T4, the wiring 61 (TX) is set to "L", the wiring 62 (PR) is kept at "L", and the wiring 65 (W) is kept at "L"; thus, the potentials of the node FD1 and the node FD2 are held.

When the wiring 63 (SE) is set to "H" in a period from time T4 to time T5, a signal that corresponds to image data is output to the wiring 91 (OUT1) in accordance with the potential of the node FD2. At this time, the potential of the node FD2 is VCS+VB−VB'. Here, VB is a potential that reflects illuminance in the first frame and VB' is a potential that reflects illuminance in the second frame. The above is the description of the second operation mode in which a difference in data between the first frame and the second frame is output.

This embodiment can be implemented in appropriate combination with any of the structures described in the other embodiments.

Embodiment 3

In this embodiment, specific structures of the imaging device 3000 described in Embodiments 1 and 2 will be described.

Figure 8A:
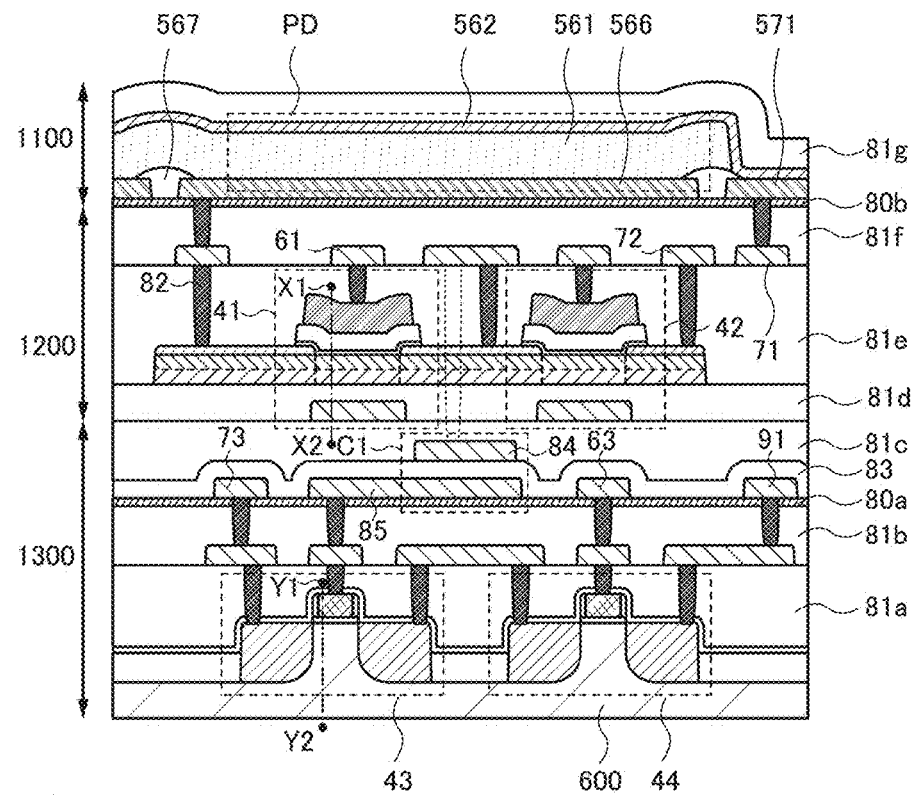
FIGS. 8A to 8C are cross-sectional views illustrating a structure of an imaging device.
Figure 8B:
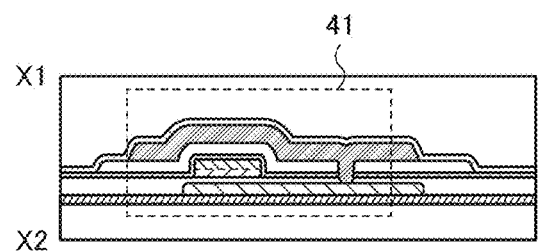
Figure 8C:
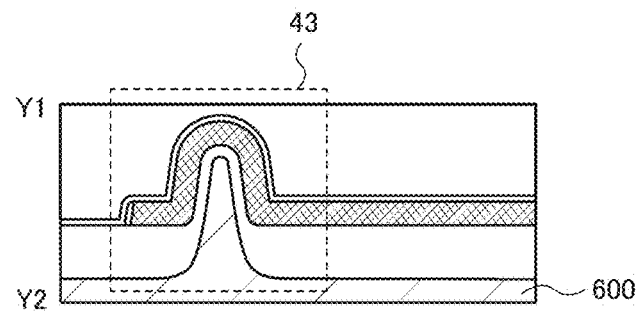

FIGS. 8A, 8B, and 8C illustrate a specific structure of the pixel circuit corresponding to FIG. 5A or FIG. 5B. FIG. 8A is a cross-sectional view of the transistors 41 to 44 in the channel length direction. FIG. 8B is a cross-sectional view in the channel width direction of the transistor 41 taken along dashed-dotted line X1-X2 in FIG. 8A. FIG. 8C is a cross-sectional view in the channel width direction of the transistor 43 taken along dashed-dotted line Y1-Y2 in FIG. 8A.

An imaging device of one embodiment of the present invention includes a layer 1100, a layer 1200, and a layer 1300 as illustrated in FIG. 8A.

The layer 1100 may include the photoelectric conversion element PD. A photodiode with two terminals can be used for the photoelectric conversion element PD, for example. As the photodiode, a PN photodiode using a single crystal silicon substrate, a PIN photodiode using an amorphous silicon thin film, a micro crystal silicon thin film, or a polycrystalline silicon thin film, a photodiode using selenium or a compound thereof, or a photodiode using an organic compound can be used.

The layer 1200 can include the transistors 41, 42, and 45. An OS transistor is preferably used as the transistors 41, 42, and 45. Note that the transistor 45 is not illustrated.

The layer 1300 may include the transistors 43 and 44. As the transistors 43 and 44, a transistor including silicon in an active layer or an active region is preferably used. Such a transistor has a high on-state current and efficiently amplifies the potential of the node FD2.

The capacitor C1 in which a conductive layer 84 and a conductive layer 85 serve as electrodes and an insulating layer 83 serves as a dielectric layer is provided in the layer 1300; however, the capacitor C1 may be provided in the layer 1200. Although the capacitor C2 is not illustrated, the capacitor C2 may be provided in either of the layer 1200 and the layer 1300.

Although the wirings, the electrodes, metal layers, and contact plugs (conductors 82) are illustrated as independent components in the cross-sectional views in this embodiment, some of them are provided as one component in some cases when they are electrically connected to each other. In addition, a structure in which the components such as wirings, electrodes, and metal layers are connected to each other through the conductors 82 is only an example, and the components may be directly connected to each other not through the conductor 82.

Insulating layers 81$a$ to 81$i$ and the like that function as protective films, interlayer insulating films, or planarization films are provided over the components such as transistors. For example, an inorganic insulating film such as a silicon oxide film or a silicon oxynitride film can be used as the insulating layers 81$a$ to 81$i$. Alternatively, an organic insulating film such as an acrylic resin film or a polyimide resin film may be used. Top surfaces of the insulating layers 81$a$ to 81$i$ are preferably planarized by chemical mechanical polishing (CMP) or the like as necessary.

In some cases, one or more of the wirings and the like illustrated in the drawing are not provided, or a wiring, a transistor, or the like that is not illustrated in the drawing is included in each layer. In some cases, a layer that is not illustrated in the drawing is included in the stacked-layer structure. Furthermore, one or more of the layers illustrated in the drawing are not included in some cases.

Insulating layers 80$a$ and 80$b$ are provided between a region including an OS transistor and a region including a Si device (a Si transistor or a Si photodiode).

Dangling bonds of silicon are terminated with hydrogen in insulating layers provided in the vicinities of the active regions of the transistors 43 and 44. Therefore, the hydrogen has an effect of improving the reliability of the transistors 43 and 44. Meanwhile, hydrogen in insulating layers which are provided in the vicinity of the oxide semiconductor layer that is the active layer of the transistors 41 and 42 causes generation of carriers in the oxide semiconductor layer. Therefore, the hydrogen might reduce the reliability of the transistors 41 and 42. For this reason, the insulating layer 80$a$ that has a function of preventing diffusion of hydrogen is preferably provided between one layer including the Si transistor and another layer stacked thereover that includes the OS transistor. Hydrogen is confined in one layer by the insulating layer 80$a$, so that the reliability of the transistors 43 and 44 can be improved. Furthermore, diffusion of hydrogen from the one layer to the other layer is inhibited, so that the reliability of the transistors 41 and 42 can also be improved. For this reason, the insulating layer 80$b$ that has a function of preventing diffusion of hydrogen is preferably provided between one layer including the Si photodiode and another layer including the OS transistor.

The insulating layers 80$a$ and 80$b$ can be, for example, formed using, aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

In FIG. 8A, the photoelectric conversion element PD included in the layer 1100 is a photodiode using selenium for a photoelectric conversion layer. The photoelectric conversion element PD may include a photoelectric conversion layer 561, a light-transmitting conductive layer 562, an electrode 566, a partition wall 567, and a wiring 571.

The transistors 41 and 42 which are OS transistors are provided in the layer 1200. Although each of the transistors 41 and 42 includes a back gate, only the transistor 41 may include a back gate, for example. As illustrated in FIG. 8B, the back gate might be electrically connected to a front gate of the transistor, which is provided to face the back gate. Alternatively, different fixed potentials may be supplied to the back gate and the front gate.

Figure 9A:
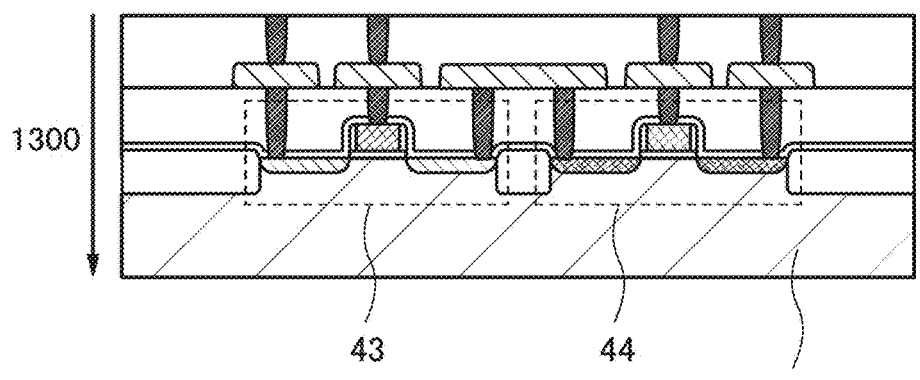
FIGS. 9A and 9B are cross-sectional views each illustrating a structure of an imaging device.
Figure 9B:
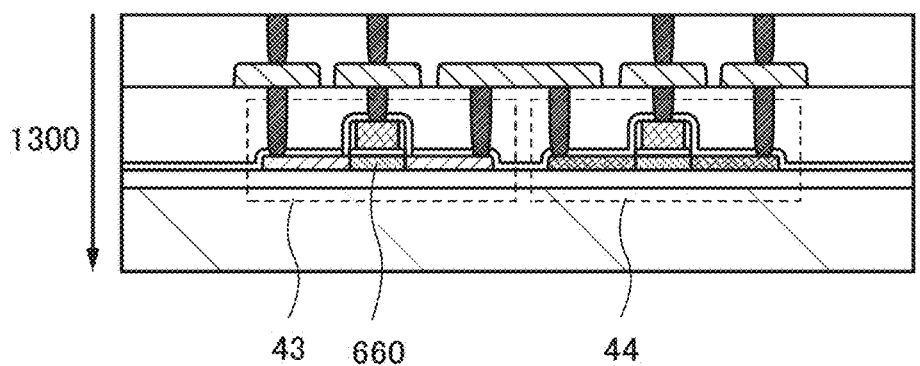

The transistors 43 and 44 which are Si transistors are provided in the layer 1300. Although FIG. 8A shows the transistors 43 and 44 of a fin type, the transistors may be of a planar type as illustrated in FIG. 9A. Alternatively, as illustrated in FIG. 9B, transistors each including an active layer 660 formed using a silicon thin film may be used. The active layer 660 can be formed using polycrystalline silicon or single crystal silicon of a silicon-on-insulator (SOI) structure.

The photoelectric conversion element PD including a selenium-based material has high external quantum efficiency with respect to visible light. Furthermore, the selenium-based material has a high light-absorption coefficient, making the photoelectric conversion layer 561 thin easily. The photoelectric conversion element PD including a selenium-based material can be a highly sensitive sensor in which the amount of amplification of electrons is large because of avalanche multiplication. In other words, the use of a selenium-based material for the photoelectric conversion layer 561 allows a sufficient amount of photocurrent to be obtained even when the pixel area is reduced. Thus, the photoelectric conversion element PD including a selenium-based material is also suitable for imaging in a low-illuminance environment.

Amorphous selenium or crystalline selenium can be used as a selenium-based material. Crystalline selenium can be obtained by, for example, depositing amorphous selenium and then performing heat treatment. When the crystal grain size of crystalline selenium is smaller than a pixel pitch, variation in characteristics between pixels can be reduced. Moreover, crystalline selenium has higher spectral sensitivity to visible light and light-absorption coefficient for visible light than those of amorphous selenium.

Figure 10A:
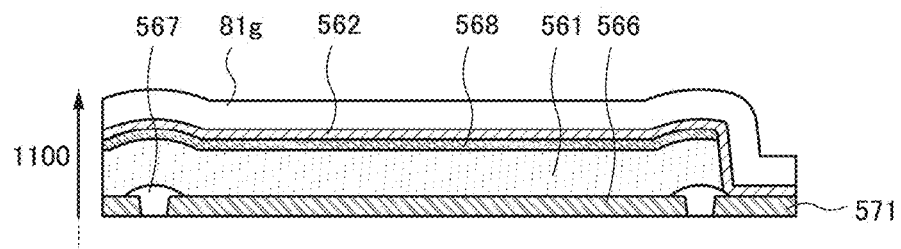
FIGS. 10A to 10E are cross-sectional views each illustrating connection of a photoelectric conversion element.
Figure 10B:
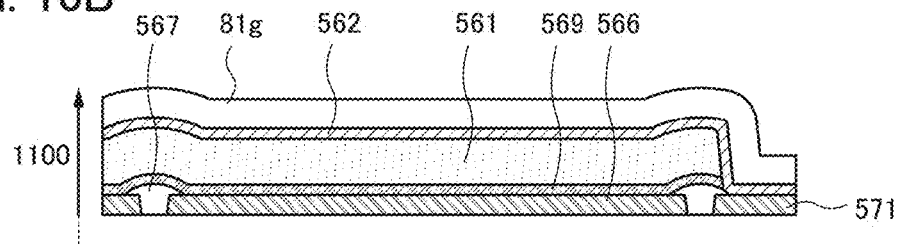
Figure 10C:
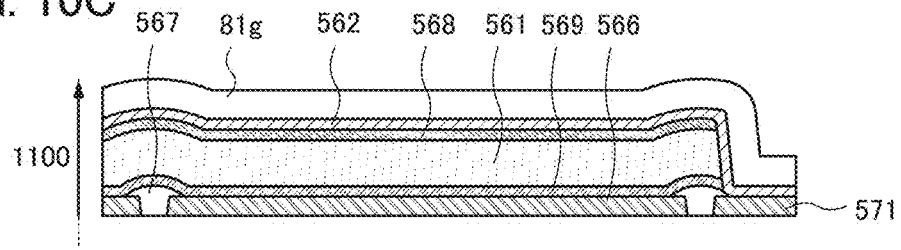

Although the photoelectric conversion layer 561 is a single layer in FIG. 8A, gallium oxide, cerium oxide, an In—Ga—Zn oxide, or the like may be provided as a hole injection blocking layer 568 on a light-receiving surface side as illustrated in FIG. 10A. Alternatively, as illustrated in FIG. 10B, nickel oxide, antimony sulfide, or the like may be provided as an electron injection blocking layer 569 on the electrode 566 side. Alternatively, as illustrated in FIG. 10C, the hole injection blocking layer 568 and the electron injection blocking layer 569 may be provided.

The photoelectric conversion layer 561 may be a layer including a compound of copper, indium, and selenium (CIS). Alternatively, a layer including a compound of copper, indium, gallium, and selenium (CIGS) may be used. A photoelectric conversion element including the CIS layer or the CIGS layer can also utilize avalanche multiplication like the photoelectric conversion element including a layer of selenium alone.

In the photoelectric conversion element PD using the selenium-based material, for example, the photoelectric conversion layer 561 can be provided between the electrode 566 formed using a metal material or the like and the light-transmitting conductive layer 562. Furthermore, CIS and CIGS are p-type semiconductors, and an n-type semiconductor such as cadmium sulfide or zinc sulfide may be provided in contact with the p-type semiconductor in order to form a junction.

Figure 10D:
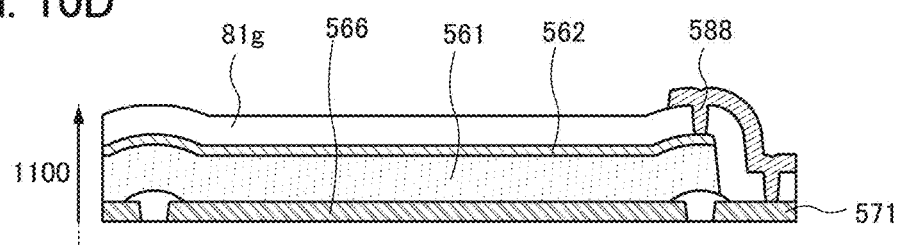
Figure 10E:
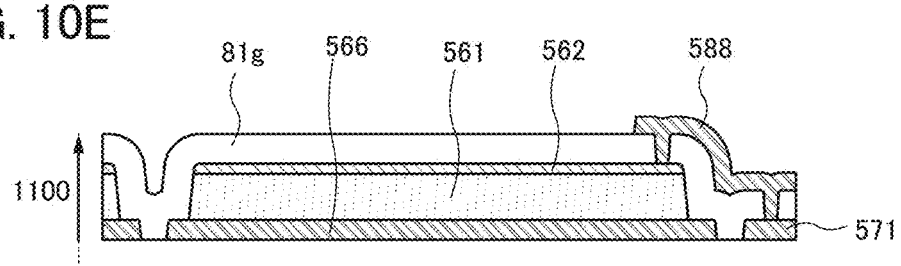
Figure 11A:
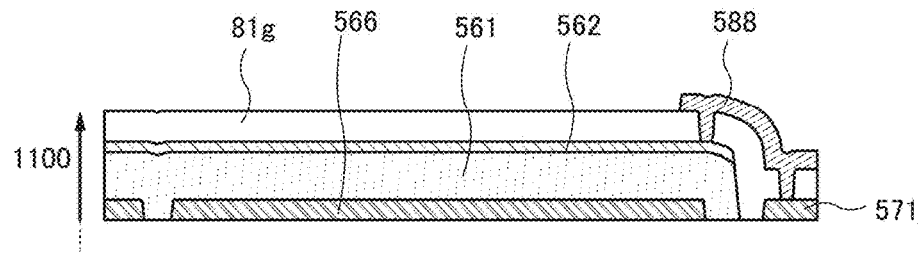
FIGS. 11A to 11D are cross-sectional views each illustrating connection of a photoelectric conversion element.
Figure 11B:
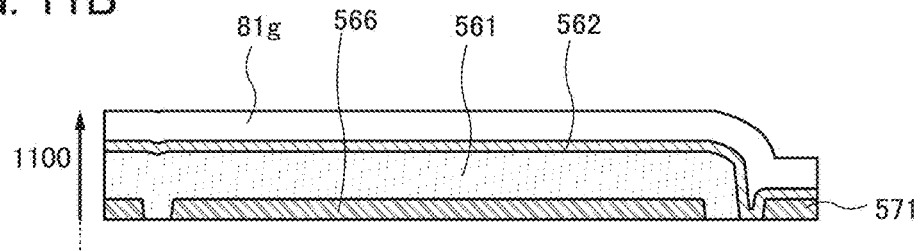

Although the light-transmitting conductive layer 562 is directly in contact with the wiring 571 in FIG. 8A, they may be in contact with each other through a wiring 588 as illustrated in FIG. 10D. Although the photoelectric conversion layer 561 and the light-transmitting conductive layer 562 are not divided between pixel circuits in FIG. 8A, they may be divided between circuits as illustrated in FIG. 10E. In a region between pixels where the electrode 566 is not provided, the partition wall 567 formed of an insulator is preferably provided, thereby preventing generation of a crack in the photoelectric conversion layer 561 and the light-transmitting conductive layer 562. However, the partition wall 567 is not necessarily provided as illustrated in FIGS. 11A and 11B.

Figure 11C:
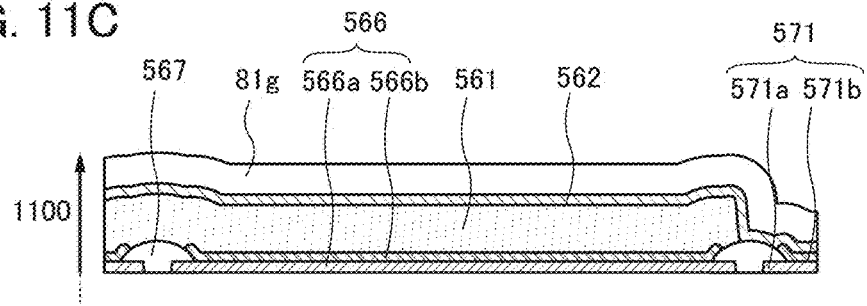

The electrode 566, the wiring 571, and the like may be a multilayer. For example, as illustrated in FIG. 11C, the electrode 566 can include two conductive layers 566a and 566b and the wiring 571 can include two conductive layers 571a and 571b. In the structure in FIG. 11C, for example, the conductive layers 566a and 571a may be made of a low-resistance metal or the like, and the conductive layers 566b and 571b may be made of a metal or the like that exhibits an excellent contact property with the photoelectric conversion layer 561. Such a structure improves the electrical properties of the photoelectric conversion element PD. Note that some kinds of metal may cause electrochemical corrosion by being in contact with the light-transmitting conductive layer 562. Even when such a metal is used in the conductive layer 571a, electrochemical corrosion can be prevented by the conductive layer 571b.

The conductive layers 566b and 571b can be formed using, for example, molybdenum, tungsten, or the like. The conductive layers 566a and 571a can be formed using, for example, aluminum, titanium, or a stack of titanium, aluminum, and titanium that are stacked in that order.

Figure 11D:
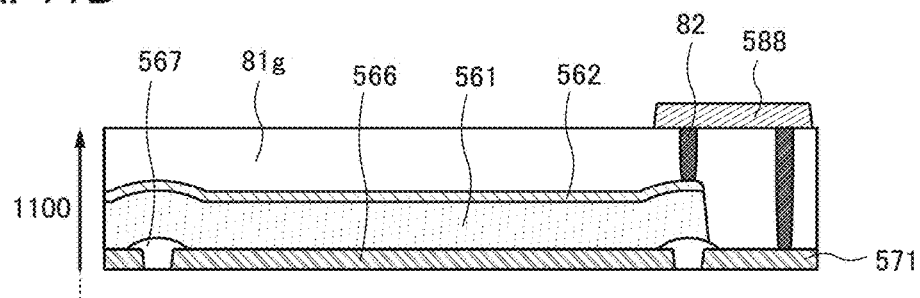

As illustrated in FIG. 11D, the light-transmitting conductive layer 562 may be connected to the wiring 571 through the conductor 82 and the wiring 588.

The partition wall 567 can be formed using an inorganic insulator, an insulating organic resin, or the like. The partition wall 567 may be colored black or the like in order to shield the transistors and the like from light and/or to determine the area of a light-receiving portion in each pixel.

The photoelectric conversion element PD included in the layer 1100 is a PIN photodiode using an amorphous silicon film or a microcrystalline silicon film in a photoelectric conversion layer as illustrated in FIGS. 12A to 12D. The photoelectric conversion element PD may include an n-type semiconductor layer 565, an i-type semiconductor layer 564, a p-type semiconductor layer 563, the electrode 566, the wiring 571, and the wiring 588.

The i-type semiconductor layer 564 is preferably formed using amorphous silicon. The p-type semiconductor layer 563 and the n-type semiconductor layer 565 can each be formed using amorphous silicon, microcrystalline silicon, or the like that includes a dopant imparting the corresponding conductivity type. A photodiode in which a photoelectric conversion layer is formed using amorphous silicon has high sensitivity in a visible light wavelength region, and therefore can easily sense weak visible light.

Figure 12A:
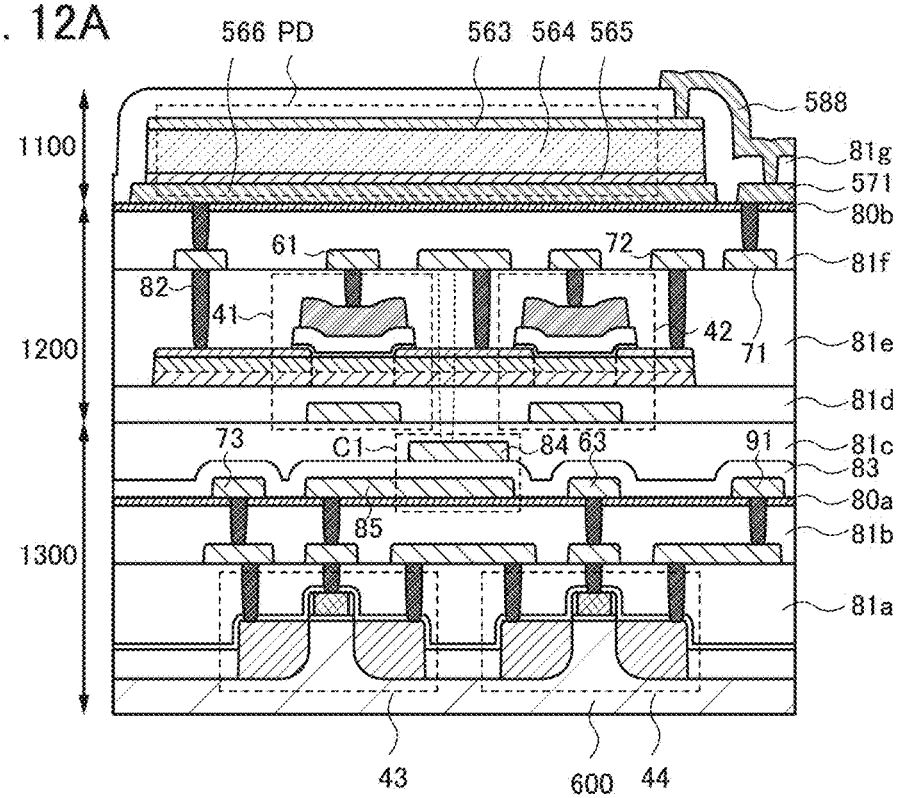
FIGS. 12A to 12D are a cross-sectional view illustrating a structure of an imaging device and cross-sectional views each illustrating connection of a photoelectric conversion element.
Figure 12B:
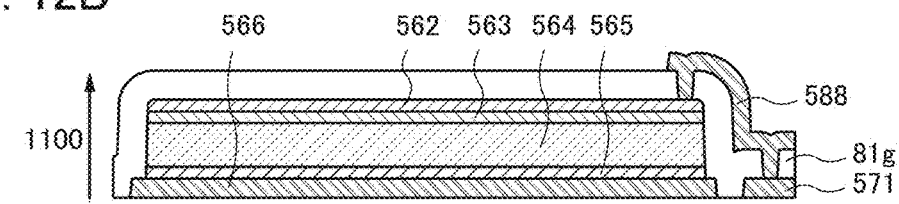
Figure 12C:
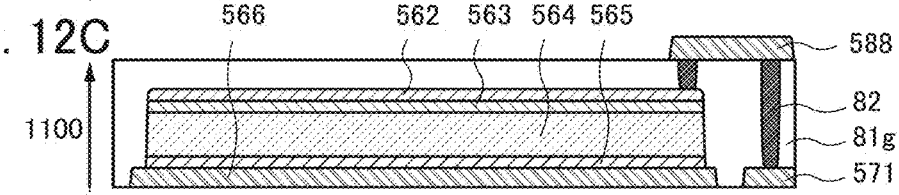
Figure 12D:
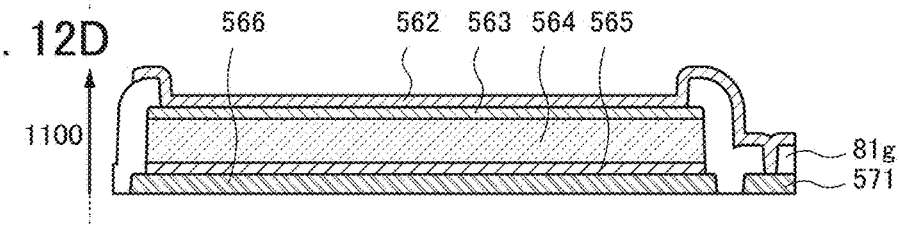

FIGS. 12B to 12D show other examples of the structure of the photoelectric conversion element PD having a structure of a PIN thin film photodiode and the connection configuration between the photoelectric conversion element PD and the wirings. Note that the structure of the photoelectric conversion element PD and the connection configuration between the photoelectric conversion element PD and the wirings are not limited thereto, and other configurations may be applied.

FIG. 12B illustrates a structure of the photoelectric conversion element PD that includes the light-transmitting conductive layer 562 in contact with the p-type semiconductor layer 563. The light-transmitting conductive layer 562 serves as an electrode and can increase the output current of the photoelectric conversion element PD.

For the light-transmitting conductive layer 562, the following can be used: indium tin oxide; indium tin oxide containing silicon; indium oxide containing zinc; zinc oxide; zinc oxide containing gallium; zinc oxide containing aluminum; tin oxide; tin oxide containing fluorine; tin oxide containing antimony; graphene; graphene oxide; or the like. The light-transmitting conductive layer 562 is not limited to a single layer, and may be a stacked layer of different films.

In the structure of FIG. 12C, the light-transmitting conductive layer 562 and the wiring 571 are connected to each other through the conductor 82 and the wiring 588. Note that the p-type semiconductor layer 563 of the photoelectric conversion element PD and the wiring 571 may be connected to each other through the conductor 82 and the wiring 588. In the structure of FIG. 12C, the light-transmitting conductive layer 562 is not necessarily provided.

FIG. 12D illustrates a structure in which an opening exposing the p-type semiconductor layer 563 is provided in the insulating layer 81g covering the photoelectric conversion element PD, and the light-transmitting conductive layer 562 covering the opening is electrically connected to the wiring 571.

The photoelectric conversion element PD including the aforementioned selenium-based material, amorphous silicon, or the like can be formed through general semiconductor manufacturing processes such as a deposition process, a lithography process, and an etching process. In addition, because the resistance of the selenium-based material is high, the photoelectric conversion layer 561 does not need to be divided between circuits as illustrated in FIG. 8A. Therefore, the photoelectric conversion element PD can be manufactured with a high yield at low cost.

Figure 13:
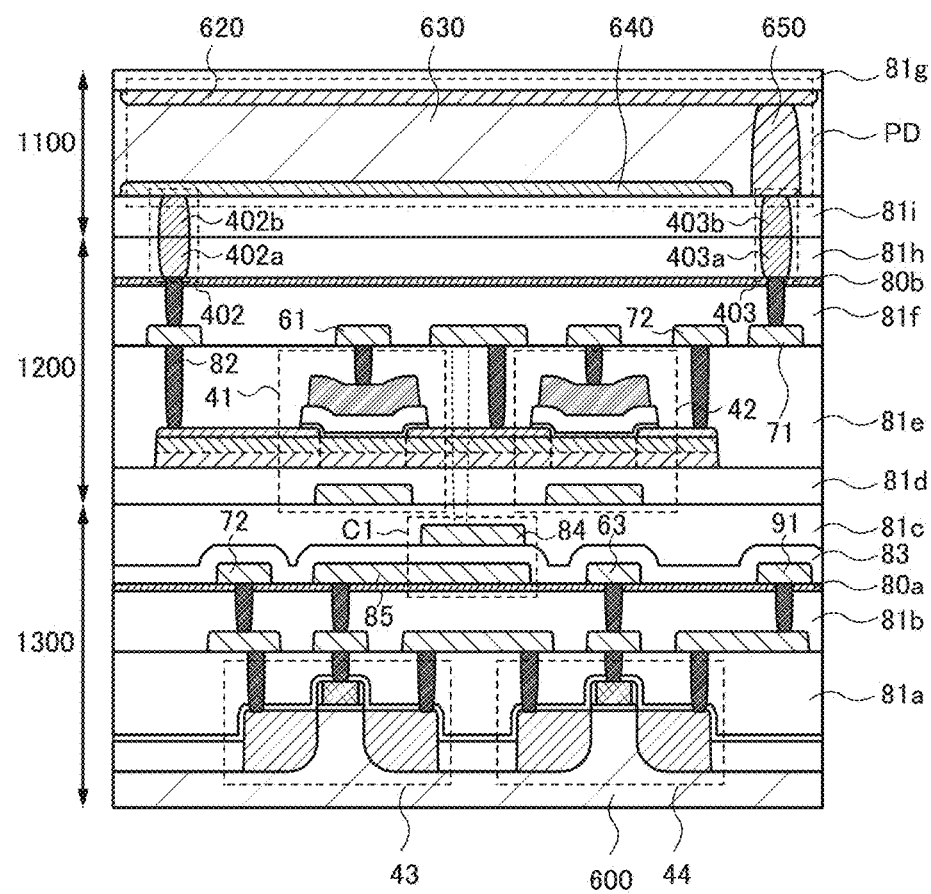
FIG. 13 is a cross-sectional view illustrating a structure of an imaging device.

In FIG. 13, the photoelectric conversion element PD included in the layer 1100 is a PN photodiode using a single crystal silicon substrate. The photoelectric conversion element PD may include a $p^+$ region 620, a $p^-$ region 630, an n-type region 640, and a $p^+$ region 650.

In the case where the structure is employed, it is preferable to use a method in which the layer 1200 is formed over the layer 1300 and then, the layer 1200 and the layer 1100 which are formed separately are bonded to each other. In this case, the insulating layer 81h and metal layers 402a and 403a are provided in the layer 1200. Furthermore, the insulating layer 81i and metal layers 402b and 403b are provided in the layer 1100.

The metal layers 402a and 403a include a region embedded in the insulating layer 81h and the metal layer 402a is electrically connected to one of the source and the drain of the transistor 41. The metal layer 403a is electrically connected to the wiring 71. The metal layers 402b and 403b include a region embedded in the insulating layer 81i, and the metal layer 402b is electrically connected to the n-type region 640 of the photoelectric conversion element PD. The metal layer 403b is electrically connected to the $p^+$ region 620 through the $p^+$ region 650.

As illustrated in FIG. 13, the metal layers 402a and 402b are provided in a position to be in direct contact with each other and the metal layers 403a and 403b are provided in a position to be in direct contact with each other to form connection portions 402 and 403.

The metal layers 402a and 402b are preferably formed using metal elements using the same main component. The metal layers 403a and 403b are preferably formed using metal elements using the same main component. Moreover, the insulating layers 81h and 81i are preferably formed using the same component.

For example, Cu, Al, Sn, Zn, W, Ag, Pt, Au, or the like can be used for the metal layers 402a, 402b, 403a, and 403b. Preferably, Cu, Al, W, or Au is used for easy bonding. In addition, silicon oxide, silicon oxynitride, silicon nitride oxide, silicon nitride, titanium nitride, or the like can be used for the insulating layers 81h and 81i.

When the above same metal material is used for the metal layers 402a, 402b, 403a, and 403b and the above same insulating material is used for the insulating layers 81h and 81i, a bonding step can be performed in the layers 1100 and 1200. The metal layers 402a and 402b can be electrically connected to each other and the metal layer 403a and the metal layer 403b can be electrically connected to each other through the bonding step. Furthermore, the connection between the insulating layers 81h and 81i can obtain mechanical strength.

For bonding the metal layers to each other, surface activated bonding and diffusion bonding can be used. Surface activated bonding is a method in which an oxide film, a layer adsorbing impurities, and the like are removed by sputtering or the like and the cleaned and activated surfaces of the metal layers are disposed in contact with each other to be bonded to each other. Diffusion bonding is a method in which the surfaces of the metal layers are bonded to each other by using temperature and pressure together. Both methods can cause bonding at an atomic level, thereby obtaining bonding with excellent electrical characteristics and excellent mechanical strength.

For bonding the insulating layers to each other, hydrophilic bonding or the like can be used after high planarity is obtained by polishing or the like. Hydrophilic bonding is a method in which the surfaces of the insulating layers are subjected to hydrophilicity treatment by oxygen plasma or the like, disposed in contact with each other to be bonded to each other temporarily, and then dehydrated by heat treatment to perform final bonding. The hydrophilic bonding can also cause bonding at an atomic level; thus, bonding with excellent mechanical strength can be obtained.

The insulating layers and the metal layers are mixed on the bonding surfaces of the layers 1100 and 1200; therefore, for example, surface activated bonding and hydrophilic bonding are preferably performed in combination when the layers 1100 and 1200 are bonded to each other.

For example, the following method can be used: the surfaces of the layers 1100 and 1200 are made clean after polishing, the surfaces of the metal layers are subjected to antioxidant treatment and hydrophilicity treatment, and then bonding is performed. Alternatively, hydrophilicity treatment may be performed on the surfaces of the metal layers with the use of hardly oxidizable metal such as Au. Note that a bonding method other than the above method may be used.

Bonding is performed after the devices in the layers are completed, so that the devices can be fabricated using an optimum process for each of them. Therefore, the electrical characteristics and reliability of the transistors and the photoelectric conversion element can be improved.

Alternatively, in an imaging device of one embodiment of the present invention, a circuit different from a pixel circuit can be provided using Si transistors formed in the layer 1300. Examples of the circuit include a driver circuit such as a column driver and a row driver, a data converter circuit such as an A/D converter, a noise reduction circuit such as a correlated double sampling (CDS) circuit, and a control circuit of a whole imaging device.

Figure 14:
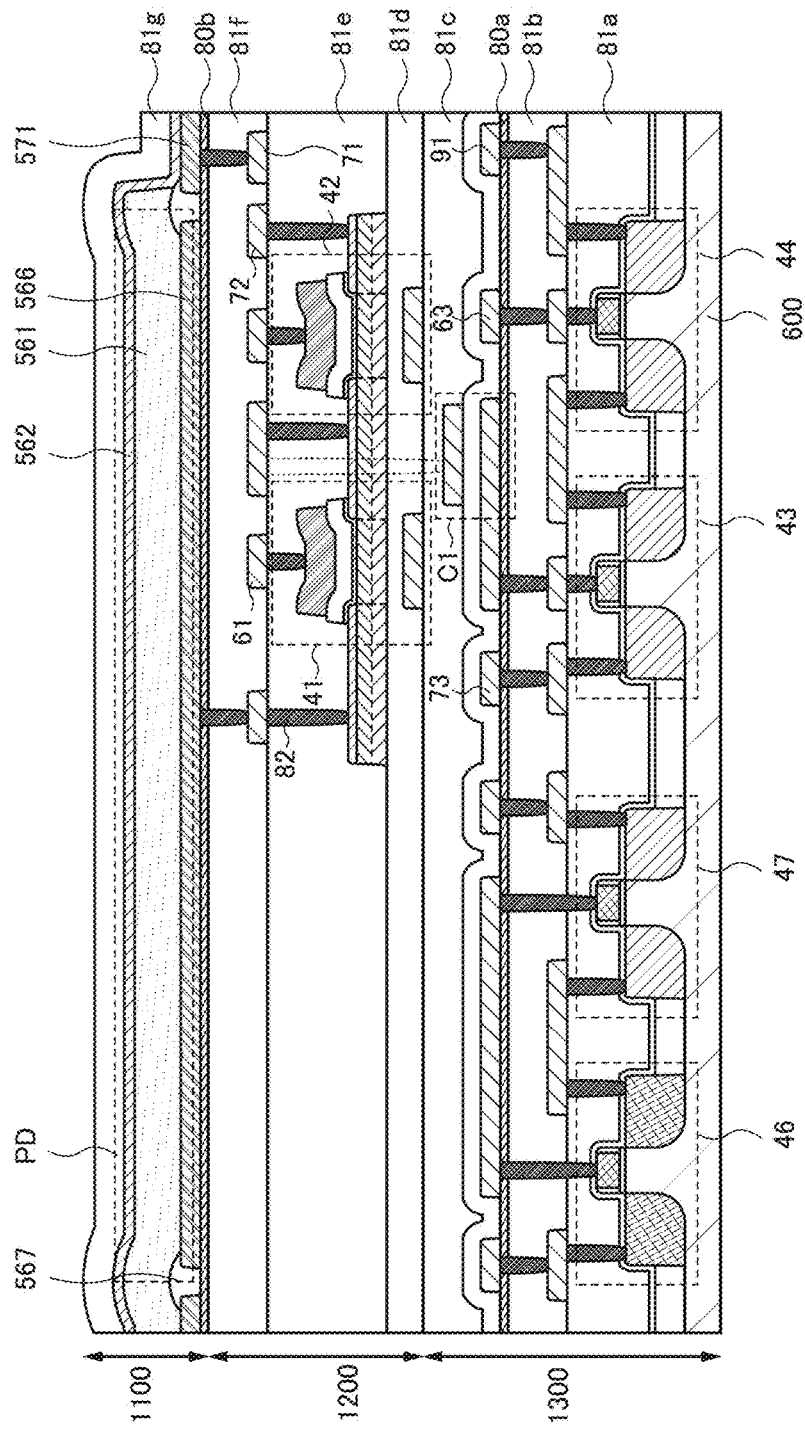
FIG. 14 is a cross-sectional view illustrating a structure of an imaging device.

A transistor 46 and a transistor 47 included in any of the above circuits are illustrated in FIG. 14. The transistors 46 and 47 can be formed in a region overlapping with the photoelectric conversion element PD. That is, the above circuit is formed in a region overlapping with the pixel 20. Note that although an example of a CMOS inverter in which the transistor 46 is a p-channel transistor and the transistor 47 is an n-channel transistor is illustrated in FIG. 14, another circuit configuration may also be employed.

Figure 15:
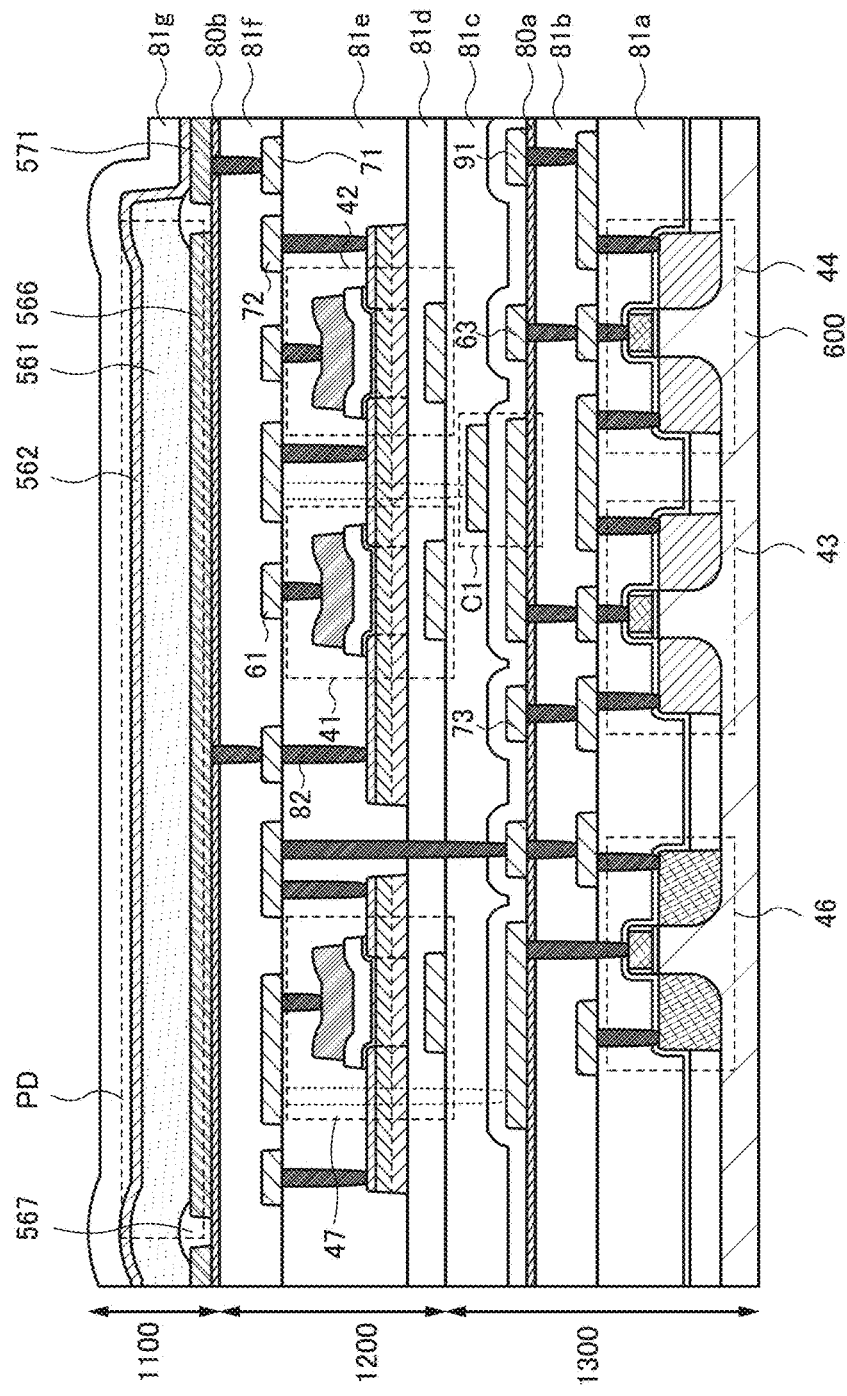
FIG. 15 is a cross-sectional view illustrating a structure of an imaging device.

Alternatively, as illustrated in FIG. 15, the transistor 47 may be an OS transistor provided in the layer 1200. In the configuration illustrated in FIG. 15, the transistors 46 and 47 can be provided in a region overlapping with each other in a bonding step; thus, the area of the circuit can be reduced. In addition, when the transistors 44 and 45 included in the pixel circuit are p-channel transistors, all the transistors provided over a single-crystal silicon substrate 600 can be p-channel transistors; thus, a step of forming n-channel Si transistors can be omitted.

Note that although FIG. 14 and FIG. 15 each illustrate the stacked structure in which the transistors 46 and 47 are added to the pixel circuit in FIG. 8A, the transistors 46 and 47 can also be added to the pixel circuit in FIGS. 12A to 12D or FIG. 13.

Figure 16A:
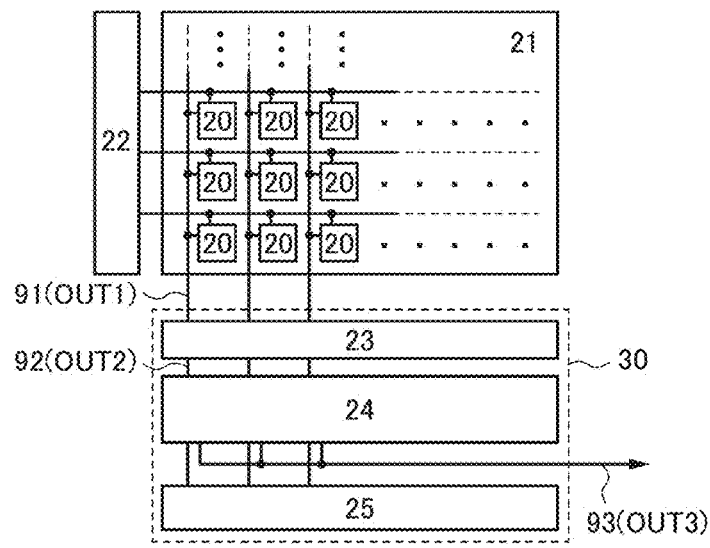
FIG. 16A is a block diagram illustrating an imaging device and FIG. 16B illustrates a circuit diagram of a CDS circuit and a block diagram of an A/D converter circuit.

FIG. 16A is a block diagram illustrating a circuit configuration of an imaging device of one embodiment of the present invention. The imaging device includes a pixel array 21 including the pixels 20 arranged in a matrix, a circuit 22 (row driver) having a function of selecting a row of the pixel array 21, a circuit 23 (CDS circuit) for performing correlated double sampling (CDS) on an output signal of the pixel 20, a circuit 24 (A/D converter circuit or the like) having a function of converting analog data output from the circuit 23 to digital data, and a circuit 25 (column driver) having a function of selecting and reading data converted in the circuit 24. Note that a configuration not including the circuit 23 can be employed. Furthermore, the circuits 23 to 25 are collectively referred to as a circuit 30.

Figure 16B:
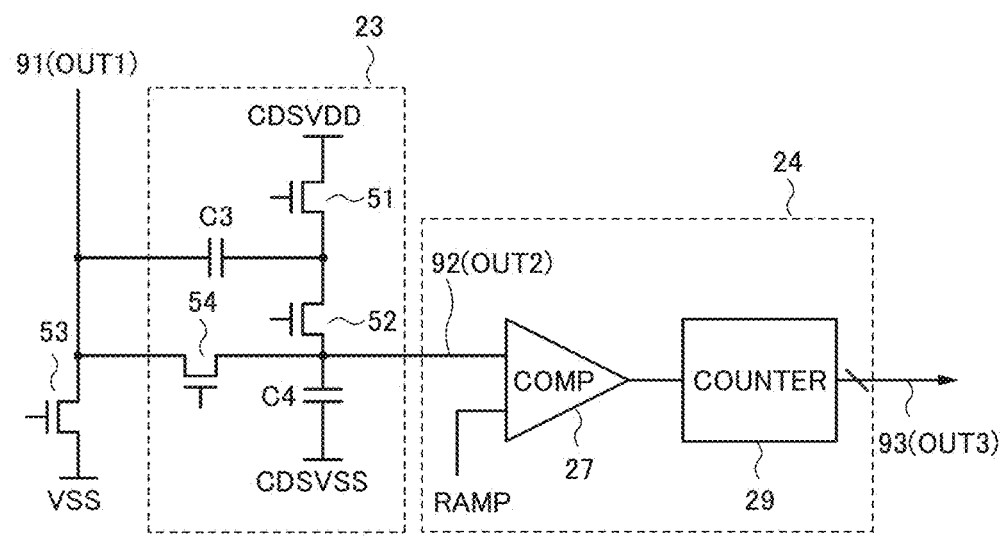

FIG. 16B illustrates a circuit diagram of the circuit 23 and a block diagram of the circuit 24; the circuit 23 and the circuit 24 are connected to one column of the pixel array 21. The circuit 23 can include a transistor 51, a transistor 52, a capacitor C3, and a capacitor C4. Furthermore, the circuit 24 can include a comparator circuit 27 and a counter circuit 29.

A transistor 53 serves as a current supply circuit. The wiring 91 (OUT1) is electrically connected to one of a source and a drain of the transistor 53, and a power supply line is connected to the other of the source and the drain of the transistor 53. As the power supply line, a low potential power supply line (VSS) can be used, for example. Bias voltage is always applied to a gate of the transistor 53.

In the circuit 23, one of a source and a drain of the transistor 51 is electrically connected to one of a source and a drain of the transistor 52. The one of the source and the drain of the transistor 51 is electrically connected to one electrode of the capacitor C3. The other of the source and the drain of the transistor 52 is electrically connected to one electrode of the capacitor C4. The other of the source and the drain of the transistor 52 is electrically connected to a wiring 92 (OUT2). The other of the source and the drain of the transistor 51 is electrically connected to a high potential power supply line (CDSVDD) through which a reference potential is supplied, for example. The other electrode of the capacitor C4 is electrically connected to a low potential power supply line (CDSVSS), for example.

One of a source and a drain of the transistor 54 is electrically connected to the wiring 91 (OUT1), and the other of the source and the drain of the transistor 54 is electrically connected to the wiring 92 (OUT2). When the transistor 54 is turned on, the circuit 23 can be bypassed. In other words, depending on the operation mode of the imaging device, an operation in which the circuit 23 is not needed can be performed.

In an imaging device of one embodiment of the present invention, a stacked structure of the pixel array 21 and a circuit portion 35 including the circuit 30 can be employed. For example, a stacked structure as illustrated in the perspective view in FIG. 17C, which includes the pixel array 21 having the top view in FIG. 17A and the circuit portion 35 having the top view in FIGS. 17B1 and 17B2 can be obtained. With such a structure, transistors suitable for respective elements can be used, and the area of the imaging device can be reduced. Note that the layouts of the circuit in FIGS. 17B1 and 17B2 are examples, and another layout may be used. Although a control circuit 26 is provided in the circuit portion 35, the control circuit 26 may be provided outside the circuit portion 35.

FIG. 17B1 illustrates a structure where the circuits 22 and 30 are divided into two parts and placed not at the edge portion but near the center. Shift register circuits included in the circuits 22 and 30 may be operated independently in divided portions or operated as one shift register circuit.

The circuits 22 and 30 in FIG. 17B2 are divided into two parts in a manner similar to that in FIG. 17B1 but placed obliquely.

With the structure illustrated in FIG. 17B1 or 17B2, loads of the wirings connected to the pixel 20 can be reduced as compared with the case where the circuits 22 and 30 are placed at the edge portion. Although the loads of the wirings are not uniform, it does not matter when wiring capacity and wiring resistance are small.

To achieve both a high-speed operation and the configuration of a CMOS circuit, the circuits 22 and 30 are preferably formed using Si transistors. For example, the circuit portion 35 can be formed over a silicon substrate. The pixel array 21 is preferably formed using OS transistors. Note that some transistors included in the circuits 22 and 30 may be formed using OS transistors.

Figure 18A:
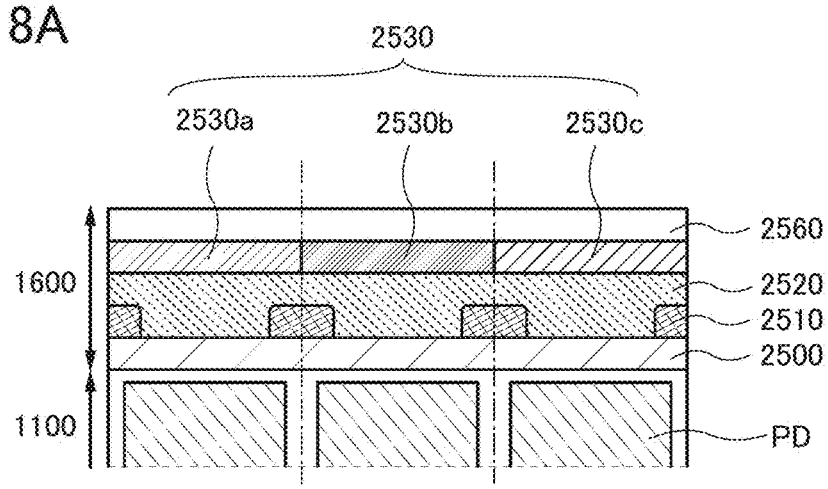
FIGS. 18A to 18D are cross-sectional views each illustrating a structure of an imaging device.

FIG. 18A is a cross-sectional view of an example of a mode in which a color filter and the like are added to the imaging device. The cross-sectional view illustrates part of a region including pixel circuits for three pixels. An insulating layer 2500 is formed over the layer 1100 where the photoelectric conversion element PD is formed. As the insulating layer 2500, a silicon oxide film or the like with a high visible-light transmitting property can be used. In addition, a silicon nitride film may be stacked as a passivation film. In addition, a dielectric film of hafnium oxide or the like may be stacked as an anti-reflection film.

A light-blocking layer 2510 may be formed over the insulating layer 2500. The light-blocking layer 2510 has a function of inhibiting color mixing of light passing through an upper color filter. The light-blocking layer 2510 can be formed of a metal layer of aluminum, tungsten, or the like, or a stack of the metal layer and a dielectric film functioning as an anti-reflection film.

An organic resin layer 2520 can be provided as a planarization film over the insulating layer 2500 and the light-blocking layer 2510. A color filter 2530 (a color filter 2530a, a color filter 2530b, and a color filter 2530c) is formed in each pixel. For example, the color filter 2530a, the color filter 2530b, and the color filter 2530c each have a color of red (R), green (G), blue (B), yellow (Y), cyan (C), magenta (M), or the like, whereby a color image can be obtained.

A light-transmitting insulating layer 2560 or the like can be provided over the color filter 2530.

Figure 18B:
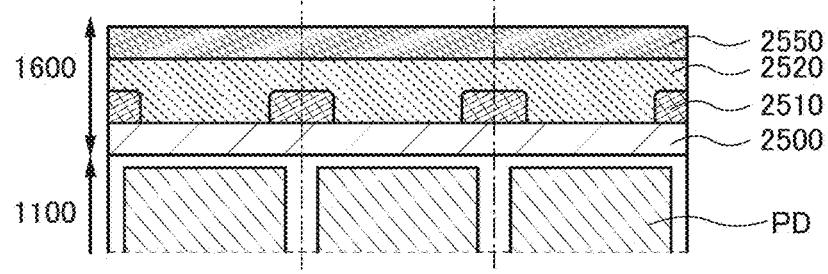

As illustrated in FIG. 18B, an optical conversion layer 2550 may be used instead of the color filter 2530. Such a structure enables an imaging device to take images in various wavelength regions.

For example, when a filter that blocks light having a wavelength shorter than or equal to that of visible light is used as the optical conversion layer 2550, an infrared imaging device can be obtained. When a filter that blocks light having a wavelength shorter than or equal to that of near infrared light is used as the optical conversion layer 2550, a far-infrared imaging device can be obtained. When a filter that blocks light having a wavelength longer than or equal to that of visible light is used as the optical conversion layer 2550, an ultraviolet imaging device can be obtained.

Furthermore, when a scintillator is used as the optical conversion layer 2550, an imaging device that takes an image visualizing the intensity of radiations and is used for an X-ray imaging device or the like can be obtained. Radiation such as X-rays passes through an object to enter a scintillator, and then is converted into light (fluorescence) such as visible light or ultraviolet light owing to a phenomenon known as photoluminescence. Then, the photoelectric conversion element PD detects the light to obtain image data. Furthermore, the imaging device having the structure may be used in a radiation detector or the like.

A scintillator is formed of a substance that, when irradiated with radiation such as X-rays or gamma-rays, absorbs energy of the radiation to emit visible light or ultraviolet light. For example, a resin or ceramics in which any of $Gd_2O_2S$:Tb, $Gd_2O_2S$:Pr, $Gd_2O_2S$:Eu, BaFCl:Eu, NaI, CsI, $CaF_2$, $BaF_2$, $CeF_3$, LiF, LiI, and ZnO is dispersed can be used.

In the photoelectric conversion element PD using a selenium-based material, radiation such as X-rays can be directly converted into charge; thus, the scintillator is not necessarily used.

Figure 18C:
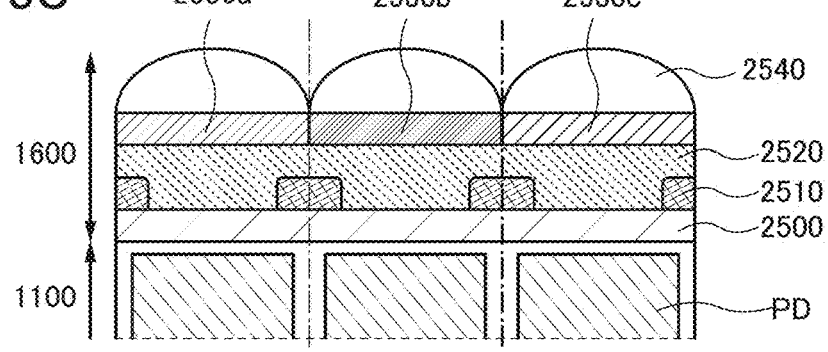
Figure 18D:
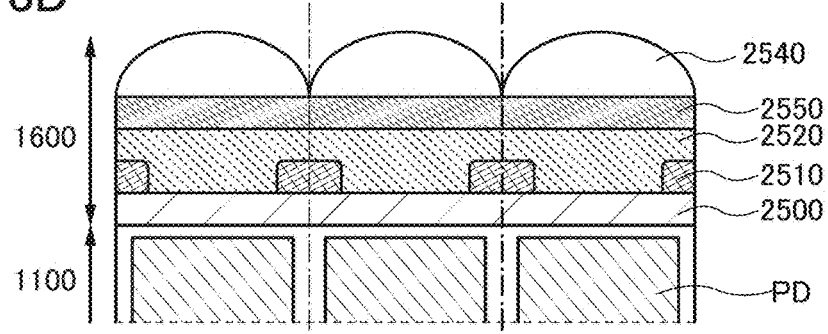

Alternatively, as illustrated in FIG. 18C, a microlens array 2540 may be provided over the color filters 2530a, 2530b, and 2530c. Light penetrating lenses included in the microlens array 2540 goes through the color filters positioned thereunder to reach the photoelectric conversion element PD. Alternatively, as illustrated in FIG. 18D, the microlens array 2540 may be provided over the optical conversion layer 2550. Note that a region other than the layer 1100 in FIGS. 18A to 18D is referred to as a layer 1600.

Figure 19:
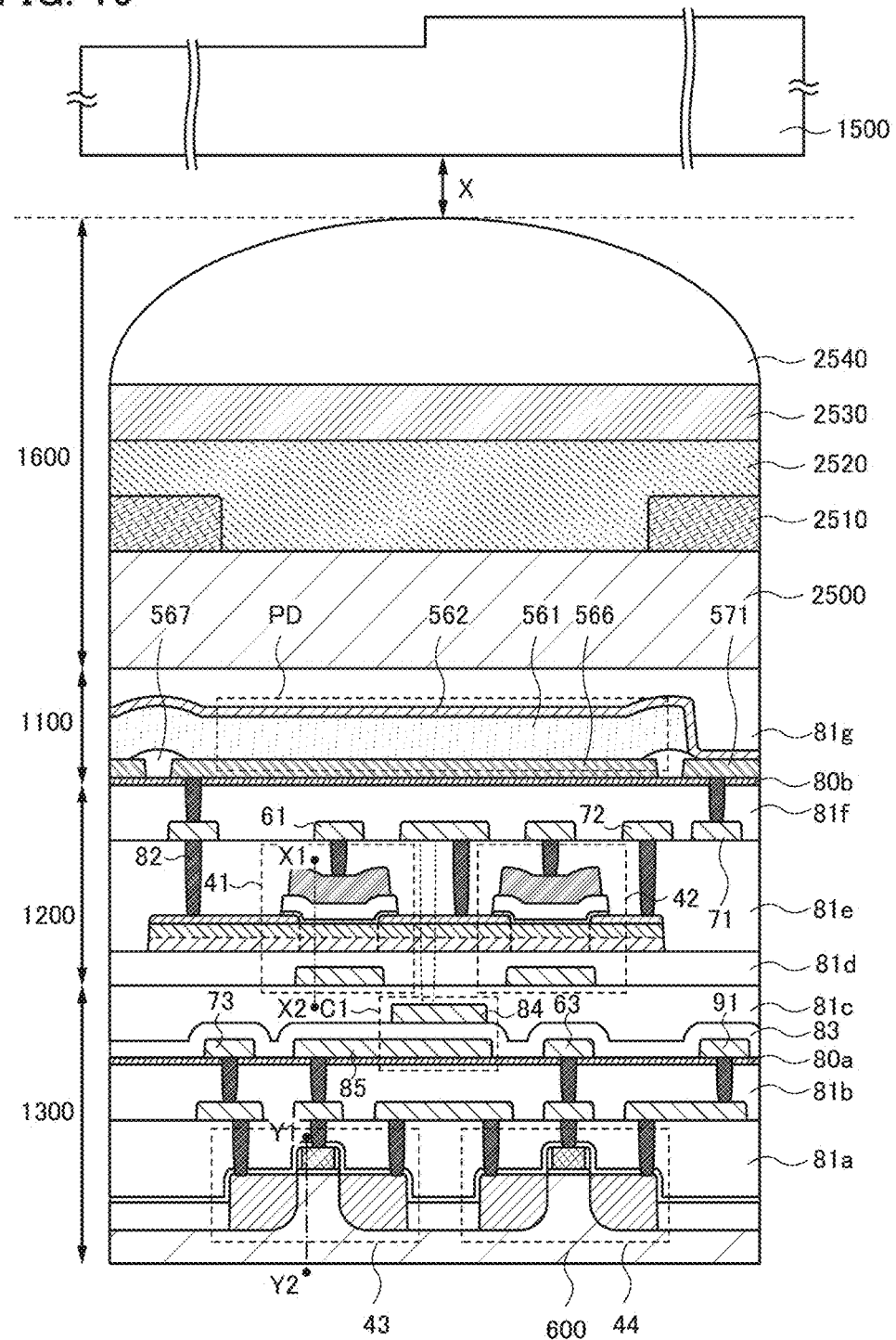
FIG. 19 is a cross-sectional view illustrating a structure of an imaging device.

FIG. 19 illustrates a specific example of a stacked structure of the pixel circuit of one embodiment of the present invention, the microlens array 2540 illustrated in FIG. 18C, and the like. In the example illustrated in FIG. 19, the structure of the pixel illustrated in FIG. 8A is used. In the example illustrated in FIG. 20, the structure of the pixel illustrated in FIG. 13 is used.

The photoelectric conversion element PD, the circuit of the pixel circuit, and the driver circuit can be positioned so as to overlap with each other in regions in this manner, leading to a reduction in the size of the imaging device.

Figure 20:
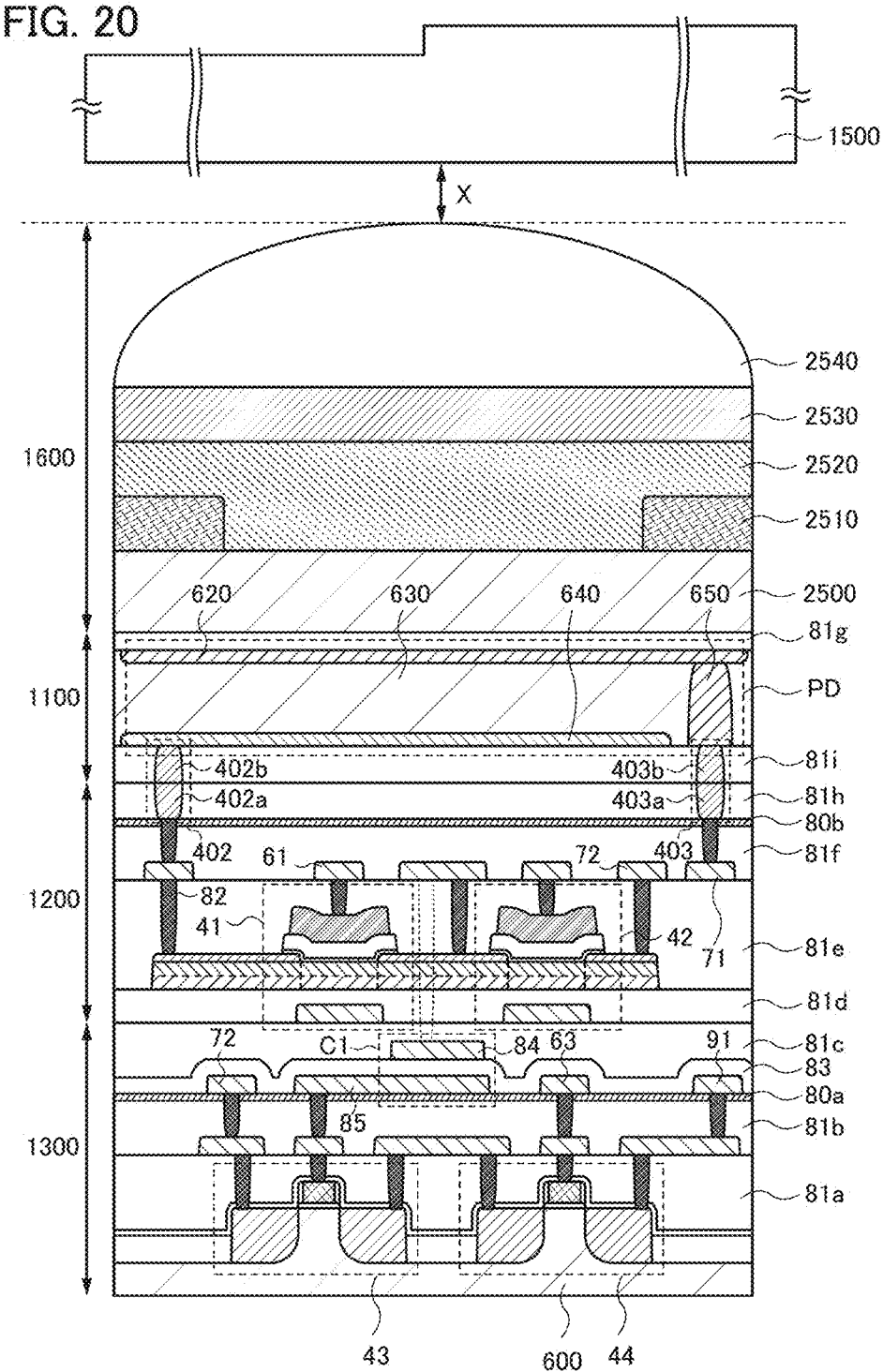
FIG. 20 is a cross-sectional view illustrating a structure of an imaging device.

As illustrated in FIG. 19 and FIG. 20, a diffraction grating 1500 may be provided above the microlens array 2540. An image of an object through the diffraction grating 1500 (i.e., a diffraction pattern) can be scanned into a pixel, and an input image (an object image) can be formed from a captured image in the pixel by arithmetic processing. In addition, the use of the diffraction grating 1500 instead of a lens can reduce the cost of electronic devices or the like including the imaging device.

The diffraction grating 1500 can be formed using a light-transmitting material. For example, an inorganic insulating film such as a silicon oxide film or a silicon oxynitride film can be used. Alternatively, an organic insulating film such as an acrylic resin film or a polyimide resin film may be used. Alternatively, a stack of the inorganic insulating film and the organic insulating film may be used.

In addition, the diffraction grating 1500 can be formed by a lithography process using a photosensitive resin or the like. Alternatively, the diffraction grating 1500 can be formed by a lithography process and an etching process. Alternatively, the diffraction grating 1500 can be formed by nanoimprint lithography, laser scribing, or the like.

A space X may be provided between the diffraction grating 1500 and the microlens array 2540. The space X can be less than or equal to 1 mm, preferably less than or equal to 100 μm. The space may be an empty space or may be a sealing layer or an adhesion layer formed using a light-transmitting material. For example, an inert gas such as nitrogen or a rare gas can be sealed in the space. Alternatively, an acrylic resin, an epoxy resin, a polyimide resin, or the like may be provided in the space. Alternatively, a liquid such as silicone oil may be provided. Even in the case where the microlens array 2540 is not provided, the space X may be provided between the color filter 2530 and the diffraction grating 1500.

Note that the pixel circuit may have a configuration in which the transistors 42 to 45 are shared among a plurality of pixels as illustrated in FIG. 21. FIG. 21 illustrates a configuration in which the transistors 42 to 45 are shared among a plurality of pixels in a direction in which the wiring 91 (OUT1) extends (in the perpendicular direction); however, the transistors 42 to 45 may be shared among a plurality of pixels in a direction in which the wiring 63 (SE) extends (in the horizontal direction) or in the horizontal and perpendicular directions. With such a configuration, the number of transistors included in one pixel can be reduced.

Alternatively, the number of pixels which share transistors is not limited to four, and may be two, three, or five or more.

Figure 3:
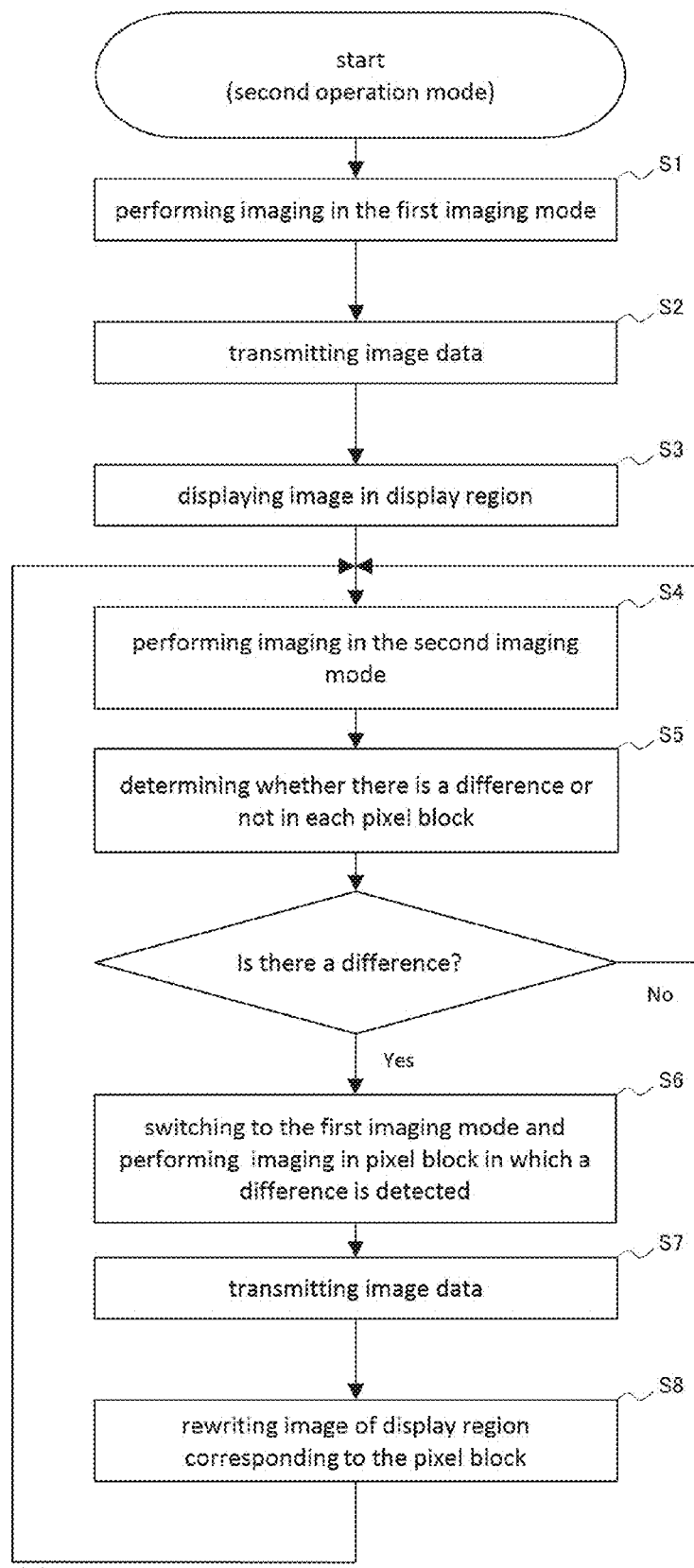
FIG. 3 is a flowchart illustrating an operation of an image display system.

As illustrated in FIGS. 22A1 and 22B1, the imaging device may be bent. FIG. 22A1 illustrates a state in which the imaging device is bent along dashed-two dotted line Y1-Y2. FIG. 22A2 is a cross-sectional view illustrating a portion indicated by dashed-two dotted line X1-X2 in FIG. 22A1. FIG. 22A3 is a cross-sectional view illustrating a portion indicated by dashed-two dotted line Y1-Y2 in FIG. 22A1.

FIG. 22B1 illustrates a state where the imaging device is bent along dashed-two dotted line X3-X4 and dashed-two dotted line Y3-Y4. FIG. 22B2 is a cross-sectional view illustrating a portion indicated by dashed-two dotted line X3-X4 in FIG. 22B1. FIG. 22B3 is a cross-sectional view illustrating a portion indicated by dashed-two dotted line Y3-Y4 in FIG. 22B1.

The bent imaging device enables the curvature of field and astigmatism to be reduced. Thus, the optical design of lens and the like, which is used in combination with the imaging device, can be facilitated. For example, the number of lenses used for aberration correction can be reduced; accordingly, the size or weight of electronic devices including the imaging device can be easily reduced. In addition, the quality of a captured image can be improved.

In this embodiment, one embodiment of the present invention has been described. Other embodiments of the present invention are described in other embodiments. Note that one embodiment of the present invention is not limited thereto. In other words, various embodiments of the invention are described in this embodiment and the other embodiments, and one embodiment of the present invention is not limited to a particular embodiment. Although an example in which one embodiment of the present invention is applied to an imaging device is described, one embodiment of the present invention is not limited thereto. Depending on circumstances or conditions, one embodiment of the present invention is not necessarily applied to an imaging device. One embodiment of the present invention may be applied to a semiconductor device with another function, for example. Although an example in which a channel formation region, a source region, a drain region, or the like of a transistor includes an oxide semiconductor is described as one embodiment of the present invention, one embodiment of the present invention is not limited thereto. Depending on circumstances or conditions, various transistors or a channel formation region, a source region, a drain region, or the like of a transistor in one embodiment of the present invention may include various semiconductors. Depending on circumstances or conditions, various transistors or a channel formation region, a source region, a drain region, or the like of a transistor in one embodiment of the present invention may include, for example, at least one of silicon, germanium, silicon germanium, silicon carbide, gallium arsenide, aluminum gallium arsenide, indium phosphide, gallium nitride, and an organic semiconductor. Alternatively, for example, depending on circumstances or conditions, various transistors or a channel formation region, a source region, a drain region, or the like of a transistor in one embodiment of the present invention does not necessarily include an oxide semiconductor. Although an example in which a global shutter system is employed is described as one embodiment of the present invention, one embodiment of the present invention is not limited thereto. Depending on circumstances or conditions, another system such as a rolling shutter system may be employed in one embodiment of the present invention. Alternatively, depending on circumstances or conditions, the global shutter system is not necessarily employed.

This embodiment can be implemented in appropriate combination with the configurations described in the other embodiments.

Embodiment 4

In this embodiment, examples of a display panel included in the display device 3100 described in Embodiment 1 will be described.

Figure 23:
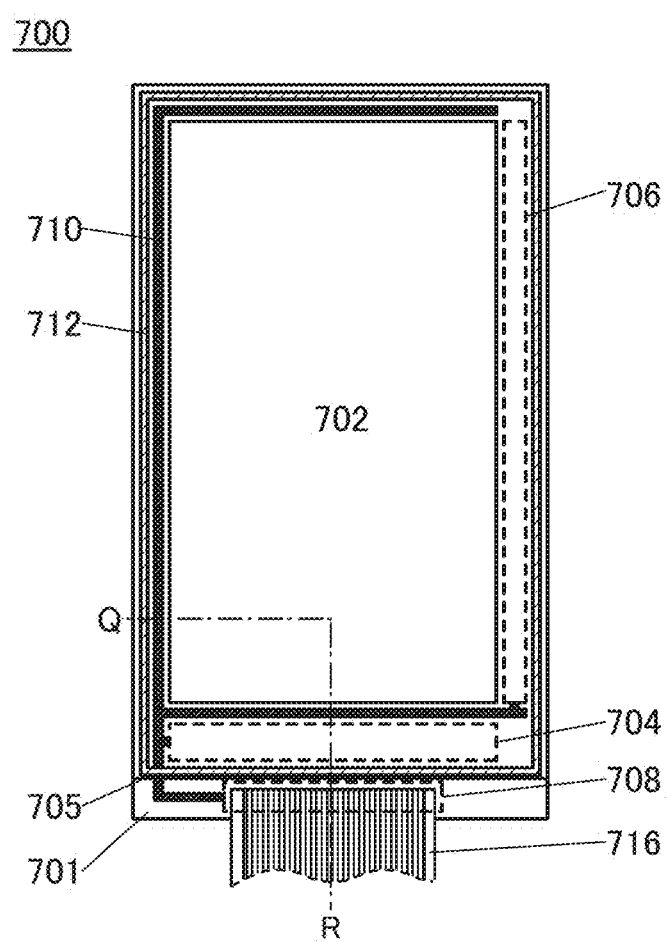
FIG. 23 is a top view illustrating a display panel.

FIG. 23 is a top view illustrating an example of a display panel. A display panel 700 in FIG. 23 includes a pixel portion 702 provided over a first substrate 701, a source driver circuit portion 704 and a gate driver circuit portion 706 that are provided over the first substrate 701, a sealant 712 provided to surround the pixel portion 702, the source driver circuit portion 704, and the gate driver circuit portion 706, and a second substrate 705 provided to face the first substrate 701. The first substrate 701 and the second substrate 705 are sealed with the sealant 712. That is, the pixel portion 702, the source driver circuit portion 704, and the gate driver circuit portion 706 are enclosed by the first substrate 701, the sealant 712, and the second substrate 705. Although not illustrated in FIG. 23, a display element is provided between the first substrate 701 and the second substrate 705.

In the display panel 700, a flexible printed circuit (FPC) terminal portion 708 that is electrically connected to the pixel portion 702, the source driver circuit portion 704, and the gate driver circuit portion 706 is provided in a region different from the region that is over the first substrate 701 and surrounded by the sealant 712. Furthermore, an FPC 716 is connected to the FPC terminal portion 708, and a variety of signals and the like are supplied from the FPC 716 to the pixel portion 702, the source driver circuit portion 704, and the gate driver circuit portion 706. Furthermore, a signal line 710 is connected to the pixel portion 702, the source driver circuit portion 704, the gate driver circuit portion 706, and the FPC terminal portion 708. Through the signal line 710, a variety of signals and the like are supplied from the FPC 716 to the pixel portion 702, the source driver circuit portion 704, the gate driver circuit portion 706, and the FPC terminal portion 708.

A plurality of gate driver circuit portions 706 may be provided in the display panel 700. The structure of the display panel 700 is not limited to the example shown here, in which the source driver circuit portion 704 and the gate driver circuit portion 706 as well as the pixel portion 702 are formed over the first substrate 701. For example, only the gate driver circuit portion 706 may be formed over the first substrate 701, or only the source driver circuit portion 704 may be formed over the first substrate 701. In this case, a substrate over which a source driver circuit, a gate driver circuit, or the like is formed (e.g., a driver circuit board formed using a single-crystal semiconductor film or a polycrystalline semiconductor film) may be formed on the first substrate 701. Note that there is no particular limitation on the method for connecting the separately prepared driver circuit board, and a chip on glass (COG) method, a wire bonding method, or the like can be used.

The pixel portion 702, the source driver circuit portion 704, and the gate driver circuit portion 706 included in the display panel 700 include a plurality of transistors. As the plurality of transistors, any of the transistors that are semiconductor devices of embodiments of the present invention can be used.

The display panel 700 can include a variety of elements. As examples of the elements, electroluminescent (EL) element (e.g., an EL element containing organic and inorganic materials, an organic EL element, an inorganic EL element, or an LED), a light-emitting transistor element (a transistor that emits light depending on current), an electron emitter, a liquid crystal element, an electronic ink display, an electrophoretic element, an electrowetting element, a plasma display panel (PDP), a micro electro mechanical systems (MEMS) display (e.g., a grating light valve (GLV), a digital micromirror device (DMD), a digital micro shutter (DMS) element, or an interferometric modulator display (IMOD) element), and a piezoelectric ceramic display can be given.

An example of a display panel including an EL element is an EL display. Examples of a display panel including an electron emitter include a field emission display (FED) and an SED-type flat panel display (SED: surface-conduction electron-emitter display). An example of a display panel including a liquid crystal element is a liquid crystal display (a transmissive liquid crystal display, a transflective liquid crystal display, a reflective liquid crystal display, a direct-view liquid crystal display, or a projection liquid crystal display). An example of a display panel including electronic ink or an electrophoretic element is electronic paper. In a transflective liquid crystal display or a reflective liquid crystal display, some or all of pixel electrodes may function as reflective electrodes. For example, some or all of pixel electrodes may contain aluminum, silver, or the like. In this case, a memory circuit such as an SRAM can be provided under the reflective electrodes, leading to lower power consumption.

As a display system of the display panel 700, a progressive system, an interlace system, or the like can be employed. Furthermore, color elements controlled in pixels at the time of color display are not limited to three colors: R, G, and B (R, G, and B correspond to red, green, and blue, respectively). For example, four pixels of an R pixel, a G pixel, a B pixel, and a W (white) pixel may be used. Alternatively, a color element may be composed of two colors of R, G, and B as in PenTile layout. The two colors may differ between color elements. Alternatively, one or more colors of yellow, cyan, magenta, and the like may be added to RGB. Note that the size of a display region may differ between dots of color elements. One embodiment of the disclosed invention is not limited to a color display panel; the disclosed invention can also be applied to a monochrome display panel.

A coloring layer (also referred to as a color filter) may be used to obtain a full-color display panel in which white light (W) is used for a backlight (e.g., an organic EL element, an inorganic EL element, an LED, or a fluorescent lamp). For example, a red (R) coloring layer, a green (G) coloring layer, a blue (B) coloring layer, and a yellow (Y) coloring layer can be combined as appropriate. With the use of the coloring layer, high color reproducibility can be obtained as compared with the case without the coloring layer. Here, by providing a region with a coloring layer and a region without a coloring layer, white light in the region without the coloring layer may be directly utilized for display. By partly providing the region without a coloring layer, a decrease in the luminance of a bright image due to the coloring layer can be suppressed, and approximately 20% to 30% of power consumption can be reduced in some cases. In the case where full-color display is performed using a self-luminous element such as an organic EL element or an inorganic EL element, elements may emit light in their respective colors R, G, B, Y, and W. By using a self-luminous element, power consumption may be further reduced as compared with the case of using a coloring layer.

As a coloring system, any of the following systems may be used: the above-described color filter system in which part of white light is converted into red light, green light, and blue light through color filters; a three-color system in which red light, green light, and blue light are used; and a color conversion system or a quantum dot system in which part of blue light is converted into red light or green light.

Figure 24:
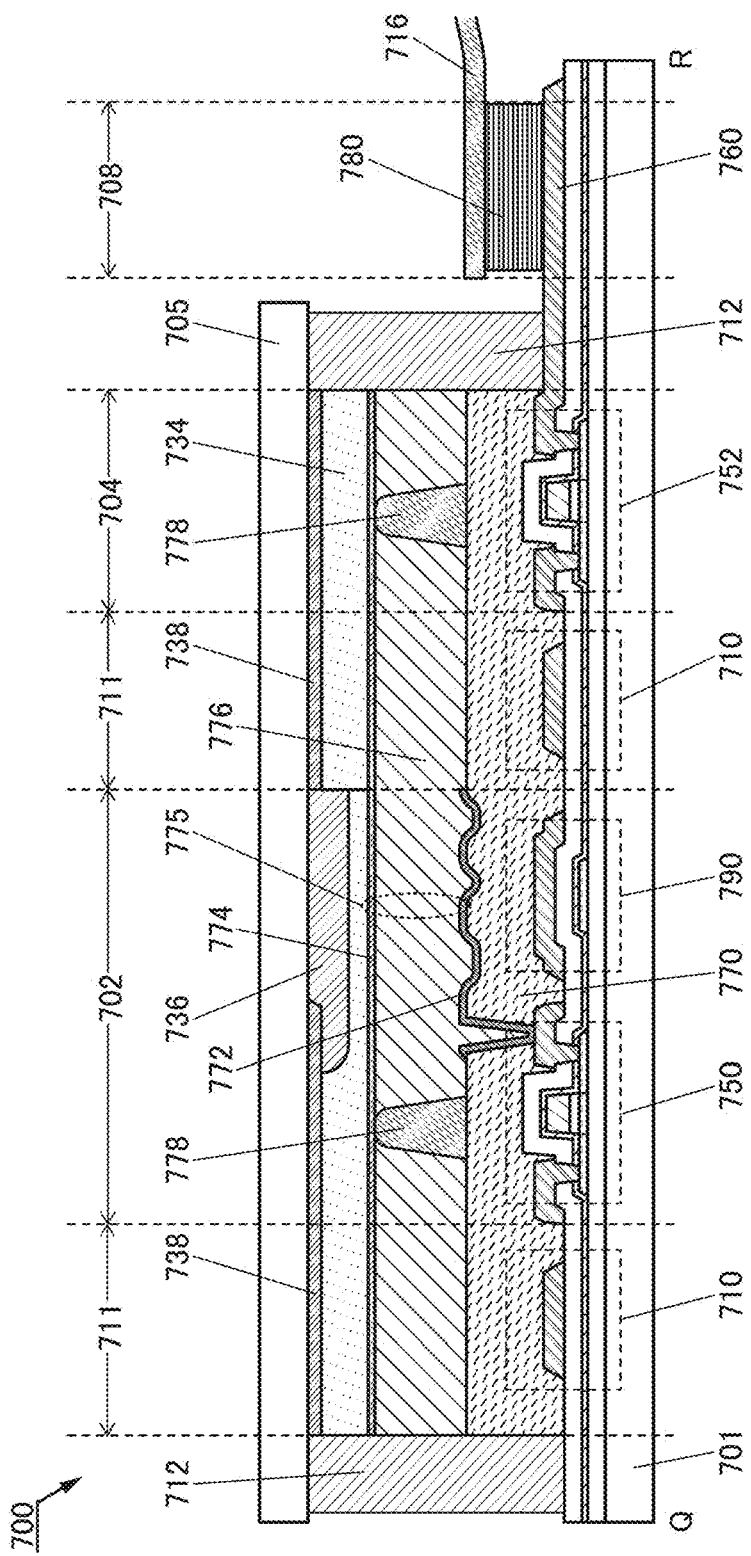
FIG. 24 is a cross-sectional view illustrating a display panel.
Figure 25:
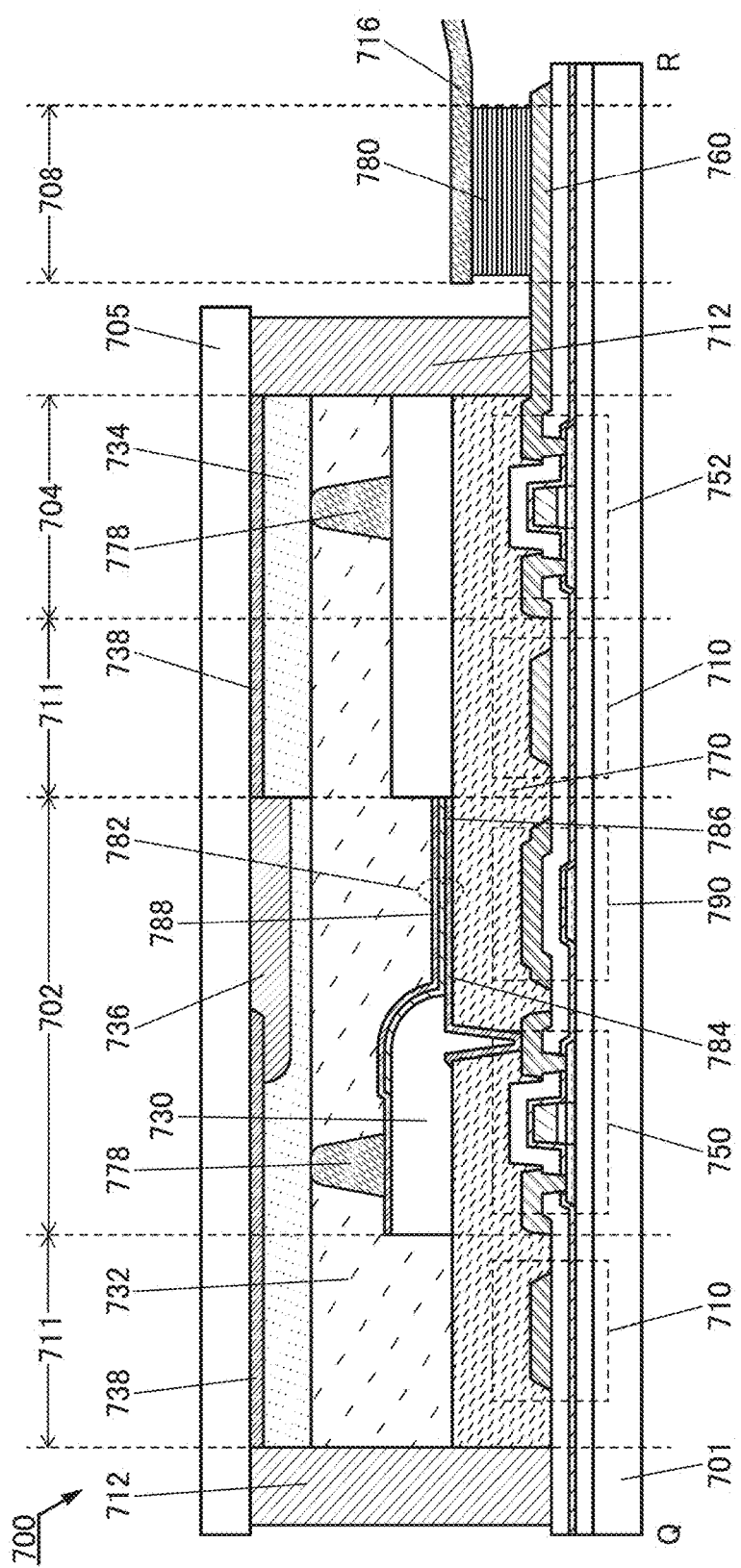
FIG. 25 is a cross-sectional view illustrating a display panel.

In this embodiment, a structure including a liquid crystal element as a display element and a structure including an EL element as a display element are described with reference to FIG. 24 and FIG. 25. FIG. 24 is a cross-sectional view taken along dashed-dotted line Q-R in FIG. 23 and illustrates the structure including a liquid crystal element as a display element. FIG. 25 is a cross-sectional view taken along dashed-dotted line Q-R in FIG. 23 and illustrates the structure including an EL element as a display element.

Portions common to FIG. 24 and FIG. 25 are described first, and then, different portions are described.

<Portions Common to Display Panels>

The display panel 700 in FIG. 24 and FIG. 25 includes a lead wiring portion 711, the pixel portion 702, the source driver circuit portion 704, and the FPC terminal portion 708. The lead wiring portion 711 includes the signal line 710. The pixel portion 702 includes a transistor 750 and a capacitor 790. The source driver circuit portion 704 includes a transistor 752.

The structures of the transistors 750 and 752 are examples, and the transistors 750 and 752 may each have the structure of any of the transistors described in the other embodiments.

The transistors used in the display panel described in this embodiment each are an OS transistor including an oxide semiconductor film which is highly purified and in which formation of oxygen vacancies is suppressed. The transistor can have a low off-state current. Accordingly, an electrical signal such as an image signal can be held for a long time, and a long writing interval can be set in an on state. Accordingly, the frequency of rewriting operation can be reduced, which suppresses power consumption.

In addition, the transistor used in this embodiment can have relatively high field-effect mobility and thus is capable of high-speed operation. For example, in the display panel 700 that includes such a transistor capable of high-speed operation, a switching transistor in a pixel portion and a driver transistor in a driver circuit portion can be formed over one substrate. That is, since a structure in which a semiconductor device formed of a silicon wafer or the like is not additionally needed as a driver circuit can be employed, the number of components of the semiconductor device can be reduced. In addition, by using the transistor capable of high-speed operation in the pixel portion, a high-quality image can be provided.

The capacitor 790 includes a lower electrode and an upper electrode. The lower electrode is formed through a step of processing the same oxide semiconductor film as the oxide semiconductor film included in the transistor 750. The upper electrode is formed through a step of processing the same conductive film as a conductive film functioning as a source electrode or a drain electrode of the transistor 750. Between the lower electrode and the upper electrode, an insulating film formed through a step of forming the same insulating film as a third insulating film and a fourth insulating film included in the transistor 750 is provided. That is, the capacitor 790 has a stacked-layer structure in which the insulating films functioning as a dielectric are positioned between the pair of electrodes.

In FIG. 24 and FIG. 25, a planarization insulating film 770 is provided over the transistor 750, the transistor 752, and the capacitor 790.

The planarization insulating film 770 can be formed using a heat-resistant organic material such as a polyimide resin, an acrylic resin, a polyimide amide resin, a benzocyclobutene resin, a polyamide resin, or an epoxy resin. Note that the planarization insulating film 770 may be formed by stacking a plurality of insulating films formed using any of these materials. A structure without the planarization insulating film 770 may also be employed.

Although FIG. 24 and FIG. 25 each illustrate an example in which the transistor 750 included in the pixel portion 702 and the transistor 752 included in the source driver circuit portion 704 are top-gate transistors, one embodiment of the present invention is not limited thereto. For example, the pixel portion 702 and the source driver circuit portion 704 may include different transistors. A top-gate transistor and a bottom-gate transistor may be used in combination. Note that the term "source driver circuit portion 704" can be replaced by the term "gate driver circuit portion".

The signal line 710 is formed through the same process as the conductive films functioning as source electrodes and drain electrodes of the transistors 750 and 752. Note that the signal line 710 may be formed using a conductive film that is formed through a process different from the process of forming the source electrodes and the drain electrodes of the transistors 750 and 752. For example, an oxide semiconductor film formed through the same process as an oxide semiconductor film functioning as a gate electrode may be used. In the case where the signal line 710 is formed using a material containing a copper element, signal delay or the like due to wiring resistance is reduced, which enables display on a large screen.

The FPC terminal portion 708 includes a connection electrode 760, an anisotropic conductive film 780, and the FPC 716. Note that the connection electrode 760 is formed through the same process as the conductive films functioning as source electrodes and drain electrodes of the transistors 750 and 752. The connection electrode 760 is electrically connected to a terminal included in the FPC 716 through the anisotropic conductive film 780.

For example, glass substrates can be used as the first substrate 701 and the second substrate 705. As the first substrate 701 and the second substrate 705, flexible substrates may also be used. An example of the flexible substrate is a plastic substrate.

A structure 778 is provided between the first substrate 701 and the second substrate 705. The structure 778 is a columnar spacer obtained by selective etching of an insulating film and is provided to control the distance (cell gap) between the first substrate 701 and the second substrate 705. Alternatively, a spherical spacer may be used as the structure 778.

A light-blocking film 738 functioning as a black matrix, a coloring film 736 functioning as a color filter, and an insulating film 734 in contact with the light-blocking film 738 and the coloring film 736 are provided on the second substrate 705 side.

<Structure Example of Display Panel Including Liquid Crystal Element>

The display panel 700 in FIG. 24 includes a liquid crystal element 775. The liquid crystal element 775 includes a conductive film 772, a conductive film 774, and a liquid crystal layer 776. The conductive film 774 is provided on the second substrate 705 side and functions as a counter electrode. The display panel 700 in FIG. 24 can display an image in such a manner that transmission or non-transmission of light is controlled by the alignment state in the liquid crystal layer 776 that is changed depending on the voltage applied between the conductive film 772 and the conductive film 774.

The conductive film 772 is connected to the conductive film functioning as the source electrode or the drain electrode of the transistor 750. The conductive film 772 is formed over the planarization insulating film 770 and functions as a pixel electrode, that is, one electrode of the display element. The conductive film 772 functions as a reflective electrode. The display panel 700 in FIG. 24 is what is called a reflective color liquid crystal display panel that displays an image by utilizing external light that is reflected by the conductive film 772 and then extracted through the coloring film 736.

A conductive film that transmits visible light or a conductive film that reflects visible light can be used as the conductive film 772. For example, a material containing an element selected from indium (In), zinc (Zn), and tin (Sn) may be used for the conductive film that transmits visible light. For example, a material containing aluminum or silver may be used for the conductive film that reflects visible light. In this embodiment, a conductive film that reflects visible light is used as the conductive film 772.

Note that projections and depressions are provided in part of the planarization insulating film 770 in the pixel portion 702 of the display panel 700 in FIG. 24. For example, the projections and depressions can be formed in the following manner: the planarization insulating film 770 is formed using a resin film, and projections and depressions are formed on the surface of the resin film. The conductive film 772 functioning as a reflective electrode is formed along the projections and depressions. Accordingly, external light that is incident on the conductive film 772 can be diffusely reflected by the surface of the conductive film 772, whereby visibility can be improved.

Note that the display panel 700 is not limited to the example in FIG. 24, which illustrates a reflective color liquid crystal display panel, and may be a transmissive color liquid crystal display panel in which a conductive film that transmits visible light is used as the conductive film 772. In a transmissive color liquid crystal display panel, projections and depressions are not necessarily provided on the planarization insulating film 770.

Although not illustrated in FIG. 24, an alignment film may be provided on a side of the conductive film 772 in contact with the liquid crystal layer 776 and on a side of the conductive film 774 in contact with the liquid crystal layer 776. Although not illustrated in FIG. 24, an optical member (optical substrate) or the like, such as a polarizing member, a retardation member, or an anti-reflection member, may be provided as appropriate. For example, circular polarization may be obtained by using a polarizing substrate and a retardation substrate. In addition, a backlight, a sidelight, or the like may be used as a light source.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. These liquid crystal materials exhibit a cholesteric phase, a smectic phase, a cubic phase, a chiral nematic phase, an isotropic phase, or the like depending on conditions.

In the case where a horizontal electric field mode is employed, a liquid crystal exhibiting a blue phase for which an alignment film is unnecessary may be used. The blue phase is one of liquid crystal phases, which is generated just before a cholesteric phase changes into an isotropic phase when the temperature of a cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition containing a liquid crystal exhibiting a blue phase and a chiral material has a short response time and optical isotropy, which eliminates the need for an alignment process. An alignment film does not need to be provided, and thus, rubbing treatment is not necessary; accordingly, electrostatic discharge damage caused by the rubbing treatment can be prevented, and defects and damage of a liquid crystal display panel in the manufacturing process can be reduced. Moreover, the liquid crystal material that exhibits a blue phase has small viewing angle dependence.

In the case where a liquid crystal element is used as a display element, a twisted nematic (TN) mode, an in-plane switching (IPS) mode, a fringe field switching (FFS) mode, an axially symmetric aligned micro-cell (ASM) mode, an optical compensated birefringence (OCB) mode, a ferroelectric liquid crystal (FLC) mode, an anti-ferroelectric liquid crystal (AFLC) mode, or the like can be used.

Furthermore, a normally black liquid crystal display panel such as a vertical alignment (VA) mode transmissive liquid crystal display panel may also be used. There are some examples of a vertical alignment mode; for example, a multi-domain vertical alignment (MVA) mode, a patterned vertical alignment (PVA) mode, and an ASV mode, or the like can be employed.

<Structure Example of Display Panel Including Light-Emitting Element>

The display panel 700 illustrated in FIG. 25 includes a light-emitting element 782. The light-emitting element 782 includes a conductive film 784, an EL layer 786, and a conductive film 788. The display panel 700 illustrated in FIG. 25 can display an image by utilizing light emission from the EL layer 786 of the light-emitting element 782. Note that the EL layer 786 contains an organic compound or an inorganic compound such as a quantum dot.

Examples of materials that can be used for an organic compound include a fluorescent material and a phosphorescent material. Examples of materials that can be used for a quantum dot include a colloidal quantum dot material, an alloyed quantum dot material, a core-shell quantum dot material, and a core quantum dot material. A material containing elements belonging to Groups 12 and 16, elements belonging to Groups 13 and 15, or elements belonging to Groups 14 and 16, may be used. Alternatively, a quantum dot material containing an element such as cadmium (Cd), selenium (Se), zinc (Zn), sulfur (S), phosphorus (P), indium (In), tellurium (Te), lead (Pb), gallium (Ga), arsenic (As), or aluminum (Al) may be used.

The conductive film 784 is connected to a conductive film functioning as a source electrode or a drain electrode of the transistor 750. The conductive film 784 is formed over the planarization insulating film 770 and functions as a pixel electrode, that is, one electrode of the display element. A conductive film that transmits visible light or a conductive film that reflects visible light can be used as the conductive film 784. For example, a material containing an element selected from indium (In), zinc (Zn), and tin (Sn) may be used for the conductive film that transmits visible light. For example, a material containing aluminum or silver may be used for the conductive film that reflects visible light.

In the display panel 700 in FIG. 25, an insulating film 730 is provided over the planarization insulating film 770 and the conductive film 784. The insulating film 730 covers part of the conductive film 784. Note that the light-emitting element 782 has a top-emission structure. Thus, the conductive film 788 has a light-transmitting property and transmits light emitted from the EL layer 786. Although the top-emission structure is described as an example in this embodiment, the structure is not limited thereto. For example, a bottom-emission structure in which light is emitted to the conductive film 784 side or a dual-emission structure in which light is emitted to both the conductive film 784 side and the conductive film 788 side may also be employed.

The coloring film 736 is provided to overlap with the light-emitting element 782, and the light-blocking film 738 is provided in the lead wiring portion 711 and the source driver circuit portion 704 to overlap with the insulating film 730. The coloring film 736 and the light-blocking film 738 are covered with the insulating film 734. A space between the light-emitting element 782 and the insulating film 734 is filled with a sealing film 732. The structure of the display panel 700 is not limited to the example in FIG. 25, in which the coloring film 736 is provided. For example, a structure without the coloring film 736 may also be employed in the case where the EL layer 786 is formed by separate coloring.

Figure 26A:
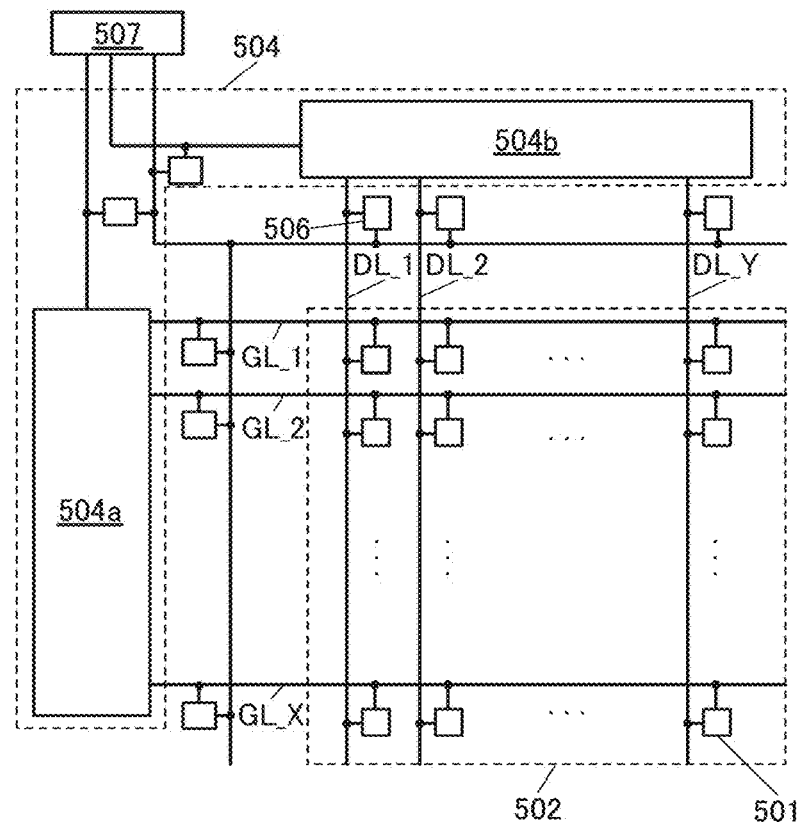
FIGS. 26A to 26C are a block diagram illustrating a display panel and circuit diagrams each illustrating a pixel.

FIG. 26A is an example of a block diagram illustrating a display panel which can be used in one embodiment of the present invention. The display panel includes a region including pixels of display elements (hereinafter referred to as a pixel portion 502), a circuit portion that is provided outside the pixel portion 502 and includes a circuit for driving the pixels (hereinafter, the circuit portion is referred to as a driver circuit portion 504), circuits having a function of protecting elements (hereinafter, the circuits are referred to as protection circuits 506), and a terminal portion 507. Note that the protection circuits 506 are not necessarily provided.

Part or the whole of the driver circuit portion 504 is preferably formed over a substrate over which the pixel portion 502 is formed. Thus, the number of components and the number of terminals can be reduced. When part or the whole of the driver circuit portion 504 is not formed over the substrate over which the pixel portion 502 is formed, the part or the whole of the driver circuit portion 504 can be mounted by COG or tape carrier package (TCP).

The pixel portion 502 includes a plurality of circuits for driving display elements arranged in X (X is a natural number of 2 or more) rows and Y (Y is a natural number of 2 or more) columns (hereinafter, the circuits are referred to as pixel circuits 501). The driver circuit portion 504 includes driver circuits such as a circuit for supplying a signal (scan signal) to select a pixel (hereinafter, the circuit is referred to as a gate driver 504a) and a circuit for supplying a signal (data signal) to drive a display element in a pixel (hereinafter, the circuit is referred to as a source driver 504b).

The gate driver 504a includes a shift register or the like. The gate driver 504a receives a signal for driving the shift register through the terminal portion 507 and outputs a signal. For example, the gate driver 504a receives a start pulse signal, a clock signal, or the like and outputs a pulse signal. The gate driver 504a has a function of controlling the potentials of wirings supplied with scan signals (hereinafter referred to as scan lines GL_1 to GL_X). Note that a plurality of gate drivers 504a may be provided to control the scan lines GL_1 to GL_X separately. Alternatively, the gate driver 504a has a function of supplying an initialization signal. Without being limited thereto, another signal can be supplied from the gate driver 504a.

The source driver 504b includes a shift register or the like. The source driver 504b receives a signal (image signal) from which a data signal is generated, as well as a signal for driving the shift register, through the terminal portion 507. The source driver 504b has a function of generating a data signal to be written to the pixel circuit 501 from the image signal. In addition, the source driver 504b has a function of controlling output of a data signal in response to a pulse signal produced by input of a start pulse signal, a clock signal, or the like. Furthermore, the source driver 504b has a function of controlling the potentials of wirings supplied with data signals (hereinafter referred to as data lines DL_1 to DL_Y). Alternatively, the source driver 504b has a function of supplying an initialization signal. Without being limited thereto, another signal can be supplied from the source driver 504b.

The source driver 504*b* includes a plurality of analog switches, for example. The source driver 504*b* can output, as data signals, time-divided image signals obtained by sequentially turning on the plurality of analog switches. The source driver 504*b* may include a shift register or the like.

A pulse signal and a data signal are input to each of the plurality of pixel circuits 501 through one of the plurality of scan lines GL supplied with scan signals and one of the plurality of data lines DL supplied with data signals, respectively. Writing and holding of the data signal in each of the plurality of pixel circuits 501 are controlled by the gate driver 504*a*. For example, to the pixel circuit 501 in the m-th row and the n-th column (m is a natural number of X or less, and n is a natural number of Y or less), a pulse signal is input from the gate driver 504*a* through the scan line GL_m, and a data signal is input from the source driver 504*b* through the data line DL_n in accordance with the potential of the scan line GL_m.

The protection circuit 506 in FIG. 26A is connected to, for example, the scan line GL between the gate driver 504*a* and the pixel circuit 501. Alternatively, the protection circuit 506 is connected to the data line DL between the source driver 504*b* and the pixel circuit 501. Alternatively, the protection circuit 506 can be connected to a wiring between the gate driver 504*a* and the terminal portion 507. Alternatively, the protection circuit 506 can be connected to a wiring between the source driver 504*b* and the terminal portion 507. Note that the terminal portion 507 refers to a portion having terminals for inputting power, control signals, and image signals from external circuits to the display panel.

The protection circuit 506 electrically connects a wiring connected to the protection circuit to another wiring when a potential out of a certain range is supplied to the wiring connected to the protection circuit.

As illustrated in FIG. 26A, the protection circuits 506 provided for the pixel portion 502 and the driver circuit portion 504 can improve the resistance of the display device to overcurrent generated by electrostatic discharge (ESD) or the like. Note that the configuration of the protection circuits 506 is not limited thereto; for example, the protection circuit 506 can be connected to the gate driver 504*a* or the source driver 504*b*. Alternatively, the protection circuit 506 can be connected to the terminal portion 507.

One embodiment of the present invention is not limited to the example in FIG. 26A, in which the driver circuit portion 504 includes the gate driver 504*a* and the source driver 504*b*. For example, only the gate driver 504*a* may be formed, and a separately prepared substrate over which a source driver circuit is formed (e.g., a driver circuit board formed using a single-crystal semiconductor film or a polycrystalline semiconductor film) may be mounted.

Figure 26B:
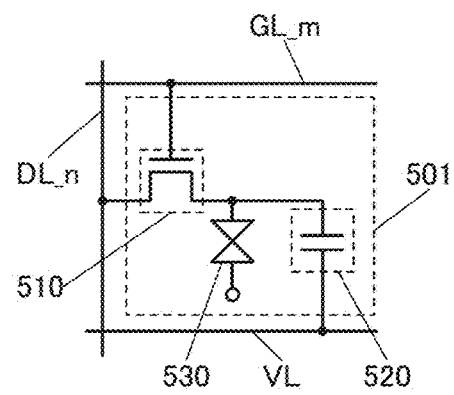

Each of the plurality of pixel circuits 501 in FIG. 26A can have the configuration illustrated in FIG. 26B, for example.

The pixel circuit 501 in FIG. 26B includes a liquid crystal element 530, a transistor 510, and a capacitor 520. The transistor 510 is preferably an OS transistor.

The potential of one of a pair of electrodes of the liquid crystal element 530 is set as appropriate in accordance with the specifications of the pixel circuit 501. The alignment state of the liquid crystal element 530 depends on data written thereto. A common potential may be supplied to the one of the pair of electrodes of the liquid crystal element 530 included in each of the plurality of pixel circuits 501. The potential supplied to the one of the pair of electrodes of the liquid crystal element 530 in the pixel circuit 501 may differ between rows.

In the pixel circuit 501 in the m-th row and the n-th column, one of a source electrode and a drain electrode of the transistor 510 is electrically connected to the data line DL_n, and the other of the source electrode and the drain electrode of the transistor 510 is electrically connected to the other of the pair of electrodes of the liquid crystal element 530. A gate electrode of the transistor 510 is electrically connected to the scan line GL_m. The transistor 510 is configured to be turned on or off to control whether a data signal is written.

One of a pair of electrodes of the capacitor 520 is electrically connected to a wiring through which a potential is supplied (hereinafter referred to as a potential supply line VL), and the other of the pair of electrodes of the capacitor 520 is electrically connected to the other of the pair of electrodes of the liquid crystal element 530. The potential of the potential supply line VL is set as appropriate in accordance with the specifications of the pixel circuit 501. The capacitor 520 functions as a storage capacitor for storing written data.

For example, in the display device including the pixel circuits 501 in FIG. 26B, the gate driver 504*a* in FIG. 26A sequentially selects the pixel circuits 501 row by row to turn on the transistors 550, and data signals are written.

When the transistor 550 is turned off, the pixel circuit 501 to which the data has been written is brought into a holding state. This operation is sequentially performed row by row; thus, an image can be displayed.

Figure 26C:
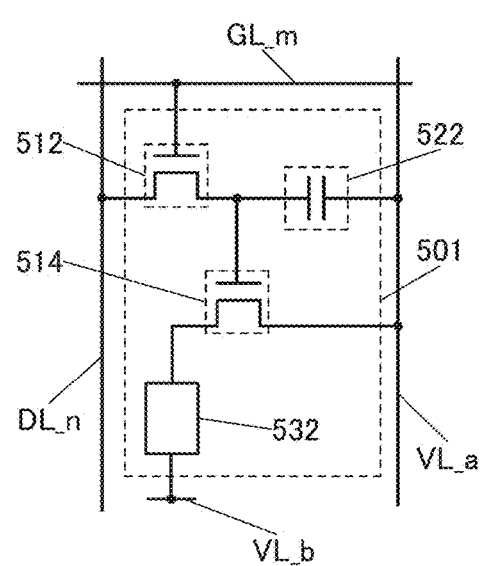

Alternatively, each of the plurality of pixel circuits 501 in FIG. 26A can have the configuration illustrated in FIG. 26C, for example.

The pixel circuit 501 in FIG. 26C includes transistors 512 and 514, a capacitor 522, and a light-emitting element 532. One or both of the transistors 512 and 514 are preferably OS transistors.

One of a source electrode and a drain electrode of the transistor 512 is electrically connected to a wiring through which a data signal is supplied (hereinafter referred to as a data line DL_n). A gate electrode of the transistor 512 is electrically connected to a wiring through which a gate signal is supplied (hereinafter referred to as a scan line GL_m).

The transistor 512 is configured to be turned on or off to control whether a data signal is written.

One of a pair of electrodes of the capacitor 522 is electrically connected to a wiring through which a potential is supplied (hereinafter referred to as a potential supply line VL_a), and the other of the pair of electrodes of the capacitor 522 is electrically connected to the other of the source electrode and the drain electrode of the transistor 512.

The capacitor 522 functions as a storage capacitor for storing written data.

One of a source electrode and a drain electrode of the transistor 514 is electrically connected to the potential supply line VL_a. A gate electrode of the transistor 514 is electrically connected to the other of the source electrode and the drain electrode of the transistor 512.

One of an anode and a cathode of the light-emitting element 532 is electrically connected to a potential supply line VL_b, and the other of the anode and the cathode of the light-emitting element 532 is electrically connected to the other of the source electrode and the drain electrode of the transistor 514.

As the light-emitting element 532, an organic electroluminescent element (also referred to as an organic EL element) can be used, for example. Note that the light-emitting element 532 is not limited thereto and may be an inorganic EL element including an inorganic material.

A high power supply potential VDD is supplied to one of the potential supply line VL_a and the potential supply line VL_b, and a low power supply potential VSS is supplied to the other of the potential supply line VL_a and the potential supply line VL_b.

In the display panel including the pixel circuits 501 in FIG. 26C, the gate driver 504a in FIG. 26A sequentially selects the pixel circuits 501 row by row to turn on the transistors 512, and data signals are written.

When the transistor 512 is turned off, the pixel circuit 501 to which the data has been written is brought into a holding state. Furthermore, the amount of current flowing between the source electrode and the drain electrode of the transistor 554 is controlled in accordance with the potential of the written data signal. The light-emitting element 572 emits light with a luminance corresponding to the amount of flowing current. This operation is sequentially performed row by row; thus, an image can be displayed.

Figure 27A:
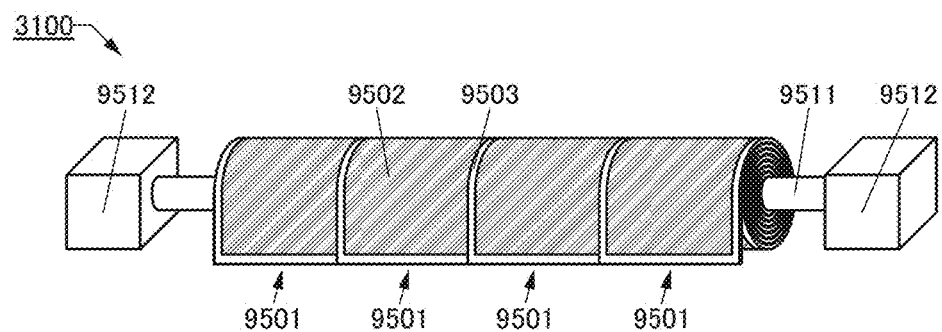
FIGS. 27A and 27B illustrate a display device including a plurality of display regions.
Figure 27B:
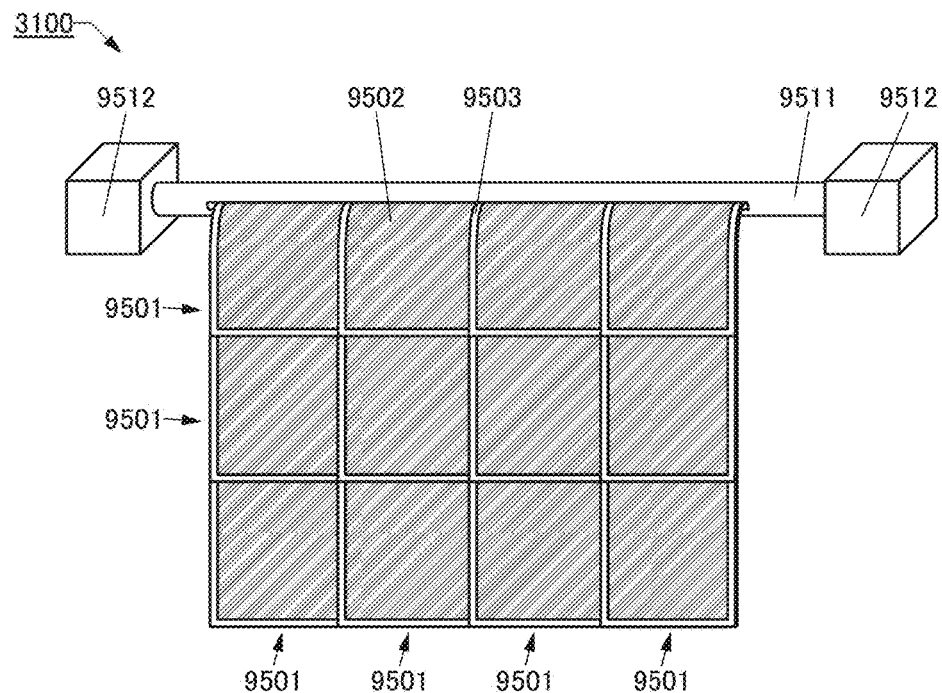

FIGS. 27A and 27B illustrate an example of the display device 3100 including the plurality of display panels described in Embodiment 1. Note that the plurality of display panels are wound in the perspective view in FIG. 27A and are unwound in the perspective view in FIG. 27B.

The display device 3100 illustrated in FIGS. 27A and 27B includes a plurality of display panels 9501, a hinge 9511, and a bearing 9512. The plurality of display panels 9501 each include a display region 9502 and a light-transmitting region 9503.

Each of the plurality of display panels 9501 is flexible. Two adjacent display panels 9501 are provided so as to partly overlap with each other. For example, the light-transmitting regions 9503 of the two adjacent display panels 9501 can overlap with each other. A display panel having a large screen can be obtained with the plurality of display panels 9501. The display panel is highly versatile because the display panels 9501 can be wound depending on its use.

Although the display regions 9502 of the adjacent display panels 9501 are separated from each other in FIGS. 27A and 27B, without limitation to this structure, the display regions 9502 of the adjacent display panels 9501 may overlap with each other without any space so that an apparently continuous display region 9502 is obtained, for example.

Since the display panels 9501 are flexible, organic EL elements are preferably included in the display regions 9502.

This embodiment can be implemented in appropriate combination with any of the structures described in the other embodiments.

Embodiment 5

In this embodiment, an OS transistor that can be used in one embodiment of the present invention is described with reference to drawings. In the drawings in this embodiment, some components are enlarged, reduced in size, or omitted for easy understanding.

Figure 28A:
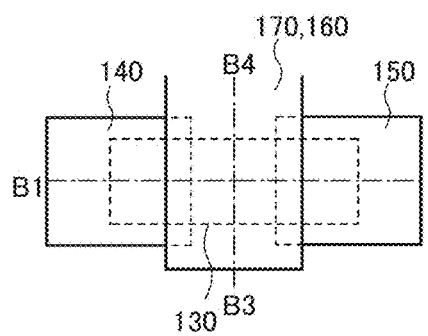
FIGS. 28A to 28F are top views and cross-sectional views illustrating transistors.
Figure 28B:
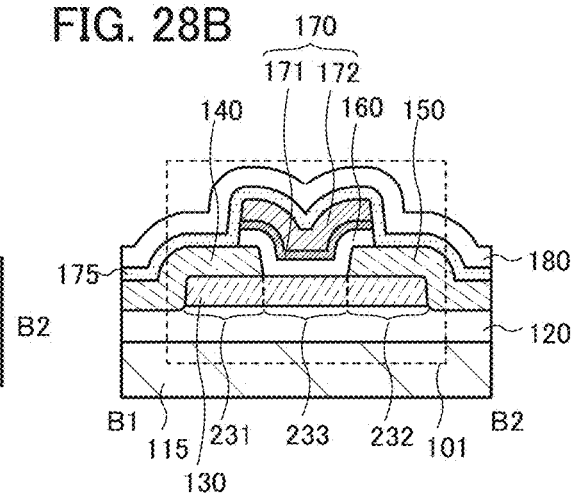
Figure 30A:
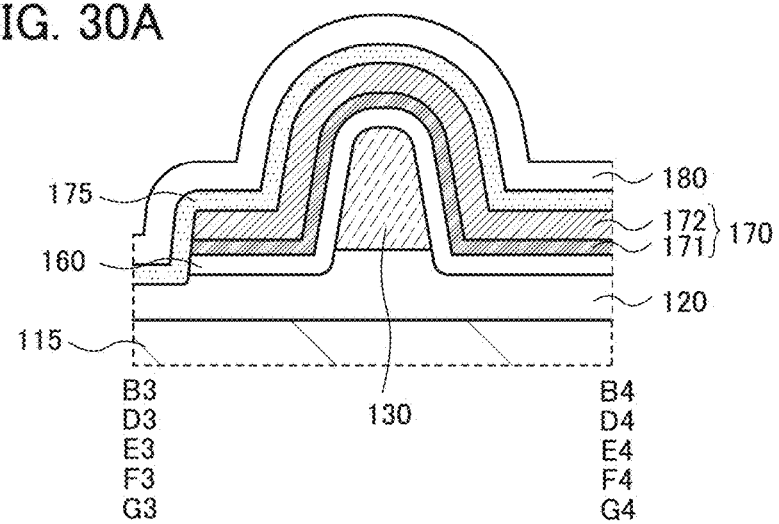
FIGS. 30A to 30D each illustrate a cross section of a transistor in a channel width direction.

FIGS. 28A and 28B are a top view and a cross-sectional view illustrating a transistor 101 of one embodiment of the present invention. FIG. 28A is the top view, and FIG. 28B illustrates a cross section in the direction of dashed-dotted line B1-B2 in FIG. 28A. A cross section in the direction of dashed-dotted line B3-B4 in FIG. 28A is illustrated in FIG. 30A. The direction of dashed-dotted line B1-B2 is referred to as a channel length direction, and the direction of dashed-dotted line B3-B4 is referred to as a channel width direction.

The transistor 101 includes an insulating layer 120 in contact with a substrate 115; an oxide semiconductor layer 130 in contact with the insulating layer 120; conductive layers 140 and 150 electrically connected to the oxide semiconductor layer 130; an insulating layer 160 in contact with the oxide semiconductor layer 130 and the conductive layers 140 and 150; a conductive layer 170 in contact with the insulating layer 160; an insulating layer 175 in contact with the conductive layers 140 and 150, the insulating layer 160, and the conductive layer 170; and an insulating layer 180 in contact with the insulating layer 175. The insulating layer 180 may function as a planarization film as necessary.

The conductive layer 140, the conductive layer 150, the insulating layer 160, and the conductive layer 170 can function as a source electrode layer, a drain electrode layer, a gate insulating film, and a gate electrode layer, respectively.

A region 231, a region 232, and a region 233 in FIG. 28B can function as a source region, a drain region, and a channel formation region, respectively. The region 231 and the region 232 are in contact with the conductive layer 140 and the conductive layer 150, respectively. When a conductive material that is easily bonded to oxygen is used for the conductive layers 140 and 150, the resistance of the regions 231 and 232 can be reduced.

Specifically, since the oxide semiconductor layer 130 is in contact with the conductive layers 140 and 150, an oxygen vacancy is generated in the oxide semiconductor layer 130, and interaction between the oxygen vacancy and hydrogen that remains in the oxide semiconductor layer 130 or diffuses into the oxide semiconductor layer 130 from the outside changes the regions 231 and 232 to n-type regions with low resistance.

Note that functions of a "source" and a "drain" of a transistor are sometimes interchanged with each other when a transistor of opposite polarity is used or when the direction of current flow is changed in a circuit operation, for example. Therefore, the terms "source" and "drain" can be interchanged with each other in this specification. In addition, the term "electrode layer" can be replaced with the term "wiring".

The conductive layer 170 includes two layers, a conductive layer 171 and a conductive layer 172, in the drawing, but also may be a single layer or a stack of three or more layers. The same applies to other transistors described in this embodiment.

Each of the conductive layers 140 and 150 is a single layer in the drawing, but also may be a stack of two or more layers. The same applies to other transistors described in this embodiment.

Figure 28C:
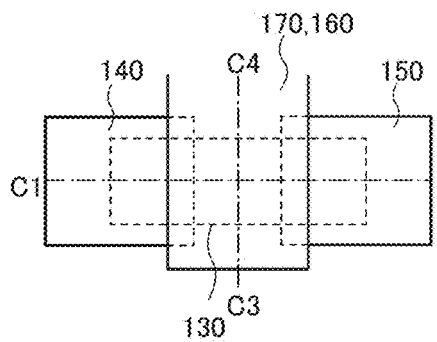
Figure 28D:
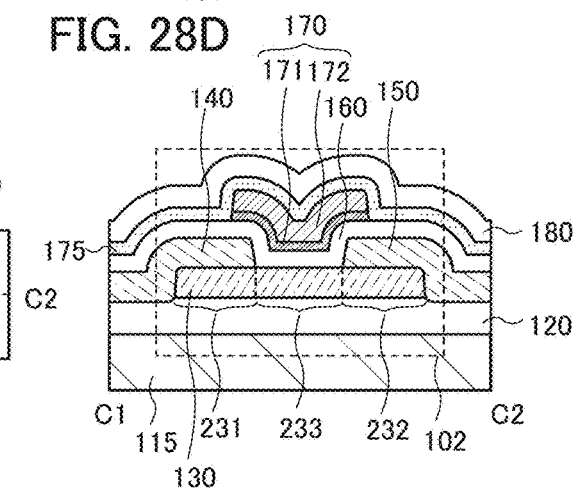
Figure 30B:
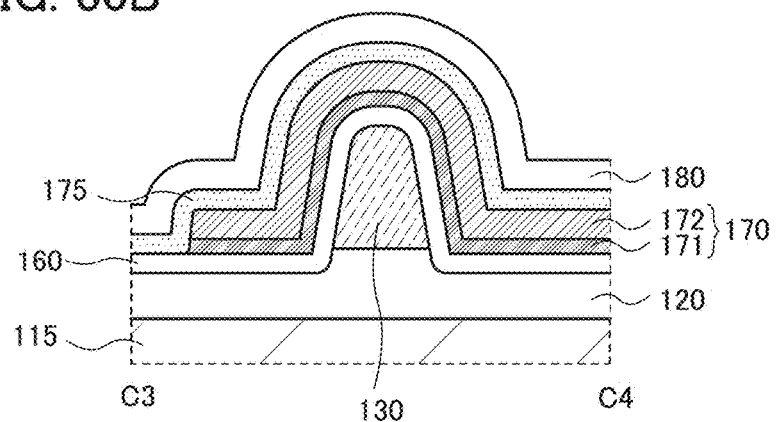

The transistor in one embodiment of the present invention may have a structure illustrated in FIGS. 28C and 28D. FIG. 28C is a top view of a transistor 102. A cross section in the direction of dashed-dotted line C1-C2 in FIG. 28C is illustrated in FIG. 28D. A cross section in the direction of dashed-dotted line C3-C4 in FIG. 28C is illustrated in FIG. 30B. The direction of dashed-dotted line C1-C2 is referred to as a channel length direction, and the direction of dashed-dotted line C3-C4 is referred to as a channel width direction.

The transistor 102 has the same structure as the transistor 101 except that an end portion of the insulating layer 160 functioning as a gate insulating film is not aligned with an end portion of the conductive layer 170 functioning as a gate electrode layer. In the transistor 102, wide areas of the conductive layers 140 and 150 are covered with the insulating layer 160 and accordingly the resistance between the conductive layer 170 and the conductive layers 140 and 150 is high; therefore, the transistor 102 has a feature of a low gate leakage current.

The transistors 101 and 102 each have a top-gate structure including a region where the conductive layer 170 overlaps with the conductive layers 140 and 150. To reduce parasitic capacitance, the width of the region in the channel length direction is preferably greater than or equal to 3 nm and less than 300 nm. Since an offset region is not formed in the oxide semiconductor layer 130 in this structure, a transistor with a high on-state current can be easily formed.

Figure 28E:
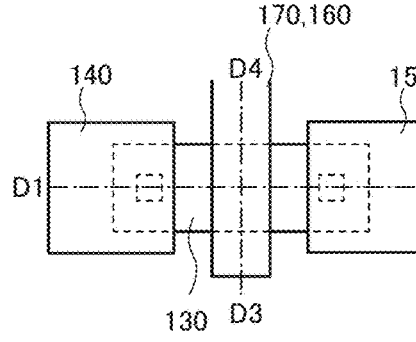
Figure 28F:
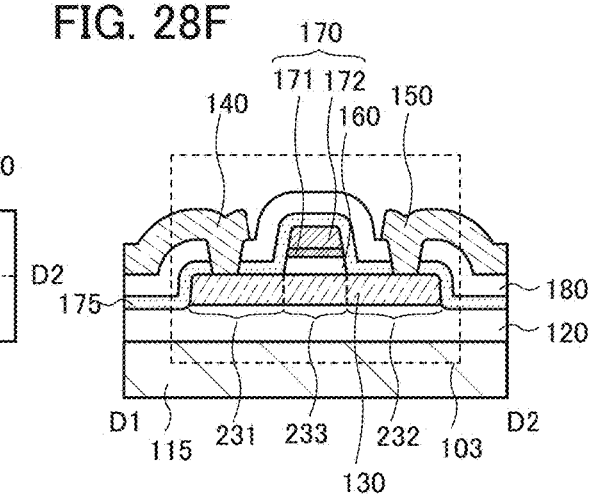

The transistor in one embodiment of the present invention may have a structure illustrated in FIGS. 28E and 28F. FIG. 28E is a top view of a transistor 103. A cross section in the direction of dashed-dotted line D1-D2 in FIG. 28E is illustrated in FIG. 28F. A cross section in the direction of dashed-dotted line D3-D4 in FIG. 28E is illustrated in FIG. 30A. The direction of dashed-dotted line D1-D2 is referred to as a channel length direction, and the direction of dashed-dotted line D3-D4 is referred to as a channel width direction.

The transistor 103 includes the insulating layer 120 in contact with the substrate 115; the oxide semiconductor layer 130 in contact with the insulating layer 120; the insulating layer 160 in contact with the oxide semiconductor layer 130; the conductive layer 170 in contact with the insulating layer 160; the insulating layer 175 covering the oxide semiconductor layer 130, the insulating layer 160, and the conductive layer 170; the insulating layer 180 in contact with the insulating layer 175; and the conductive layers 140 and 150 electrically connected to the oxide semiconductor layer 130 through openings provided in the insulating layers 175 and 180. The transistor 103 may further include, for example, an insulating layer (planarization film) in contact with the insulating layer 180 and the conductive layers 140 and 150 as necessary.

The conductive layer 140, the conductive layer 150, the insulating layer 160, and the conductive layer 170 can function as a source electrode layer, a drain electrode layer, a gate insulating film, and a gate electrode layer, respectively.

The region 231, the region 232, and the region 233 in FIG. 28F can function as a source region, a drain region, and a channel formation region, respectively. The regions 231 and 232 are in contact with the insulating layer 175. When an insulating material containing hydrogen is used for the insulating layer 175, for example, the resistance of the regions 231 and 232 can be reduced.

Specifically, interaction between an oxygen vacancy generated in the regions 231 and 232 by the steps up to formation of the insulating layer 175 and hydrogen that diffuses into the regions 231 and 232 from the insulating layer 175 changes the regions 231 and 232 to n-type regions with low resistance. As the insulating material containing hydrogen, for example, silicon nitride, aluminum nitride, or the like can be used.

The transistor in one embodiment of the present invention may have a structure illustrated in FIGS. 29A and 29B. FIG. 29A is a top view of a transistor 104. A cross section in the direction of dashed-dotted line E1-E2 in FIG. 29A is illustrated in FIG. 29B. A cross section in the direction of dashed-dotted line E3-E4 in FIG. 29A is illustrated in FIG. 30A. The direction of dashed-dotted line E1-E2 is referred to as a channel length direction, and the direction of dashed-dotted line E3-E4 is referred to as a channel width direction.

The transistor 104 has the same structure as the transistor 103 except that the conductive layers 140 and 150 are in contact with the oxide semiconductor layer 130 so as to cover end portions of the oxide semiconductor layer 130.

In FIG. 29B, regions 331 and 334 can function as a source region, regions 332 and 335 can function as a drain region, and a region 333 can function as a channel formation region.

The resistance of the regions 331 and 332 can be reduced in a manner similar to that of the regions 231 and 232 in the transistor 101.

The resistance of the regions 334 and 335 can be reduced in a manner similar to that of the regions 231 and 232 in the transistor 103. In the case where the length of the regions 334 and 335 in the channel length direction is less than or equal to 100 nm, preferably less than or equal to 50 nm, a gate electric field prevents a significant decrease in on-state current. Therefore, a reduction in resistance of the regions 334 and 335 is not performed in some cases.

The transistors 103 and 104 each have a self-aligned structure that does not include a region where the conductive layer 170 overlaps with the conductive layers 140 and 150. A transistor with a self-aligned structure, which has extremely low parasitic capacitance between a gate electrode layer and source and drain electrode layers, is suitable for applications that require high-speed operation.

The transistor in one embodiment of the present invention may have a structure illustrated in FIGS. 29C and 29D. FIG. 29C is a top view of a transistor 105. A cross section in the direction of dashed-dotted line F1-F2 in FIG. 29C is illustrated in FIG. 29D. A cross section in the direction of dashed-dotted line F3-F4 in FIG. 29C is illustrated in FIG. 30A. The direction of dashed-dotted line F1-F2 is referred to as a channel length direction, and the direction of dashed-dotted line F3-F4 is referred to as a channel width direction.

The transistor 105 includes the insulating layer 120 in contact with the substrate 115; the oxide semiconductor layer 130 in contact with the insulating layer 120; conductive layers 141 and 151 electrically connected to the oxide semiconductor layer 130; the insulating layer 160 in contact with the oxide semiconductor layer 130 and the conductive layers 141 and 151; the conductive layer 170 in contact with the insulating layer 160; the insulating layer 175 in contact with the insulating layer 120, the oxide semiconductor layer 130, the conductive layers 141 and 151, the insulating layer 160, and the conductive layer 170; the insulating layer 180 in contact with the insulating layer 175; and conductive layers 142 and 152 electrically connected to the conductive layers 141 and 151, respectively, through openings provided in the insulating layers 175 and 180. The transistor 105 may further include, for example, an insulating layer in contact with the insulating layer 180 and the conductive layers 142 and 152 as necessary.

The conductive layers 141 and 151 are in contact with the top surface of the oxide semiconductor layer 130 and are not in contact with side surfaces of the oxide semiconductor layer 130.

The transistor 105 has the same structure as the transistor 101 except that the conductive layers 141 and 151 are provided, that the openings are provided in the insulating layers 175 and 180, and that the conductive layers 142 and 152 electrically connected to the conductive layers 141 and 151, respectively, through the openings are provided. The conductive layer 140 (the conductive layers 141 and 142) can function as a source electrode layer, and the conductive layer 150 (the conductive layers 151 and 152) can function as a drain electrode layer.

The transistor in one embodiment of the present invention may have a structure illustrated in FIGS. 29E and 29F. FIG. 29E is a top view of a transistor 106. A cross section in the direction of dashed-dotted line G1-G2 in FIG. 29E is illustrated in FIG. 29F. A cross section in the direction of dashed-dotted line G3-G4 in FIG. 29E is illustrated in FIG. 30A. The direction of dashed-dotted line G1-G2 is referred to as a channel length direction, and the direction of dashed-dotted line G3-G4 is referred to as a channel width direction.

The transistor 106 includes the insulating layer 120 in contact with the substrate 115; the oxide semiconductor layer 130 in contact with the insulating layer 120; the conductive layers 141 and 151 electrically connected to the oxide semiconductor layer 130; the insulating layer 160 in contact with the oxide semiconductor layer 130; the conductive layer 170 in contact with the insulating layer 160; the insulating layer 175 in contact with the insulating layer 120, the oxide semiconductor layer 130, the conductive layers 141 and 151, the insulating layer 160, and the conductive layer 170; the insulating layer 180 in contact with the insulating layer 175; and the conductive layers 142 and 152 electrically connected to the conductive layers 141 and 151, respectively, through openings provided in the insulating layers 175 and 180. The transistor 106 may further include, for example, an insulating layer (planarization film) in contact with the insulating layer 180 and the conductive layers 142 and 152 as necessary.

The conductive layers 141 and 151 are in contact with the top surface of the oxide semiconductor layer 130 and are not in contact with side surfaces of the oxide semiconductor layer 130.

The transistor 106 has the same structure as the transistor 103 except that the conductive layers 141 and 151 are provided. The conductive layer 140 (the conductive layers 141 and 142) can function as a source electrode layer, and the conductive layer 150 (the conductive layers 151 and 152) can function as a drain electrode layer.

In the structures of the transistors 105 and 106, the conductive layers 140 and 150 are not in contact with the insulating layer 120. These structures make the insulating layer 120 less likely to be deprived of oxygen by the conductive layers 140 and 150 and facilitate oxygen supply from the insulating layer 120 to the oxide semiconductor layer 130.

An impurity for forming an oxygen vacancy to increase conductivity may be added to the regions 231 and 232 in the transistor 103 and the regions 334 and 335 in the transistors 104 and 106. As an impurity for forming an oxygen vacancy in an oxide semiconductor layer, for example, one or more of the following can be used: phosphorus, arsenic, antimony, boron, aluminum, silicon, nitrogen, helium, neon, argon, krypton, xenon, indium, fluorine, chlorine, titanium, zinc, and carbon. As a method for adding the impurity, plasma treatment, ion implantation, ion doping, plasma immersion ion implantation, or the like can be used.

When the above element is added as an impurity element to the oxide semiconductor layer, a bond between a metal element and oxygen in the oxide semiconductor layer is cut, so that an oxygen vacancy is formed. Interaction between an oxygen vacancy in the oxide semiconductor layer and hydrogen that remains in the oxide semiconductor layer or is added to the oxide semiconductor layer later can increase the conductivity of the oxide semiconductor layer.

When hydrogen is added to an oxide semiconductor in which an oxygen vacancy is formed by addition of an impurity element, hydrogen enters an oxygen vacant site and forms a donor level in the vicinity of the conduction band. Consequently, an oxide conductor can be formed. Here, an oxide conductor refers to an oxide semiconductor having become a conductor. Note that the oxide conductor has a light-transmitting property like the oxide semiconductor.

The oxide conductor is a degenerated semiconductor and it is suggested that the conduction band edge equals or substantially equals the Fermi level. For that reason, an ohmic contact is made between an oxide conductor layer and conductive layers functioning as a source electrode layer and a drain electrode layer; thus, contact resistance between the oxide conductor layer and the conductive layers functioning as a source electrode layer and a drain electrode layer can be reduced.

Figure 30C:
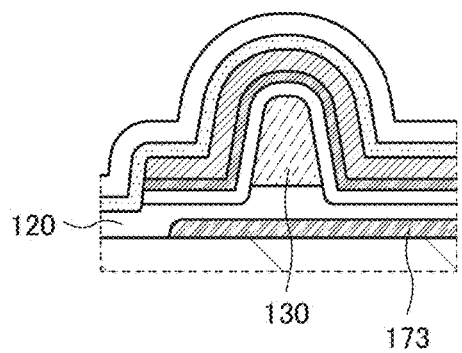
Figure 30D:
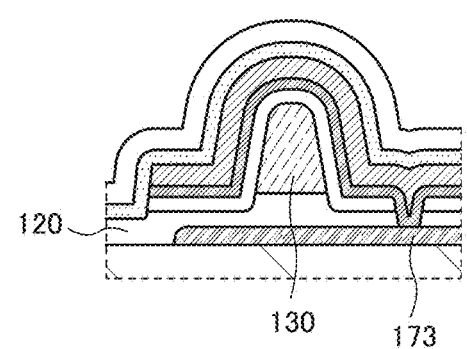
Figure 31A:
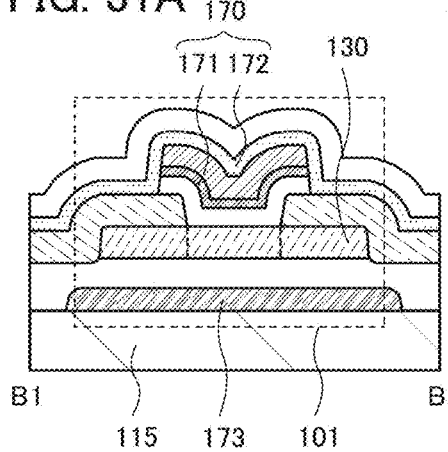
FIGS. 31A to 31F each illustrate a cross section of a transistor in a channel length direction.
Figure 31B:
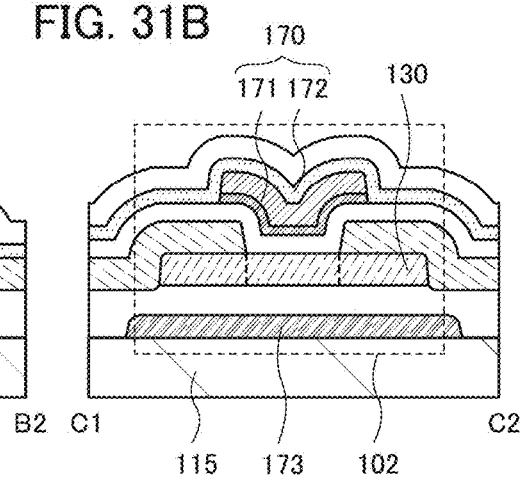
Figure 31C:
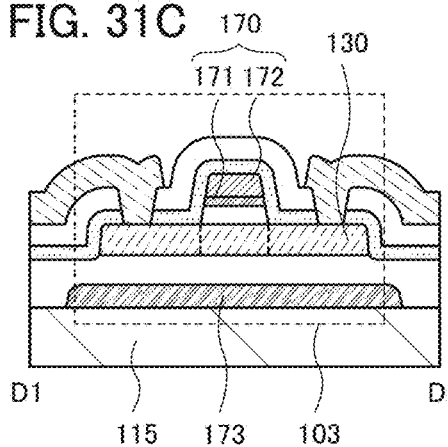
Figure 31D:
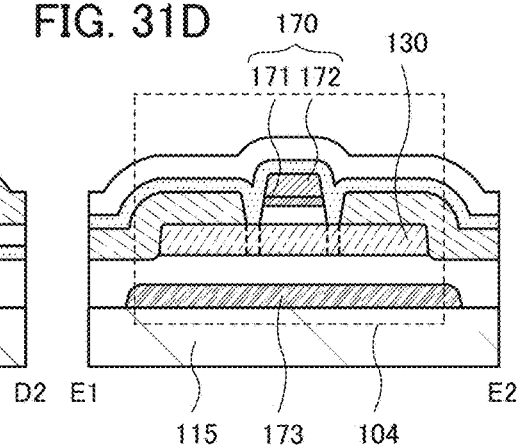
Figure 31E:
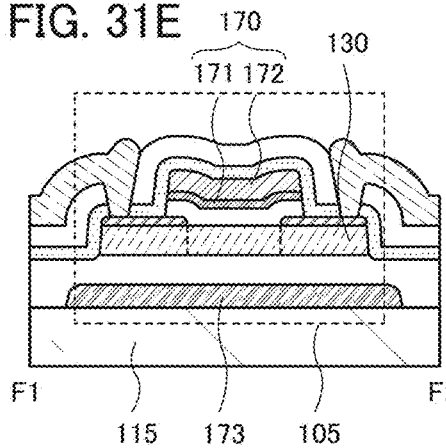
Figure 31F:
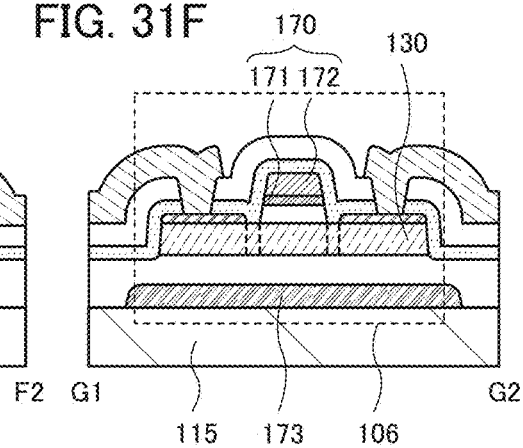

The transistor in one embodiment of the present invention may include the conductive layer 173 between the oxide semiconductor layer 130 and the substrate 115 as illustrated in cross-sectional views in the channel length direction in FIGS. 31A to 31F and cross-sectional views in the channel width direction in FIGS. 30C and 30D. When the conductive layer is used as a second gate electrode layer (back gate), the on-state current can be increased or the threshold voltage can be controlled. In the cross-sectional views in FIGS. 31A to 31F, the width of the conductive layer 173 may be shorter than that of the oxide semiconductor layer 130. Moreover, the width of the conductive layer 173 may be shorter than that of the conductive layer 170.

In order to increase the on-state current, for example, the conductive layers 170 and 173 are made to have the same potential, and the transistor is driven as a double-gate transistor. Furthermore, in order to control the threshold voltage, a fixed potential that is different from the potential of the conductive layer 170 is applied to the conductive layer 173. To set the conductive layers 170 and 173 at the same potential, for example, as illustrated in FIG. 30D, the conductive layers 170 and 173 may be electrically connected to each other through a contact hole.

Although the transistors 101 to 106 in FIGS. 28A to 28F and FIGS. 29A to 29F are examples in which the oxide semiconductor layer 130 is a single layer, the oxide semiconductor layer 130 may be a stacked layer. The oxide semiconductor layer 130 in the transistors 101 to 106 can be replaced with the oxide semiconductor layer 130 in FIGS. 32B and 32C or FIGS. 32D and 32E.

Figure 32A:
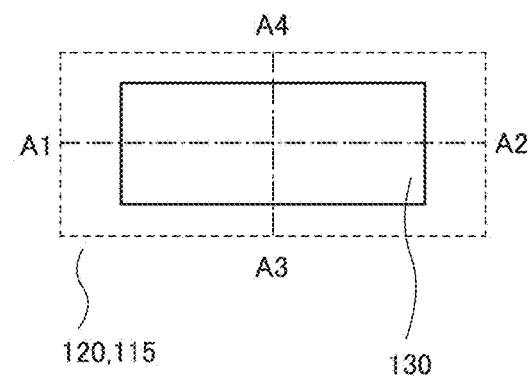
FIGS. 32A to 32E are a top view and cross-sectional views illustrating semiconductor layers.
Figure 32B:
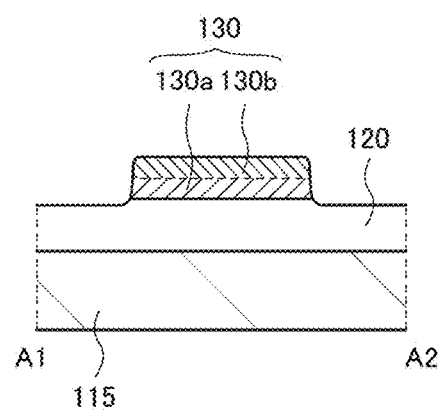
Figure 32D:
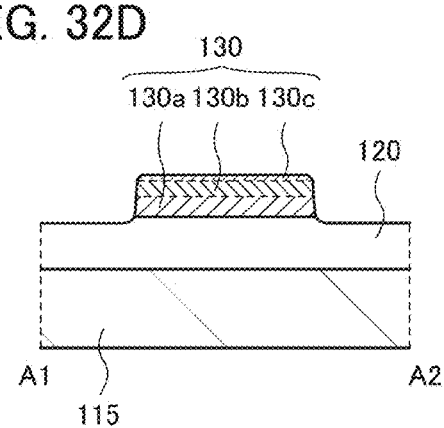
Figure 32C:
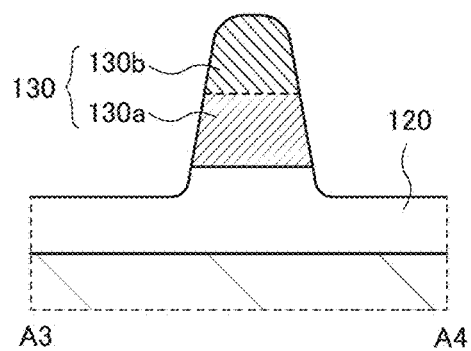
Figure 32E:
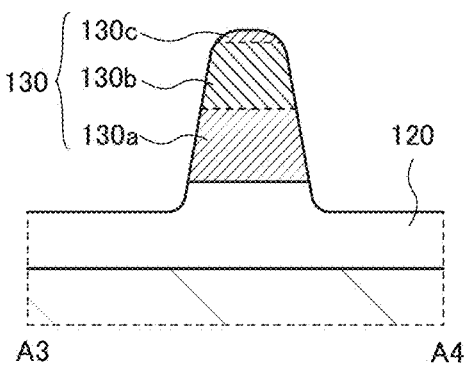

FIG. 32A is a top view of the oxide semiconductor layer 130, and FIGS. 32B and 32C are cross-sectional views of the oxide semiconductor layer 130 with a two-layer structure. FIGS. 32D and 32E are cross-sectional views of the oxide semiconductor layer 130 with a three-layer structure.

Oxide semiconductor layers with different compositions, for example, can be used as an oxide semiconductor layer 130a, an oxide semiconductor layer 130b, and an oxide semiconductor layer 130c.

Figure 33A:
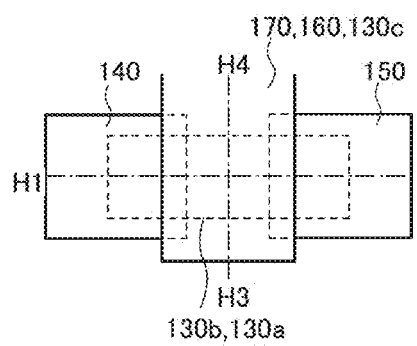
FIGS. 33A to 33F are top views and cross-sectional views illustrating transistors.
Figure 33B:
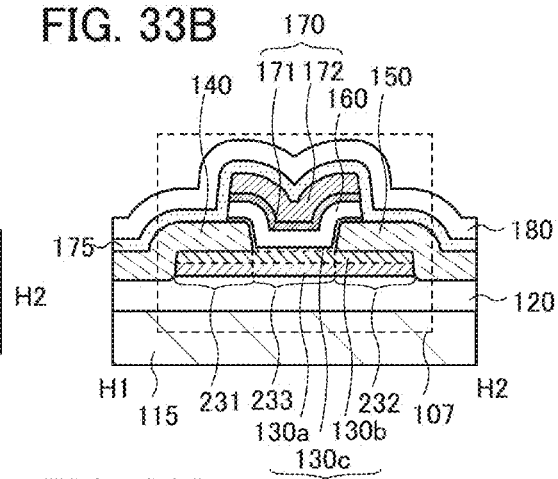
Figure 35A:
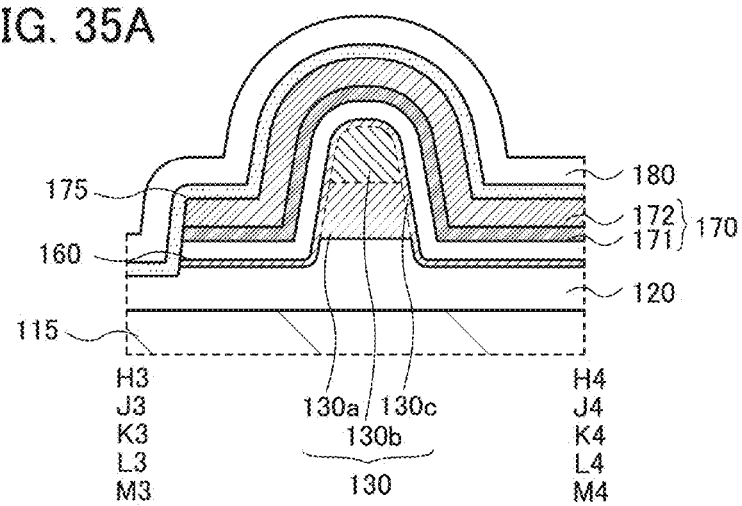
FIGS. 35A to 35D each illustrate a cross section of a transistor in a channel width direction.

The transistor in one embodiment of the present invention may have a structure illustrated in FIGS. 33A and 33B. FIG. 33A is a top view of a transistor 107. A cross section in the direction of dashed-dotted line H1-H2 in FIG. 33A is illustrated in FIG. 33B. A cross section in the direction of dashed-dotted line H3-H4 in FIG. 33A is illustrated in FIG. 35A. The direction of dashed-dotted line H1-H2 is referred to as a channel length direction, and the direction of dashed-dotted line H3-H4 is referred to as a channel width direction.

The transistor 107 includes the insulating layer 120 in contact with the substrate 115; a stack of the oxide semiconductor layers 130a and 130b in contact with the insulating layer 120; the conductive layers 140 and 150 electrically connected to the stack; the oxide semiconductor layer 130c in contact with the stack and the conductive layers 140 and 150; the insulating layer 160 in contact with the oxide semiconductor layer 130c; the conductive layer 170 in contact with the insulating layer 160; the insulating layer 175 in contact with the conductive layers 140 and 150, the oxide semiconductor layer 130*c*, the insulating layer 160, and the conductive layer 170; and the insulating layer 180 in contact with the insulating layer 175. The insulating layer 180 may function as a planarization film as necessary.

The transistor 107 has the same structure as the transistor 101 except that the oxide semiconductor layer 130 includes two layers (the oxide semiconductor layers 130*a* and 130*b*) in the regions 231 and 232, that the oxide semiconductor layer 130 includes three layers (the oxide semiconductor layers 130*a* to 130*c*) in the region 233, and that part of the oxide semiconductor layer (the oxide semiconductor layer 130*c*) exists between the insulating layer 160 and the conductive layers 140 and 150.

Figure 33C:
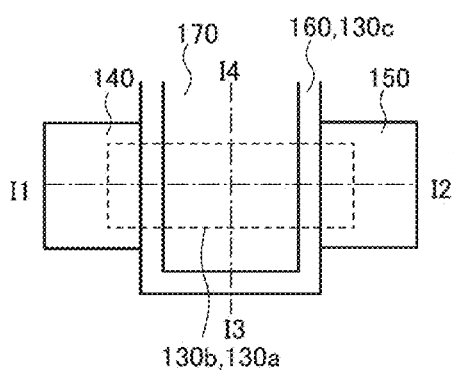
Figure 33D:
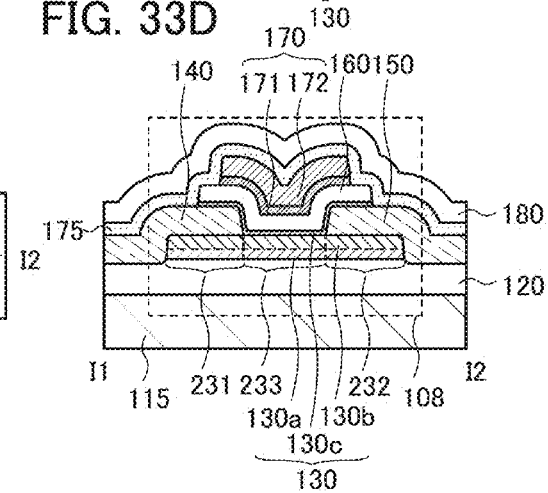
Figure 35B:
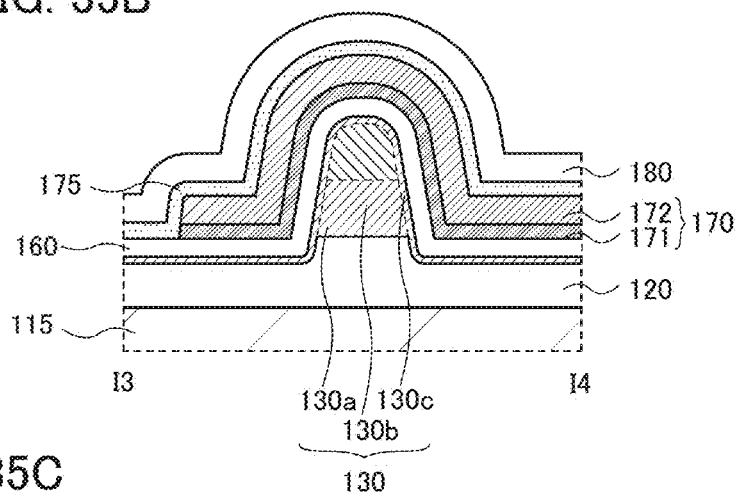

The transistor in one embodiment of the present invention may have a structure illustrated in FIGS. 33C and 33D. FIG. 33C is a top view of a transistor 108. A cross section in the direction of dashed-dotted line I1-I2 in FIG. 33C is illustrated in FIG. 33D. A cross section in the direction of dashed-dotted line I3-I4 in FIG. 33C is illustrated in FIG. 35B. The direction of dashed-dotted line I1-I2 is referred to as a channel length direction, and the direction of dashed-dotted line I3-I4 is referred to as a channel width direction.

The transistor 108 differs from the transistor 107 in that end portions of the insulating layer 160 and the oxide semiconductor layer 130*c* are not aligned with the end portion of the conductive layer 170.

Figure 33E:
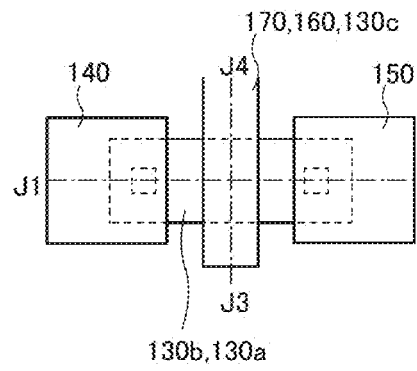
Figure 33F:
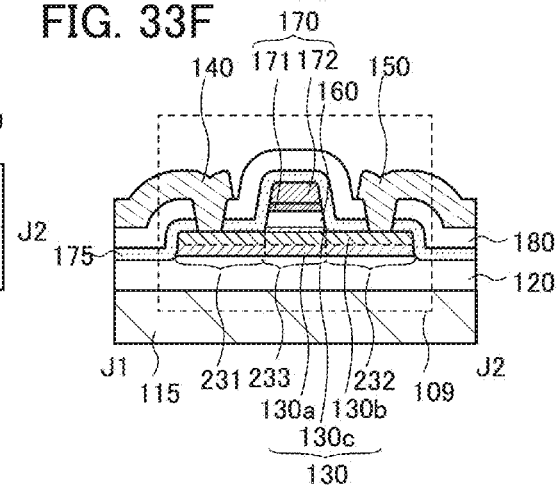

The transistor in one embodiment of the present invention may have a structure illustrated in FIGS. 33E and 33F. FIG. 33E is a top view of a transistor 109. A cross section in the direction of dashed-dotted line J1-J2 in FIG. 33E is illustrated in FIG. 33F. A cross section in the direction of dashed-dotted line J3-J4 in FIG. 33E is illustrated in FIG. 35A. The direction of dashed-dotted line J1-J2 is referred to as a channel length direction, and the direction of dashed-dotted line J3-J4 is referred to as a channel width direction.

The transistor 109 includes the insulating layer 120 in contact with the substrate 115; a stack of the oxide semiconductor layers 130*a* and 130*b* in contact with the insulating layer 120; the oxide semiconductor layer 130*c* in contact with the stack; the insulating layer 160 in contact with the oxide semiconductor layer 130*c*; the conductive layer 170 in contact with the insulating layer 160; the insulating layer 175 covering the stack, the oxide semiconductor layer 130*c*, the insulating layer 160, and the conductive layer 170; the insulating layer 180 in contact with the insulating layer 175; and the conductive layers 140 and 150 electrically connected to the stack through openings provided in the insulating layers 175 and 180. The transistor 109 may further include, for example, an insulating layer (planarization film) in contact with the insulating layer 180 and the conductive layers 140 and 150 as necessary.

The transistor 109 has the same structure as the transistor 103 except that the oxide semiconductor layer 130 includes two layers (the oxide semiconductor layers 130*a* and 130*b*) in the regions 231 and 232 and that the oxide semiconductor layer 130 includes three layers (the oxide semiconductor layers 130*a* to 130*c*) in the region 233.

Figure 34A:
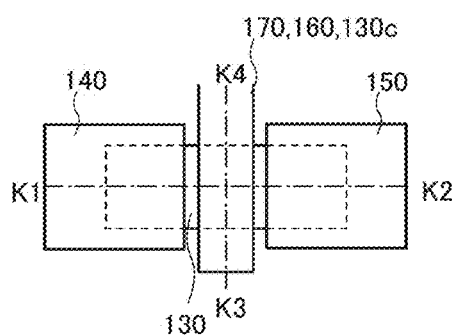
FIGS. 34A to 34F are top views and cross-sectional views illustrating transistors.
Figure 34B:
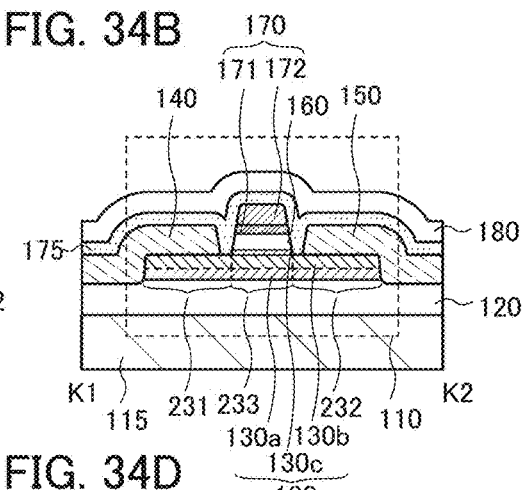

The transistor in one embodiment of the present invention may have a structure illustrated in FIGS. 34A and 34B. FIG. 34A is a top view of a transistor 110. A cross section in the direction of dashed-dotted line K1-K2 in FIG. 34A is illustrated in FIG. 34B. A cross section in the direction of dashed-dotted line K3-K4 in FIG. 34A is illustrated in FIG. 35A. The direction of dashed-dotted line K1-K2 is referred to as a channel length direction, and the direction of dashed-dotted line K3-K4 is referred to as a channel width direction.

The transistor 110 has the same structure as the transistor 104 except that the oxide semiconductor layer 130 includes two layers (the oxide semiconductor layers 130*a* and 130*b*) in the regions 231 and 232 and that the oxide semiconductor layer 130 includes three layers (the oxide semiconductor layers 130*a* to 130*c*) in the region 233.

Figure 34C:
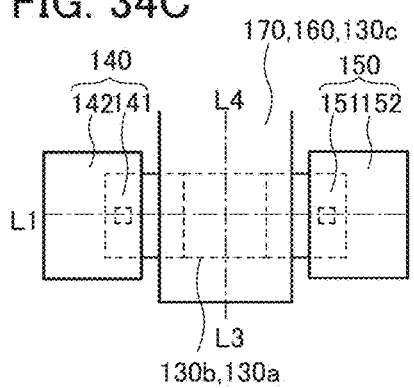
Figure 34D:
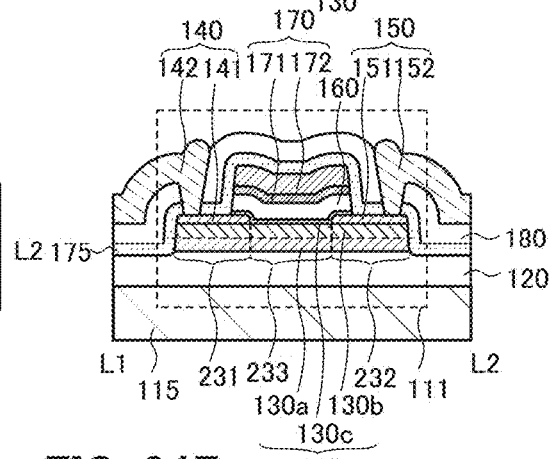

The transistor in one embodiment of the present invention may have a structure illustrated in FIGS. 34C and 34D. FIG. 34C is a top view of a transistor 111. A cross section in the direction of dashed-dotted line L1-L2 in FIG. 34C is illustrated in FIG. 34D. A cross section in the direction of dashed-dotted line L3-L4 in FIG. 34C is illustrated in FIG. 35A. The direction of dashed-dotted line L1-L2 is referred to as a channel length direction, and the direction of dashed-dotted line L3-L4 is referred to as a channel width direction.

The transistor 111 includes the insulating layer 120 in contact with the substrate 115; a stack of the oxide semiconductor layers 130*a* and 130*b* in contact with the insulating layer 120; the conductive layers 141 and 151 electrically connected to the stack; the oxide semiconductor layer 130*c* in contact with the stack and the conductive layers 141 and 151; the insulating layer 160 in contact with the oxide semiconductor layer 130*c*; the conductive layer 170 in contact with the insulating layer 160; the insulating layer 175 in contact with the stack, the conductive layers 141 and 151, the oxide semiconductor layer 130*c*, the insulating layer 160, and the conductive layer 170; the insulating layer 180 in contact with the insulating layer 175; and the conductive layers 142 and 152 electrically connected to the conductive layers 141 and 151, respectively, through openings provided in the insulating layers 175 and 180. The transistor 111 may further include, for example, an insulating layer (planarization film) in contact with the insulating layer 180 and the conductive layers 142 and 152 as necessary.

The transistor 111 has the same structure as the transistor 105 except that the oxide semiconductor layer 130 includes two layers (the oxide semiconductor layers 130*a* and 130*b*) in the regions 231 and 232, that the oxide semiconductor layer 130 includes three layers (the oxide semiconductor layers 130*a* to 130*c*) in the region 233, and that part of the oxide semiconductor layer (the oxide semiconductor layer 130*c*) exists between the insulating layer 160 and the conductive layers 141 and 151.

Figure 34E:
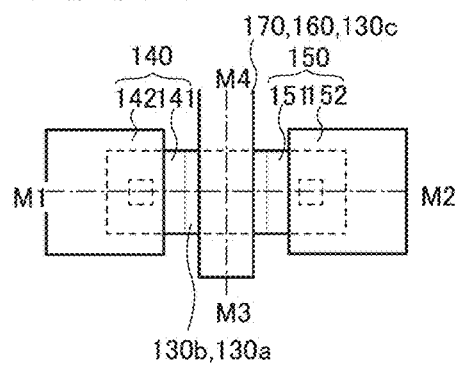
Figure 34F:
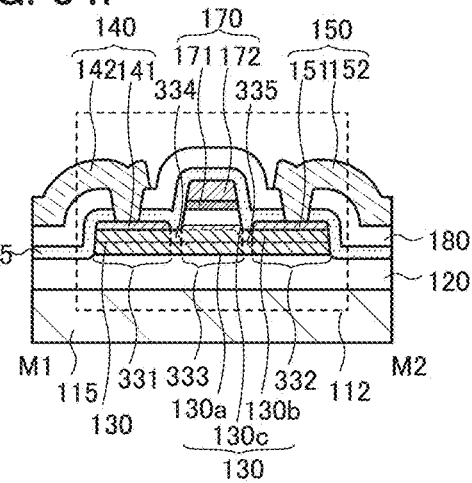

The transistor in one embodiment of the present invention may have a structure illustrated in FIGS. 34E and 34F. FIG. 34E is a top view of a transistor 112. A cross section in the direction of dashed-dotted line M1-M2 in FIG. 34E is illustrated in FIG. 34F. A cross section in the direction of dashed-dotted line M3-M4 in FIG. 34E is illustrated in FIG. 35A. The direction of dashed-dotted line M1-M2 is referred to as a channel length direction, and the direction of dashed-dotted line M3-M4 is referred to as a channel width direction.

The transistor 112 has the same structure as the transistor 106 except that the oxide semiconductor layer 130 includes two layers (the oxide semiconductor layers 130*a* and 130*b*) in the regions 331, 332, 334, and 335 and that the oxide semiconductor layer 130 includes three layers (the oxide semiconductor layers 130*a* to 130*c*) in the region 333.

Figure 35C:
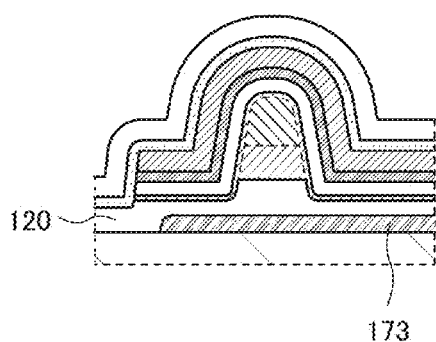
Figure 35D:
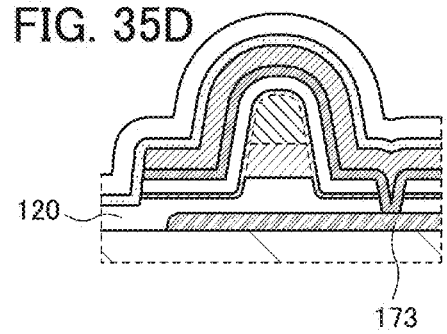

The transistor in one embodiment of the present invention may include the conductive layer 173 between the oxide semiconductor layer 130 and the substrate 115 as illustrated in cross-sectional views in the channel length direction in FIGS. 36A to 36F and cross-sectional views in the channel width direction in FIGS. 35C and 35D. When the conductive layer is used as a second gate electrode layer (back gate), the on-state current can be increased or the threshold voltage can be controlled. In the cross-sectional views in FIGS. 36A to 36F, the width of the conductive layer 173 may be shorter than that of the oxide semiconductor layer 130. Moreover, the width of the conductive layer 173 may be shorter than that of the conductive layer 170.

Figure 37A:
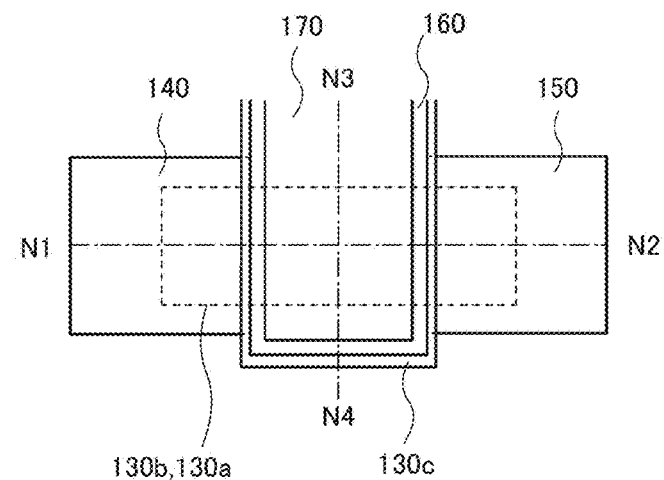
FIGS. 37A and 37B are a top view and a cross-sectional view illustrating a transistor.
Figure 37B:
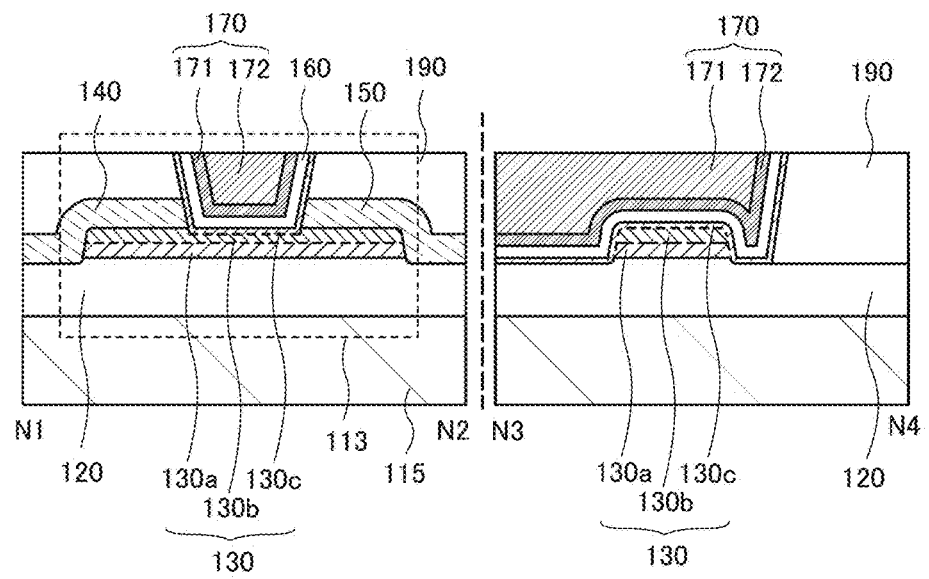

The transistor in one embodiment of the present invention may have a structure illustrated in FIGS. 37A and 37B. FIG. 37A is a top view and FIG. 37B is a cross-sectional view taken along dashed-dotted line N1-N2 and dashed-dotted line N3-N4 in FIG. 37A. Note that for simplification of the drawing, some components are not illustrated in the top view in FIG. 37A.

A transistor 113 illustrated in FIGS. 37A and 37B includes the substrate 115, the insulating layer 120 over the substrate 115, the oxide semiconductor layer 130 (the oxide semiconductor layer 130a, the oxide semiconductor layer 130b, and the oxide semiconductor layer 130c) over the insulating layer 120, the conductive layers 140 and 150 that are in contact with the oxide semiconductor layer 130 and are apart from each other, the insulating layer 160 in contact with the oxide semiconductor layer 130c, and the conductive layer 170 in contact with the insulating layer 160. Note that the oxide semiconductor layer 130c, the insulating layer 160, and the conductive layer 170 are provided in an opening that is provided in an insulating layer 190 over the transistor 113 and reaches the oxide semiconductor layers 130a and 130b and the insulating layer 120.

The transistor 113 has a smaller region in which a conductor serving as a source or a drain overlaps with a conductor serving as a gate electrode than the other transistors described above; thus, the parasitic capacitance in the transistor 113 can be reduced. Therefore, the transistor 113 is preferable as a component of a circuit for which high-speed operation is needed. As illustrated in FIG. 37B, a top surface of the transistor 113 is preferably planarized by a chemical mechanical polishing (CMP) method or the like, but is not necessarily planarized.

Figure 38A:
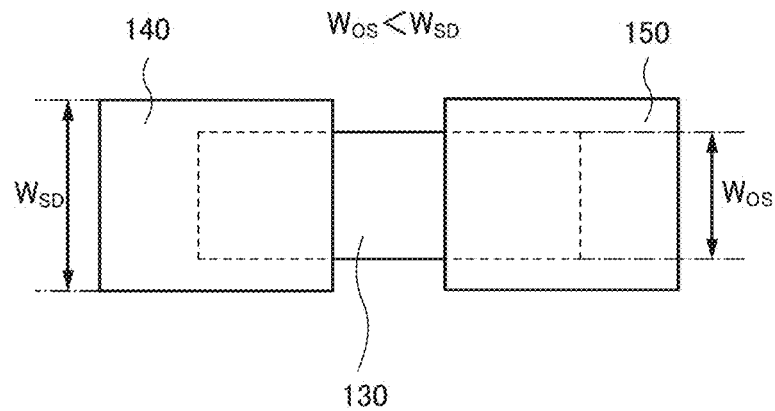
FIGS. 38A to 38C are top views each illustrating a transistor.
Figure 38B:
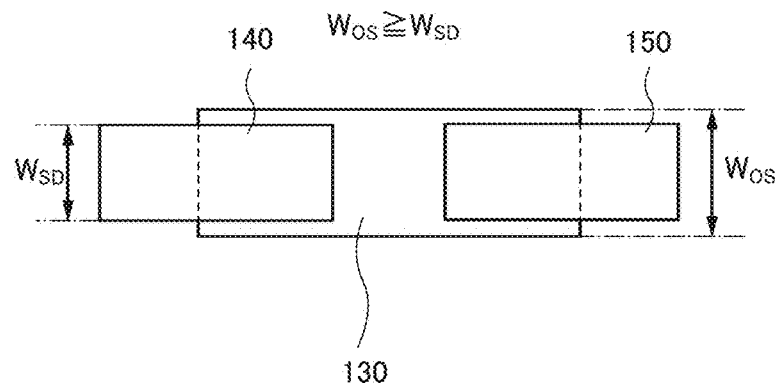
Figure 38C:
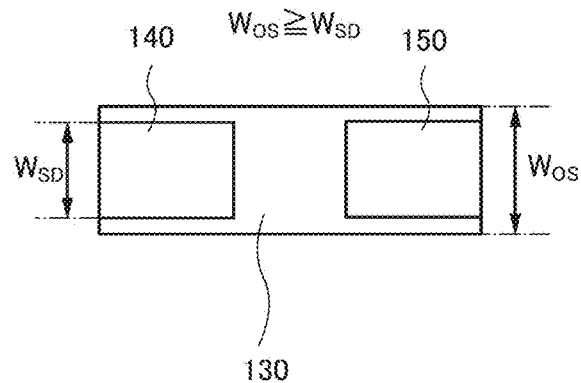

As shown in the top views in FIGS. 38A and 38B (showing only the oxide semiconductor layer 130, the conductive layer 140, and the conductive layer 150), the widths ($W_{SD}$) of the conductive layer 140 (source electrode layer) and the conductive layer 150 (drain electrode layer) in the transistor of one embodiment of the present invention may be either longer than or shorter than the width ($W_{OS}$) of the oxide semiconductor layer 130. When $W_{OS} \geq W_{SD}$ ($W_{SD}$ is less than or equal to $W_{OS}$) is satisfied, a gate electric field is easily applied to the entire oxide semiconductor layer 130, so that electrical characteristics of the transistor can be improved. As illustrated in FIG. 38C, the conductive layers 140 and 150 may be formed only in a region that overlaps with the oxide semiconductor layer 130.

In the transistor in one embodiment of the present invention (any of the transistors 101 to 113), the conductive layer 170 functioning as a gate electrode layer electrically surrounds the oxide semiconductor layer 130 in the channel width direction with the insulating layer 160 functioning as a gate insulating film positioned therebetween. This structure increases the on-state current. Such a transistor structure is referred to as a surrounded channel (s-channel) structure.

In the transistor including the oxide semiconductor layers 130a and 130b and the transistor including the oxide semiconductor layers 130a to 130c, selecting appropriate materials for the two or three layers forming the oxide semiconductor layer 130 allows current to flow in the oxide semiconductor layer 130b. Since current flows in the oxide semiconductor layer 130b, the current is hardly influenced by interface scattering, leading to a high on-state current. Thus, increasing the thickness of the oxide semiconductor layer 130b improves the on-state current in some cases.

A semiconductor device using a transistor with any of the above structures can have favorable electrical characteristics.

The structures described in this embodiment can be used in appropriate combination with any of the structures described in the other embodiments.

Embodiment 6

In this embodiment, components of the transistors described in Embodiment 5 are described in detail.

As the substrate 115, a glass substrate, a quartz substrate, a semiconductor substrate, a ceramic substrate, a metal substrate with an insulated surface, or the like can be used. Alternatively, a silicon substrate provided with a transistor, a photodiode, or the like can be used, and an insulating layer, a wiring, a conductor functioning as a contact plug, and the like may be provided over the silicon substrate. Note that when p-channel transistors are formed using the silicon substrate, a silicon substrate with n$^-$-type conductivity is preferably used. Alternatively, an SOI substrate including an n$^-$-type or i-type silicon layer may be used. In the case where a p-channel transistor is formed on the silicon substrate, it is preferable to use a silicon substrate in which a plane where the transistor is formed is a (110) plane orientation. Forming a p-channel transistor with the (110) plane can increase mobility.

The insulating layer 120 can have a function of supplying oxygen to the oxide semiconductor layer 130 as well as a function of preventing diffusion of impurities from a component included in the substrate 115. For this reason, the insulating layer 120 is preferably an insulating film containing oxygen and further preferably, the insulating layer 120 is an insulating film containing oxygen in which the oxygen content is higher than that in the stoichiometric composition. The insulating layer 120 is a film in which the amount of released oxygen when converted into oxygen atoms is preferably greater than or equal to $1.0 \times 10^{19}$ atoms/cm$^3$ in thermal desorption spectroscopy (TDS) analysis performed such that the surface temperature of the film is higher than or equal to 100° C. and lower than or equal to 700° C., preferably higher than or equal to 100° C. and lower than or equal to 500° C. In the case where the substrate 115 is provided with another device, the insulating layer 120 also has a function of an interlayer insulating film. In that case, the insulating layer 120 is preferably subjected to planarization treatment such as CMP treatment so as to have a flat surface.

For example, the insulating layer 120 can be formed using an oxide insulating film including aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating film including silicon nitride, silicon nitride oxide, aluminum nitride, aluminum nitride oxide, or the like; or a mixed material of any of these. The insulating layer 120 may be a stack of any of the above materials.

The oxide semiconductor layer 130 can have a three-layer structure in which the oxide semiconductor layers 130a to 130c are sequentially stacked from the insulating layer 120 side.

Note that in the case where the oxide semiconductor layer 130 is a single layer, a layer corresponding to the oxide semiconductor layer 130b described in this embodiment is used.

In the case where the oxide semiconductor layer 130 has a two-layer structure, a stack in which layers corresponding to the oxide semiconductor layer 130a and the oxide semiconductor layer 130b are sequentially stacked from the insulating layer 120 side is used. In such a case, the oxide semiconductor layers 130a and 130b can be replaced with each other.

For the oxide semiconductor layer 130b, for example, an oxide semiconductor whose electron affinity (an energy difference between a vacuum level and the conduction band minimum) is higher than those of the oxide semiconductor layers 130a and 130c is used.

In such a structure, when an electric field is applied to the conductive layer 170, a channel is formed in the oxide semiconductor layer 130b whose conduction band minimum is the lowest in the oxide semiconductor layer 130. Therefore, the oxide semiconductor layer 130b can be regarded as having a region serving as a semiconductor, while the oxide semiconductor layer 130a and the oxide semiconductor layer 130c can be regarded as having a region serving as an insulator or a semi-insulator.

An oxide semiconductor that can be used for each of the oxide semiconductor layers 130a to 130c preferably contains at least In or Zn. Both In and Zn are preferably contained. In order to reduce variations in electrical characteristics of the transistor including the oxide semiconductor, the oxide semiconductor preferably contains a stabilizer such as Al, Ga, Y, or Sn in addition to In and Zn.

The oxide semiconductor layers 130a to 130c preferably include crystal parts. In particular, when crystals with c-axis alignment are used, the transistor can have stable electrical characteristics. Moreover, crystals with c-axis alignment are resistant to bending; therefore, using such crystals can improve the reliability of a semiconductor device using a flexible substrate.

As the conductive layer 140 functioning as a source electrode layer and the conductive layer 150 functioning as a drain electrode layer, for example, a single layer or a stacked layer formed using a material selected from Al, Cr, Cu, Ta, Ti, Mo, W, Ni, Mn, Nd, and Sc and alloys or conductive nitrides of any of these metal materials can be used. It is also possible to use a stack of any of the above materials and Cu or an alloy such as Cu—Mn, which has low resistance. In the transistors 105, 106, 111, and 112, for example, it is possible to use W for the conductive layers 141 and 151 and use a stack of Ti and Al for the conductive layers 142 and 152.

The above materials are capable of extracting oxygen from an oxide semiconductor film. Therefore, in a region of the oxide semiconductor film that is in contact with any of the above materials, oxygen is released from the oxide semiconductor film and an oxygen vacancy is formed. Hydrogen slightly contained in the film and the oxygen vacancy are bonded to each other, so that the region is markedly changed to an n-type region. Accordingly, the n-type region can serve as a source or a drain of the transistor.

In the case where W is used for the conductive layers 140 and 150, the conductive layers 140 and 150 may be doped with nitrogen. Doping with nitrogen can appropriately lower the capability of extracting oxygen and prevent the n-type region from spreading to a channel region. It is possible to prevent the n-type region from spreading to a channel region also by using a stack of W and an n-type semiconductor layer as the conductive layers 140 and 150 and putting the n-type semiconductor layer in contact with the oxide semiconductor layer. As the n-type semiconductor layer, an In—Ga—Zn oxide, zinc oxide, indium oxide, tin oxide, indium tin oxide, or the like to which nitrogen is added can be used.

The insulating layer 160 functioning as a gate insulating film can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 160 may be a stack including any of the above materials. The insulating layer 160 may contain La, N, Zr, or the like as an impurity.

An example of a stacked-layer structure of the insulating layer 160 is described. The insulating layer 160 includes, for example, oxygen, nitrogen, silicon, or hafnium. Specifically, the insulating layer 160 preferably includes hafnium oxide and silicon oxide or silicon oxynitride.

Hafnium oxide and aluminum oxide have higher dielectric constants than silicon oxide and silicon oxynitride. Therefore, the insulating layer 160 using hafnium oxide or aluminum oxide can have larger thickness than the insulating layer 160 using silicon oxide, so that leakage current due to tunnel current can be reduced. That is, a transistor with a low off-state current can be provided. Moreover, hafnium oxide with a crystalline structure has a higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited to these examples.

For the insulating layers 120 and 160 in contact with the oxide semiconductor layer 130, a film that releases less nitrogen oxide is preferably used. In the case where the oxide semiconductor is in contact with an insulating layer that releases a large amount of nitrogen oxide, the density of states due to nitrogen oxide increases in some cases. For the insulating layers 120 and 160, for example, an oxide insulating layer such as a silicon oxynitride film or an aluminum oxynitride film that releases less nitrogen oxide can be used.

A silicon oxynitride film that releases less nitrogen oxide is a film that releases ammonia more than nitrogen oxide in TDS; the amount of released ammonia is typically greater than or equal to $1 \times 10^{18}$ cm$^{-3}$ and less than or equal to $5 \times 10^{19}$ cm$^{-3}$. Note that the amount of released ammonia is the amount of ammonia released by heat treatment with which the surface temperature of the film becomes higher than or equal to 50° C. and lower than or equal to 650° C., preferably higher than or equal to 50° C. and lower than or equal to 550° C.

By using the above oxide insulating layer for the insulating layers 120 and 160, a shift in the threshold voltage of the transistor can be reduced, which leads to reduced fluctuations in the electrical characteristics of the transistor.

For the conductive layer 170 functioning as a gate electrode layer, for example, a conductive film formed using Al, Ti, Cr, Co, Ni, Cu, Y, Zr, Mo, Ru, Ag, Mn, Nd, Sc, Ta, or W can be used. Alternatively, an alloy or a conductive nitride of any of these materials may be used. Alternatively, a stack of a plurality of materials selected from these materials, alloys of these materials, and conductive nitrides of these materials may be used. Typically, tungsten, a stack of tungsten and titanium nitride, a stack of tungsten and tantalum nitride, or the like can be used. Alternatively, Cu or an alloy such as Cu—Mn, which has low resistance, or a stack of any of the above materials and Cu or an alloy such as Cu—Mn may be used. In this embodiment, tantalum nitride is used for the conductive layer 171 and tungsten is used for the conductive layer 172 to form the conductive layer 170.

As the conductive layer 170, an oxide conductive layer of an In—Ga—Zn oxide, zinc oxide, indium oxide, tin oxide, indium tin oxide, or the like may be used.

As the insulating layer 175, a silicon nitride film, an aluminum nitride film, or the like containing hydrogen can be used. In the transistors 103, 104, 106, 109, 110, and 112 described in Embodiment 5, when an insulating film containing hydrogen is used as the insulating layer 175, part of the oxide semiconductor layer can have n-type conductivity. In addition, a nitride insulating film functions as a blocking film against moisture and the like and can improve the reliability of the transistor.

An aluminum oxide film can also be used as the insulating layer 175. It is particularly preferable to use an aluminum oxide film as the insulating layer 175 in the transistors 101, 102, 105, 107, 108, and 111 described in Embodiment 5. The aluminum oxide film has an excellent effect of blocking both oxygen and impurities such as hydrogen and moisture. Accordingly, during and after the manufacturing process of the transistor, the aluminum oxide film can suitably function as a protective film that has effects of preventing entry of impurities such as hydrogen and moisture into the oxide semiconductor layer 130, preventing release of oxygen from the oxide semiconductor layer, and preventing unnecessary release of oxygen from the insulating layer 120.

The insulating layer 180 is preferably formed over the insulating layer 175. The insulating layer 180 can be formed using an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 180 may be a stack of any of the above materials.

Here, like the insulating layer 120, the insulating layer 180 preferably contains oxygen more than that in the stoichiometric composition. Oxygen released from the insulating layer 180 can be diffused into the channel formation region in the oxide semiconductor layer 130 through the insulating layer 160, so that oxygen vacancies formed in the channel formation region can be filled with oxygen. In this manner, stable electrical characteristics of the transistor can be achieved.

High integration of a semiconductor device requires miniaturization of a transistor. However, miniaturization of a transistor tends to cause deterioration of electrical characteristics of the transistor. For example, a decrease in channel width causes a reduction in on-state current.

In the transistors 107 to 112 in one embodiment of the present invention, the oxide semiconductor layer 130c is formed to cover the oxide semiconductor layer 130b where a channel is formed; thus, a channel formation layer is not in contact with the gate insulating film. Accordingly, scattering of carriers at the interface between the channel formation layer and the gate insulating film can be reduced and the on-state current of the transistor can be increased.

In the transistor in one embodiment of the present invention, as described above, the gate electrode layer (the conductive layer 170) is formed to electrically surround the oxide semiconductor layer 130 in the channel width direction; accordingly, a gate electric field is applied to the oxide semiconductor layer 130 in a direction perpendicular to its side surface in addition to a direction perpendicular to its top surface. In other words, a gate electric field is applied to the entire channel formation layer and an effective channel width is increased, leading to a further increase in on-state current.

Although the variety of films such as the metal films, the semiconductor films, and the inorganic insulating films that are described in this embodiment typically can be formed by a sputtering method or a plasma-enhanced CVD method, such films may be formed by another method such as a thermal CVD method. Examples of the thermal CVD method include a metal organic chemical vapor deposition (MOCVD) method and an atomic layer deposition (ALD) method.

Since plasma is not used for deposition, a thermal CVD method has an advantage that no defect due to plasma damage is generated.

Deposition by a thermal CVD method may be performed in such a manner that a source gas and an oxidizer are supplied to a chamber at the same time, the pressure in the chamber is set to an atmospheric pressure or a reduced pressure, and reaction is caused in the vicinity of the substrate or over the substrate.

Deposition by an ALD method is performed in such a manner that the pressure in a chamber is set to an atmospheric pressure or a reduced pressure, source gases for reaction are introduced into the chamber and reacted, and then the sequence of gas introduction is repeated. An inert gas (e.g., argon or nitrogen) may be introduced as a carrier gas with the source gases. For example, two or more kinds of source gases may be sequentially supplied to the chamber. In that case, after reaction of a first source gas, an inert gas is introduced, and then a second source gas is introduced so that the source gases are not mixed. Alternatively, the first source gas may be exhausted by vacuum evacuation instead of introduction of the inert gas, and then the second source gas may be introduced. The first source gas is adsorbed on the surface of the substrate and reacted to form a first layer, and then, the second source gas introduced is adsorbed and reacted. As a result, a second layer is stacked over the first layer, so that a thin film is formed. The sequence of the gas introduction is controlled and repeated a plurality of times until desired thickness is obtained, whereby a thin film with excellent step coverage can be formed. The thickness of the thin film can be adjusted by the number of repetition times of the sequence of gas introduction; therefore, an ALD method makes it possible to accurately adjust thickness and thus is suitable for manufacturing a minute FET.

The variety of films such as the metal film, the semiconductor film, and the inorganic insulating film that have been disclosed in the above embodiments can be formed by a thermal CVD method such as an MOCVD method or an ALD method. For example, in the case where an In—Ga—Zn—O film is formed, trimethylindium (In(CH$_3$)$_3$), trimethylgallium (Ga(CH$_3$)$_3$), and dimethylzinc (Zn(CH$_3$)$_2$) can be used. Without limitation to the above combination, triethylgallium (Ga(C$_2$H$_5$)$_3$) can be used instead of trimethylgallium and diethylzinc (Zn(C$_2$H$_5$)$_2$) can be used instead of dimethylzinc.

For example, in the case where a hafnium oxide film is formed by a deposition apparatus using an ALD method, two kinds of gases, i.e., ozone (O$_3$) as an oxidizer and a source gas that is obtained by vaporizing liquid containing a solvent and a hafnium precursor (hafnium alkoxide and a hafnium amide such as tetrakis(dimethylamide)hafnium (TDMAH, Hf[N(CH$_3$)$_2$]$_4$) and tetrakis(ethylmethylamide)hafnium) are used.

For example, in the case where an aluminum oxide film is formed by a deposition apparatus using an ALD method, two kinds of gases, i.e., H$_2$O as an oxidizer and a source gas that is obtained by vaporizing liquid containing a solvent and an aluminum precursor (e.g., trimethylaluminum (TMA, Al(CH$_3$)$_3$)) are used. Examples of another material include tris(dimethylamide)aluminum, triisobutylaluminum, and aluminum tris(2,2,6,6-tetramethyl-3,5-heptanedionate).

For example, in the case where a silicon oxide film is formed by a deposition apparatus using an ALD method, hexachlorodisilane is adsorbed on a surface where a film is to be formed, and radicals of an oxidizing gas (e.g., O$_2$ or dinitrogen monoxide) are supplied to react with the adsorbate.

For example, in the case where a tungsten film is formed by a deposition apparatus using an ALD method, a WF$_6$ gas and a B$_2$H$_6$ gas are sequentially introduced to form an initial tungsten film, and then a WF$_6$ gas and an H$_2$ gas are sequentially introduced to form a tungsten film. Note that an SiH$_4$ gas may be used instead of a B$_2$H$_6$ gas.

For example, in the case where an oxide semiconductor film, e.g., an In—Ga—Zn—O film is formed by a deposition apparatus using an ALD method, an In(CH$_3$)$_3$ gas and an O$_3$ gas are sequentially introduced to form an In—O layer, a Ga(CH$_3$)$_3$ gas and an O$_3$ gas are sequentially introduced to form a Ga—O layer, and then a Zn(CH$_3$)$_2$ gas and an O$_3$ gas are sequentially introduced to form a Zn—O layer. Note that the order of these layers is not limited to this example. A mixed compound layer such as an In—Ga—O layer, an In—Zn—O layer, or a Ga—Zn—O layer may be formed by using these gases. Although an H$_2$O gas that is obtained by bubbling with an inert gas such as Ar may be used instead of an O$_3$ gas, it is preferable to use an O$_3$ gas, which does not contain H.

A facing-target-type sputtering apparatus can be used for deposition of an oxide semiconductor layer. Deposition using the facing-target-type sputtering apparatus can also be referred to as vapor deposition SP (VDSP).

When an oxide semiconductor layer is deposited using a facing-target-type sputtering apparatus, plasma damage to the oxide semiconductor layer at the time of deposition can be reduced. Thus, oxygen vacancies in the film can be reduced. In addition, the use of the facing-target-type sputtering apparatus enables low-pressure deposition. Accordingly, the concentration of impurities (e.g., hydrogen, a rare gas (e.g., argon), and water) in a deposited oxide semiconductor layer can be lowered.

The structures described in this embodiment can be used in appropriate combination with any of the structures described in the other embodiments.

Embodiment 7

In this embodiment, the material of an oxide semiconductor that can be used for one embodiment of the present invention is described.

An oxide semiconductor preferably contains at least indium or zinc. In particular, indium and zinc are preferably contained. In addition, aluminum, gallium, yttrium, tin, or the like is preferably contained as an element M. Furthermore, one or more elements selected from boron, silicon, titanium, iron, nickel, germanium, zirconium, molybdenum, lanthanum, cerium, neodymium, hafnium, tantalum, tungsten, magnesium, or the like may be contained as the element M.

Here, the case where an oxide semiconductor contains indium, the element M, and zinc is considered.

First, preferred ranges of the atomic ratio of indium, the element M, and zinc contained in an oxide semiconductor according to the present invention are described with reference to FIGS. 39A to 39C. Note that the proportion of oxygen atoms is not shown. The terms of the atomic ratio of indium, the element M, and zinc contained in the oxide semiconductor are denoted by [In], [M], and [Zn], respectively.

Figure 39A:
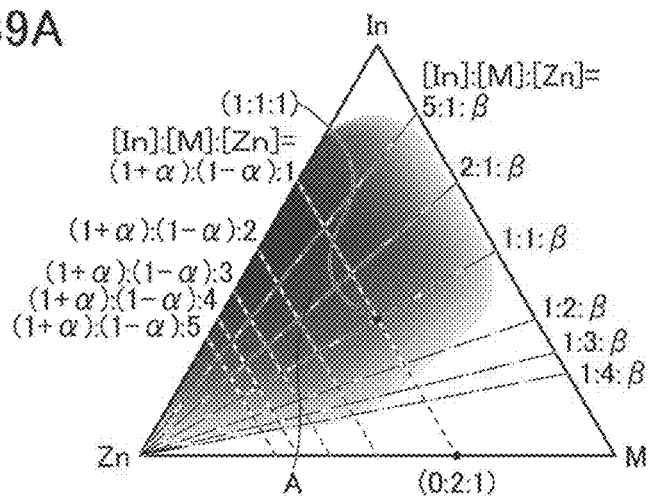
FIGS. 39A to 39C each illustrate an atomic ratio range of an oxide semiconductor.
Figure 39B:
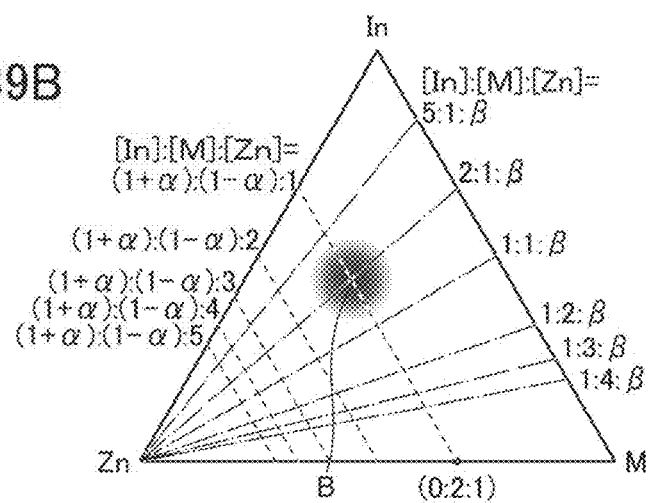
Figure 39C:
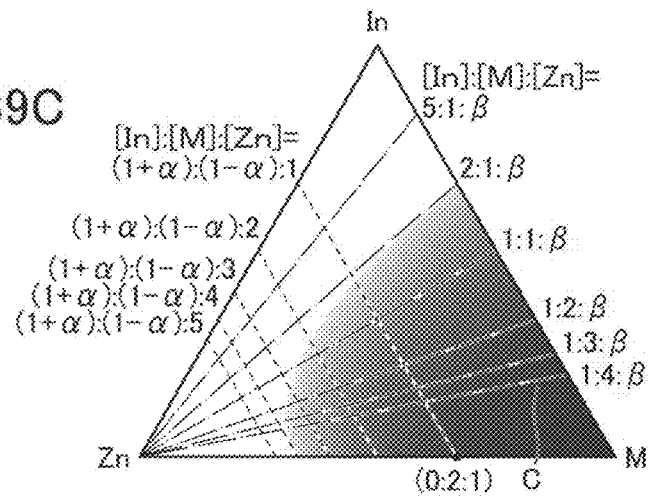

In FIGS. 39A to 39C, broken lines indicate a line where the atomic ratio [In]:[M]:[Zn] is (1+α):(1−α):1, where −1≤α≤1, a line where the atomic ratio [In]:[M]:[Zn] is (1+α):(1−α):2, a line where the atomic ratio [In]:[M]:[Zn] is (1+α):(1−α):3, a line where the atomic ratio [In]:[M]:[Zn] is (1+a):(1−a):4, and a line where the atomic ratio [In]:[M]:[Zn] is (1+α):(1−α):5.

Dashed-dotted lines indicate a line where the atomic ratio [In]:[M]:[Zn] is 1:1:β, where β≥0, a line where the atomic ratio [In]:[M]:[Zn] is 1:2:β, a line where the atomic ratio [In]:[M]:[Zn] is 1:3:β, a line where the atomic ratio [In]:[M]:[Zn] is 1:4:β, a line where the atomic ratio [In]:[M]:[Zn] is 2:1:β, and a line where the atomic ratio [In]:[M]:[Zn] is 5:1:β.

An oxide semiconductor with an atomic ratio of [In]:[M]:[Zn]=0:2:1 or a neighborhood thereof in FIGS. 39A to 39C is likely to have a spinel crystal structure.

FIGS. 39A and 39B show examples of the preferred ranges of the atomic ratio of indium, the element M and zinc contained in an oxide semiconductor in one embodiment of the present invention.

Figure 40:
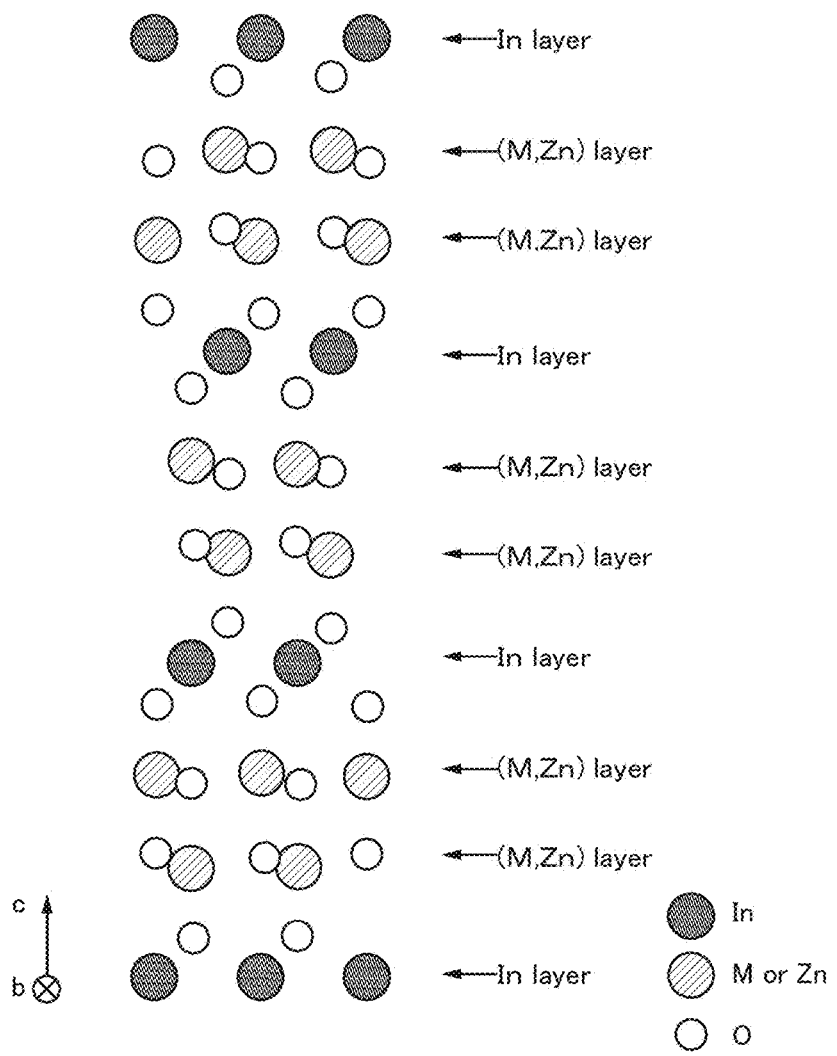
FIG. 40 illustrates an $InMZnO_4$ crystal.

FIG. 40 shows an example of the crystal structure of InMZnO$_4$ whose atomic ratio [In]:[M]:[Zn] is 1:1:1. The crystal structure shown in FIG. 40 is InMZnO$_4$ observed from a direction parallel to a b-axis. Note that a metal element in a layer that contains M, Zn, and oxygen (hereinafter, this layer is referred to as an "(M,Zn) layer") in FIG. 40 represents the element M or zinc. In that case, the proportion of the element M is the same as the proportion of zinc. The element M and zinc can be replaced with each other, and their arrangement is random.

InMZnO$_4$ has a layered crystal structure (also referred to as a layered structure) and includes one layer that contains indium and oxygen (hereinafter referred to as an In layer) for every two (M,Zn) layers that contain the element M, zinc, and oxygen, as shown in FIG. 40.

Indium and the element M can be replaced with each other. Therefore, when the element M in the (M,Zn) layer is replaced with indium, the layer can also be referred to as an (In,M,Zn) layer. In that case, a layered structure that contains one In layer for every two (In,M,Zn) layers is obtained.

An oxide semiconductor whose atomic ratio [In]:[M]:[Zn] is 1:1:2 has a layered structure that contains one In layer for every three (M,Zn) layers. In other words, if [Zn] is larger than [In] and [M], the proportion of the (M,Zn) layer to the In layer becomes higher when the oxide semiconductor is crystallized.

Note that in the case where the number of (M,Zn) layers with respect to one In layer is not an integer in the oxide semiconductor, the oxide semiconductor might have plural kinds of layered structures where the number of (M,Zn) layers with respect to one In layer is an integer. For example, in the case of [In]:[M]:[Zn]=1:1:1.5, the oxide semiconductor might have the following layered structures: a layered structure of one In layer for every two (M,Zn) layers and a layered structure of one In layer for every three (M,Zn) layers.

For example, in the case where the oxide semiconductor is deposited with a sputtering apparatus, a film having an atomic ratio deviated from the atomic ratio of a target is formed. In particular, [Zn] in the film might be smaller than [Zn] in the target depending on the substrate temperature in deposition.

A plurality of phases (e.g., two phases or three phases) exist in the oxide semiconductor in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the oxide semiconductor, a grain boundary might be formed between different crystal structures.

In addition, the oxide semiconductor containing indium in a higher proportion can have high carrier mobility (electron mobility). This is because in an oxide semiconductor containing indium, the element M, and zinc, the s orbital of heavy metal mainly contributes to carrier transfer, and when the indium content in the oxide semiconductor is increased, overlaps of the s orbitals of indium atoms are increased; therefore, an oxide semiconductor having a high content of indium has higher carrier mobility than an oxide semiconductor having a low content of indium.

In contrast, when the indium content and the zinc content in an oxide semiconductor become lower, carrier mobility becomes lower. Thus, with an atomic ratio of [In]:[M]:[Zn]=0:1:0 and the vicinity thereof (e.g., a region C in FIG. 39C), insulation performance becomes better.

Accordingly, an oxide semiconductor in one embodiment of the present invention preferably has an atomic ratio represented by a region A in FIG. 39A. With the atomic ratio, a layered structure with high carrier mobility and a few grain boundaries is easily obtained.

A region B in FIG. 39B represents an atomic ratio of [In]:[M]:[Zn]=4:2:3 or 4:2:4.1 and the vicinity thereof. The vicinity includes an atomic ratio of [In]:[M]:[Zn]=5:3:4. An oxide semiconductor with an atomic ratio represented by the region B is an excellent oxide semiconductor that has particularly high crystallinity and high carrier mobility.

Note that a condition where an oxide semiconductor forms a layered structure is not uniquely determined by an atomic ratio. There is a difference in the degree of difficulty in forming a layered structure among atomic ratios. Even with the same atomic ratio, whether a layered structure is formed or not depends on a formation condition. Therefore, the illustrated regions each represent an atomic ratio with which an oxide semiconductor has a layered structure, and boundaries of the regions A to C are not clear.

Next, the case where the oxide semiconductor is used for a transistor is described.

Note that when the oxide semiconductor is used for a transistor, carrier scattering or the like at a grain boundary can be reduced; thus, the transistor can have high field-effect mobility. In addition, the transistor can have high reliability.

An oxide semiconductor with low carrier density is preferably used for the transistor. For example, an oxide semiconductor whose carrier density is lower than $8 \times 10^{11}/cm^3$, preferably lower than $1 \times 10^{11}/cm^3$, more preferably lower than $1 \times 10^{10}/cm^3$, and greater than or equal to $1 \times 10^{-9}/cm^3$ is used.

A highly purified intrinsic or substantially highly purified intrinsic oxide semiconductor has few carrier generation sources and thus can have a low carrier density. The highly purified intrinsic or substantially highly purified intrinsic oxide semiconductor has a low density of defect states and accordingly has a low density of trap states in some cases.

Charge trapped by the trap states in the oxide semiconductor takes a long time to be released and may behave like fixed charge. Thus, a transistor whose channel region is formed in an oxide semiconductor having a high density of trap states has unstable electrical characteristics in some cases.

In order to obtain stable electrical characteristics of the transistor, it is effective to reduce the concentration of impurities in the oxide semiconductor. In addition, in order to reduce the concentration of impurities in the oxide semiconductor, the concentration of impurities in a film that is adjacent to the oxide semiconductor is preferably reduced. Examples of impurities include hydrogen, nitrogen, alkali metal, alkaline earth metal, iron, nickel, and silicon.

Here, the influence of impurities in the oxide semiconductor is described.

When silicon or carbon that is one of Group 14 elements is contained in the oxide semiconductor, defect states are formed. Thus, the oxide semiconductor is formed to have a region where the concentration of silicon or carbon (measured by secondary ion mass spectrometry (SIMS)) is controlled to be lower than or equal to $2 \times 10^{18}$ atoms/cm$^3$, preferably lower than or equal to $2 \times 10^{17}$ atoms/cm$^3$ in the oxide semiconductor or around an interface with a layer in contact with the oxide semiconductor.

When the oxide semiconductor contains alkali metal or alkaline earth metal, defect states are formed and carriers are generated, in some cases. Thus, an OS transistor that contains alkali metal or alkaline earth metal is likely to be normally-on. Therefore, it is preferable to reduce the concentration of alkali metal or alkaline earth metal in the oxide semiconductor. Specifically, the oxide semiconductor is formed to have a region where the concentration of alkali metal or alkaline earth metal measured by SIMS is controlled to be lower than or equal to $1 \times 10^{18}$ atoms/cm$^3$, preferably lower than or equal to $2 \times 10^{16}$ atoms/cm$^3$.

When the oxide semiconductor contains nitrogen, the oxide semiconductor easily becomes n-type by generation of electrons serving as carriers and an increase of carrier density. Thus, a transistor whose semiconductor includes an oxide semiconductor that contains nitrogen is likely to be normally-on. Accordingly, it is preferable that nitrogen in the oxide semiconductor be reduced as much as possible. Specifically, the oxide semiconductor is formed to have a region where the concentration of nitrogen measured by SIMS is controlled to be lower than $5 \times 10^{19}$ atoms/cm$^3$, preferably lower than or equal to $5 \times 10^{18}$ atoms/cm$^3$, more preferably lower than or equal to $1 \times 10^{18}$ atoms/cm$^3$, still more preferably lower than or equal to $5 \times 10^{17}$ atoms/cm$^3$.

Hydrogen contained in an oxide semiconductor reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, an OS transistor that contains hydrogen is likely to be normally-on. Accordingly, it is preferable that hydrogen in the oxide semiconductor be reduced as much as possible. Specifically, the oxide semiconductor is formed to have a region where the concentration of hydrogen measured by SIMS is controlled to be lower than $1 \times 10^{20}$ atoms/cm$^3$, preferably lower than $1 \times 10^{19}$ atoms/cm$^3$, more preferably lower than $5 \times 10^{18}$ atoms/cm$^3$, still more preferably lower than $1 \times 10^{18}$ atoms/cm$^3$.

When an oxide semiconductor with sufficiently reduced impurity concentration is used for a channel formation region in a transistor, the transistor can have stable electrical characteristics. A transistor in which a highly purified oxide semiconductor is used for a channel formation region exhibits an extremely low off-state current. When voltage between a source and a drain is set to about 0.1 V, 5 V, or 10 V, for example, the off-state current per channel width of the transistor can be as low as several yoctoamperes per micrometer to several zeptoamperes per micrometer.

Next, the case where the oxide semiconductor has a two-layer structure or a three-layer structure is described. A band diagram of a stacked structure of an oxide semiconductor S1, an oxide semiconductor S2, and an oxide semiconductor S3 and insulators that are in contact with the stacked structure and a band diagram of a stacked structure of the oxide semiconductor S2 and the oxide semiconductor S3 and insulators that are in contact with the stacked structure are described with reference to FIGS. 41A and 41B. Note that the oxide semiconductor S1, the oxide semiconductor S2, and the oxide semiconductor S3 correspond to the oxide semiconductor layer 130a, the oxide semiconductor layer 130b, and the oxide semiconductor layer 130c, respectively.

Figure 41A:
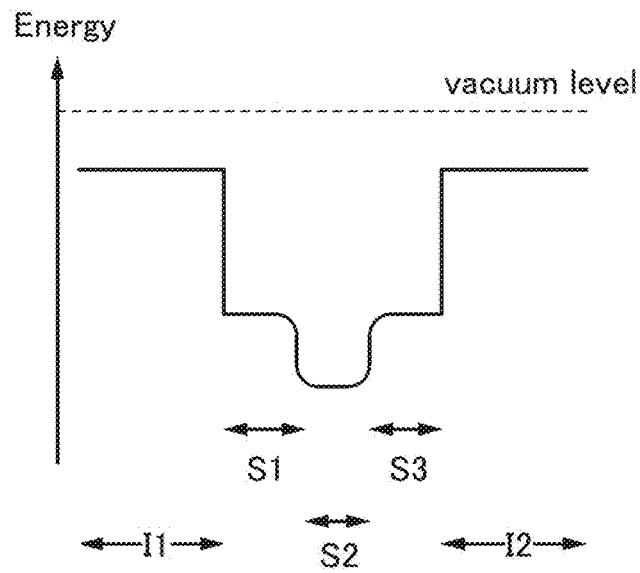
FIGS. 41A and 41B are each a band diagram of a stacked structure of an oxide semiconductor.
Figure 41B:
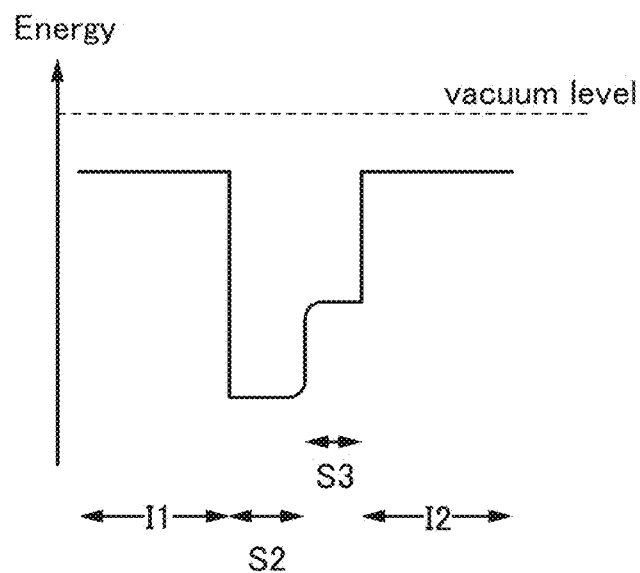

FIG. 41A is an example of a band diagram of a stacked structure including an insulator I1, the oxide semiconductor S1, the oxide semiconductor S2, the oxide semiconductor S3, and an insulator I2 in a film thickness direction. FIG. 41B is an example of a band diagram of a stacked structure including the insulator I1, the oxide semiconductor S2, the oxide semiconductor S3, and the insulator I2 in a film thickness direction. Note that for easy understanding, the band diagrams show the energy level of the conduction band minimum (Ec) of each of the insulator I1, the oxide semiconductor S1, the oxide semiconductor S2, the oxide semiconductor S3, and the insulator I2.

The energy level of the conduction band minimum of each of the oxide semiconductors S1 and S3 is closer to the vacuum level than that of the oxide semiconductor S2. Typically, a difference in energy level between the conduction band minimum of the oxide semiconductor S2 and the conduction band minimum of each of the oxide semiconductors S1 and S3 is preferably greater than or equal to 0.15 eV or greater than or equal to 0.5 eV, and less than or equal to 2 eV or less than or equal to 1 eV. That is, it is preferable that the electron affinity of the oxide semiconductor S2 be higher than the electron affinity of each of the oxide semiconductors S1 and S3, and the difference between the electron affinity of each of the oxide semiconductors Si and S3 and the electron affinity of the oxide semiconductor S2 be greater than or equal to 0.15 eV or greater than or equal to 0.5 eV, and less than or equal to 2 eV or less than or equal to 1 eV.

As shown in FIGS. 41A and 41B, the energy level of the conduction band minimum of each of the oxide semiconductors S1 to S3 is gradually varied. In other words, the energy level of the conduction band minimum is continuously varied or continuously connected. In order to obtain such a band diagram, the density of defect states in a mixed layer formed at an interface between the oxide semiconductors S1 and S2 or an interface between the oxide semiconductors S2 and S3 is preferably made low.

Specifically, when the oxide semiconductors S1 and S2 or the oxide semiconductors S2 and S3 contain the same element (as a main component) in addition to oxygen, a mixed layer with a low density of defect states can be formed. For example, in the case where the oxide semiconductor S2 is an In—Ga—Zn oxide semiconductor, it is preferable to use an In—Ga—Zn oxide semiconductor, a Ga—Zn oxide semiconductor, gallium oxide, or the like as each of the oxide semiconductors S1 and S3.

At this time, the oxide semiconductor S2 serves as a main carrier path. Since the density of defect states at the interface between the oxide semiconductors S1 and S2 and the interface between the oxide semiconductors S2 and S3 can be made low, the influence of interface scattering on carrier conduction is small, and high on-state current can be obtained.

When an electron is trapped in a trap state, the trapped electron behaves like fixed charge; thus, the threshold voltage of the transistor is shifted in a positive direction. The oxide semiconductors S1 and S3 can make the trap state apart from the oxide semiconductor S2. This structure can prevent the positive shift of the threshold voltage of the transistor.

A material whose conductivity is sufficiently lower than that of the oxide semiconductor S2 is used for the oxide semiconductors S1 and S3. In that case, the oxide semiconductor S2, the interface between the oxide semiconductors S1 and S2, and the interface between the oxide semiconductors S2 and S3 mainly function as a channel region. For example, an oxide semiconductor with high insulation performance and the atomic ratio represented by the region C in FIG. 39C may be used as the oxide semiconductors S1 and S3.

In the case where an oxide semiconductor with the atomic ratio represented by the region A is used as the oxide semiconductor S2, it is particularly preferable to use an oxide semiconductor with an atomic ratio where [M]/[In] is greater than or equal to 1, preferably greater than or equal to 2 as each of the oxide semiconductors S1 and S3. In addition, it is suitable to use an oxide semiconductor with sufficiently high insulation performance and an atomic ratio where [M]/([Zn]+[In]) is greater than or equal to 1 as the oxide semiconductor S3.

The structure described in this embodiment can be combined with any of the structures described in the other embodiments as appropriate.

Embodiment 8

A structure of an oxide semiconductor that can be used in one embodiment of the present invention is described below.

In this specification, the term "parallel" indicates that the angle formed between two straight lines is greater than or equal to −10° and less than or equal to 10°, and accordingly also includes the case where the angle is greater than or equal to −5° and less than or equal to 5°. Furthermore, the term "perpendicular" indicates that the angle formed between two straight lines is greater than or equal to 80° and less than or equal to 100°, and accordingly also includes the case where the angle is greater than or equal to 85° and less than or equal to 95°.

In this specification, trigonal and rhombohedral crystal systems are included in a hexagonal crystal system.

<Structure of Oxide Semiconductor>

The structure of an oxide semiconductor is described below.

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not to have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS is described.

A CAAC-OS is one of oxide semiconductors having a plurality of c-axis aligned crystal parts (also referred to as pellets).

Figure 42A:
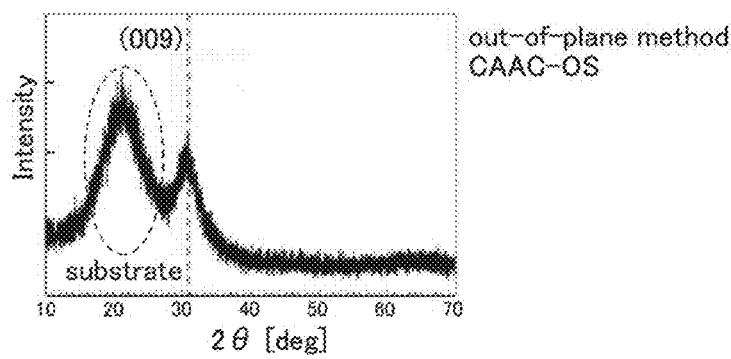
FIGS. 42A to 42E show structural analysis results of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an InGaZnO$_4$ crystal that is classified into the space group R-3m is analyzed by an out-of-plane method, a peak appears at a diffraction angle (2θ) of around 31° as shown in FIG. 42A. This peak is derived from the (009) plane of the InGaZnO$_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure that is classified into the space group Fd-3m; thus, this peak is preferably not exhibited in a CAAC-OS.

Figure 42B:
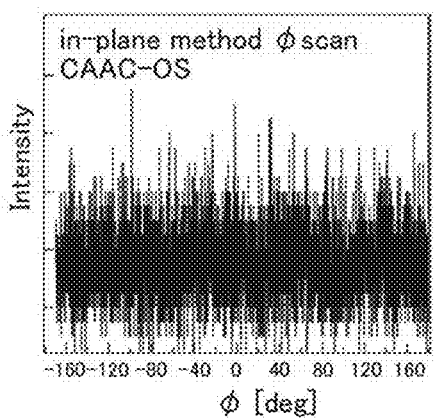
Figure 42C:
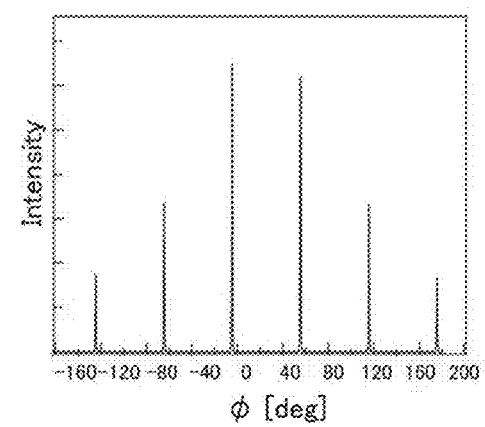

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the InGaZnO$_4$ crystal. When analysis (φ scan) is performed with 2θ fixed at around 56° and with the sample rotated using a normal vector to the sample surface as an axis (0 axis), as shown in FIG. 42B, a peak is not clearly observed. In contrast, in the case where single crystal InGaZnO$_4$ is subjected to φ scan with 2θ fixed at around 56°, as shown in FIG. 42C, six peaks that are derived from crystal planes equivalent to the (110) plane are observed. Accordingly, the structural analysis using XRD shows that the directions of a-axes and b-axes are irregularly oriented in the CAAC-OS.

Figure 42D:
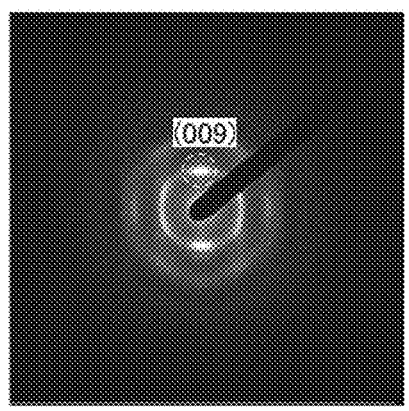
Figure 42E:
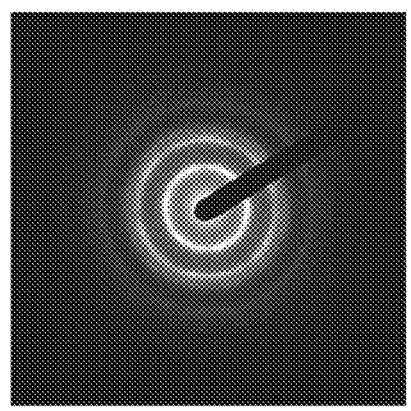

Next, a CAAC-OS analyzed by electron diffraction is described. For example, when an electron beam with a probe diameter of 300 nm is incident on a CAAC-OS including an InGaZnO$_4$ crystal in a direction parallel to the formation surface of the CAAC-OS, a diffraction pattern (also referred to as a selected-area electron diffraction pattern) shown in FIG. 42D can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 42E shows a diffraction pattern obtained in such a manner that an electron beam with a probe diameter of 300 nm is incident on the same sample in a direction perpendicular to the sample surface. As shown in FIG. 42E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 42E is considered to be derived from the (010) plane, the (100) plane, and the like of the InGaZnO$_4$ crystal. The second ring in FIG. 42E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

FIG. 43A shows a high-resolution TEM image of a cross section of the CAAC-OS that is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 43A shows pellets in which metal atoms are arranged in a layered manner. FIG. 43A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

FIGS. 43B and 43C show Cs-corrected high-resolution TEM images of a plane of the CAAC-OS observed from a direction substantially perpendicular to the sample surface. FIGS. 43D and 43E are images obtained through image processing of FIGS. 43B and 43C. The method of image processing is as follows. The image in FIG. 43B is subjected to fast Fourier transform (FFT), so that an FFT image is obtained. Then, mask processing is performed such that a range of from 2.8 nm$^{-1}$ to 5.0 nm$^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 43D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 43E, a dotted line denotes a portion where the direction of a lattice arrangement changes between a region with a regular lattice arrangement and another region with a regular lattice arrangement. A clear grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a grain boundary is inhibited. This is probably because the CAAC-OS can tolerate distortion owing to a low density of the atomic arrangement in an a-b plane direction, the interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities included in the oxide semiconductor might serve as carrier traps or carrier generation sources, for example. For example, oxygen vacancy in the oxide semiconductor might serve as a carrier trap or serve as a carrier generation source when hydrogen is captured therein.

<nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 44A:
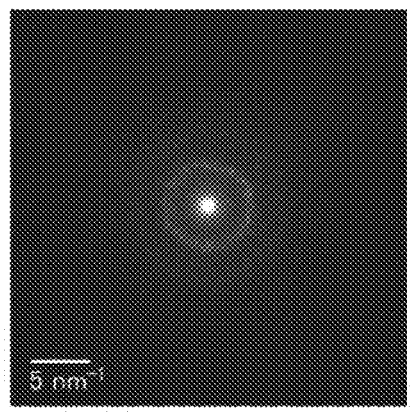
FIGS. 44A to 44D show electron diffraction patterns and a cross-sectional TEM image of an nc-OS.
Figure 44B:
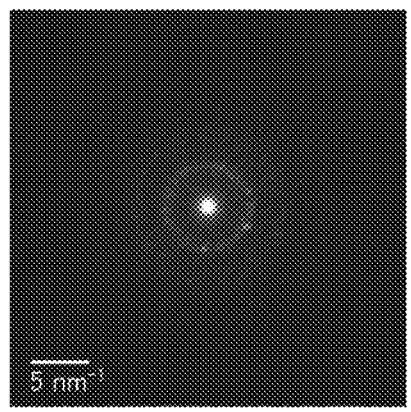

For example, when an electron beam with a probe diameter of 50 nm is incident on a 34-nm-thick region of thinned nc-OS including an InGaZnO$_4$ crystal in a direction parallel to the formation surface, a ring-shaped diffraction pattern (a nanobeam electron diffraction pattern) shown in FIG. 44A is observed. FIG. 44B shows a diffraction pattern (a nanobeam electron diffraction pattern) obtained when an electron beam with a probe diameter of 1 nm is incident on the same sample. As shown in FIG. 44B, a plurality of spots are observed in a ring-like region. In other words, ordering in an nc-OS is not observed with an electron beam with a probe diameter of 50 nm but is observed with an electron beam with a probe diameter of 1 nm.

Figure 44C:
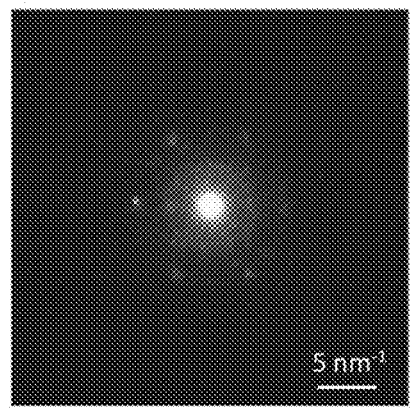

Furthermore, an electron diffraction pattern in which spots are arranged in an approximately regular hexagonal shape is observed in some cases as shown in FIG. 44C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 44D:
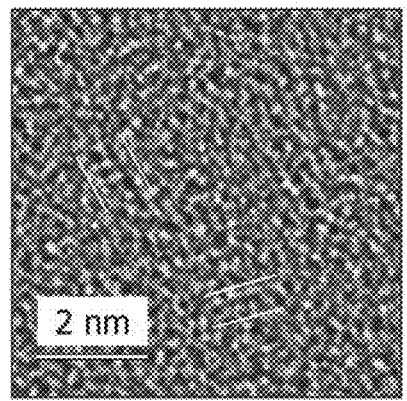

FIG. 44D shows a Cs-corrected high-resolution TEM image of a cross section of an nc-OS observed from a direction substantially parallel to the formation surface. In a high-resolution TEM image, an nc-OS has a region in which a crystal part is observed, such as the part indicated by additional lines in FIG. 44D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-Like OS>

An a-like OS has a structure between those of the nc-OS and the amorphous oxide semiconductor.

Figure 45A:
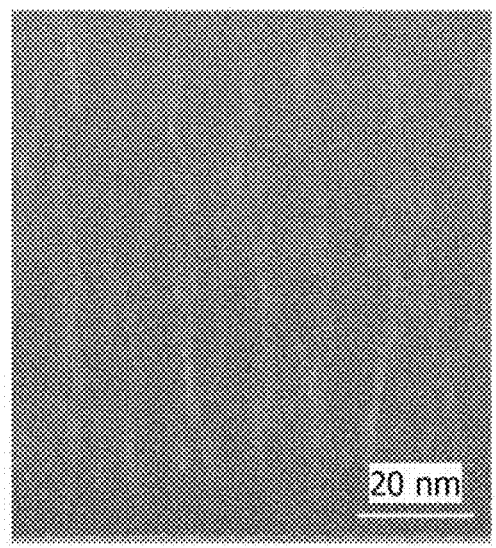
FIGS. 45A and 45B show cross-sectional TEM images of an a-like OS.
Figure 45B:
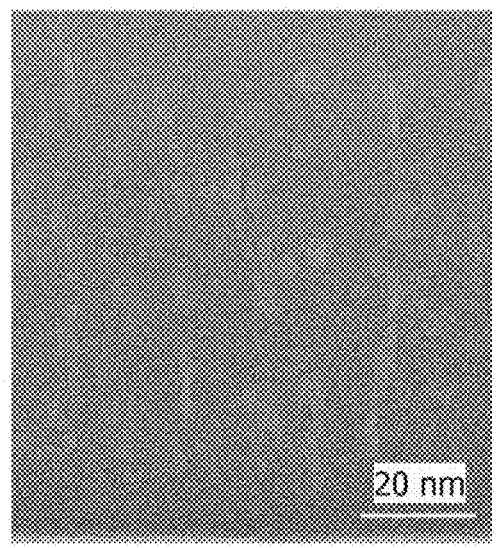

FIGS. 45A and 45B are high-resolution cross-sectional TEM images of an a-like OS. FIG. 45A is the high-resolution cross-sectional TEM image of the a-like OS at the start of the electron irradiation. FIG. 45B is the high-resolution cross-sectional TEM image of the a-like OS after the electron (e) irradiation at $4.3 \times 10^8$ e$^-$/nm$^2$. FIGS. 45A and 45B show that stripe-like bright regions extending vertically are observed in the a-like OS from the start of the electron irradiation. It can also be found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of $InGaZnO_4$ in the following description. Each of lattice fringes corresponds to the a-b plane of the $InGaZnO_4$ crystal.

Figure 46:
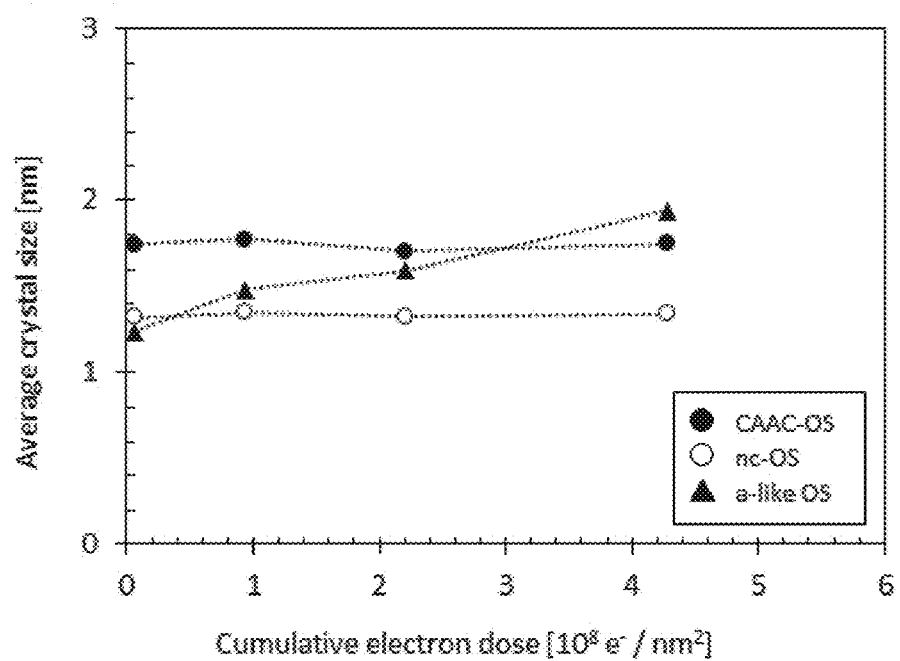
FIG. 46 shows a change in crystal part of an In—Ga—Zn oxide induced by electron irradiation.

FIG. 46 shows change in the average size of crystal parts (at 22 points to 30 points) in each sample. Note that the crystal part size corresponds to the length of a lattice fringe. FIG. 46 indicates that the crystal part size in the a-like OS increases with an increase in the cumulative electron dose in obtaining TEM images, for example. As shown in FIG. 46, a crystal part of approximately 1.2 nm (also referred to as an initial nucleus) at the start of TEM observation grows to a size of approximately 1.9 nm at a cumulative electron ($e^-$) dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. As shown in FIG. 46, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7 \times 10^5$ $e^-/(nm^2 \cdot s)$; and the diameter of the irradiation region was 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 $g/cm^3$ and lower than 6.3 $g/cm^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked film including two or more films of an amorphous oxide semiconductor, an a-like OS, an nc-OS, and a CAAC-OS, for example.

The structures described in this embodiment can be used in appropriate combination with any of the structures described in the other embodiments.

Embodiment 9

In this embodiment, examples of a package and a camera module each including an image sensor chip are described. For the image sensor chip, the structure of an imaging device of one embodiment of the present invention can be used.

Figure 47A:
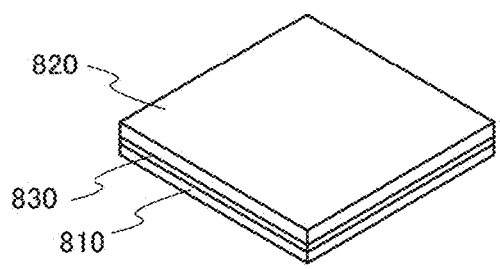
FIGS. 47A to 47D are perspective views and a cross-sectional view illustrating a package including an imaging device.

FIG. 47A is an external perspective view showing the top surface side of a package including an image sensor chip. The package includes a package substrate 810 to which an image sensor chip 850 is fixed, a cover glass 820, an adhesive 830 for bonding the package substrate 810 and the cover glass 820 to each other, and the like.

Figure 47B:
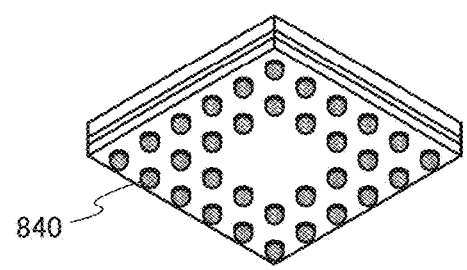

FIG. 47B is an external perspective view showing the bottom surface side of the package. On the bottom surface of the package, a ball grid array (BGA) including solder balls as bumps 840 is formed. Although the BGA is employed here, a land grid array (LGA), a pin grid array (PGA), or the like may be alternatively employed.

Figure 47C:
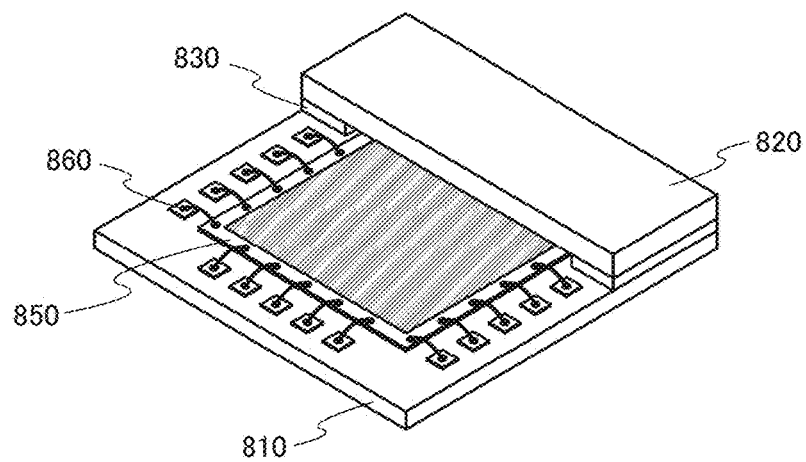
Figure 47D:
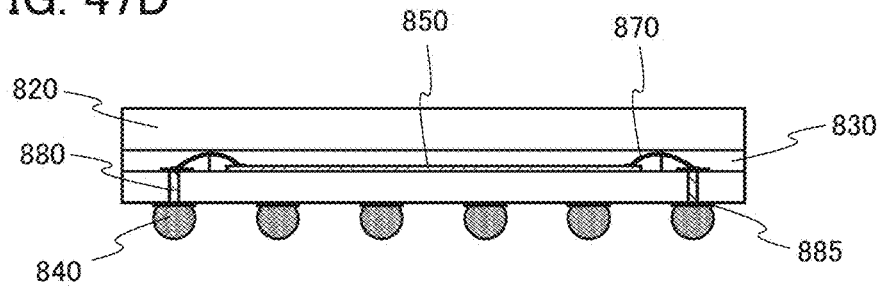

FIG. 47C is a perspective view of the package, in which the cover glass 820 and the adhesive 830 are partly illustrated. FIG. 47D is a cross-sectional view of the package. Electrode pads 860 are formed over the package substrate 810, and electrically connected to the bumps 840 through through-holes 880 and lands 885. The electrode pads 860 are electrically connected to electrodes of the image sensor chip 850 through wires 870.

Figure 48A:
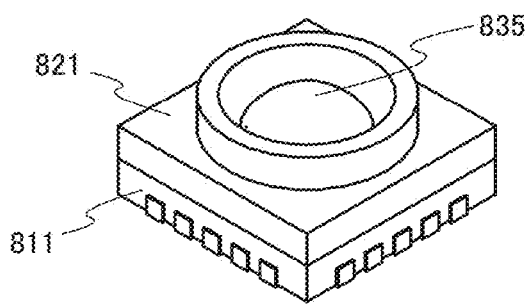
FIGS. 48A to 48D are perspective views and a cross-sectional view illustrating a package including an imaging device.

FIG. 48A is an external perspective view showing the top surface side of a camera module in which an image sensor chip is mounted on a package with a built-in lens. The camera module includes a package substrate 811 to which an image sensor chip 851 is fixed, a lens cover 821, a lens 835, and the like. Furthermore, an IC chip 890 having functions of a driver circuit, a signal conversion circuit, and the like of an imaging device is provided between the package substrate 811 and the image sensor chip 851. Thus, a system in package (SiP) is formed.

Figure 48B:
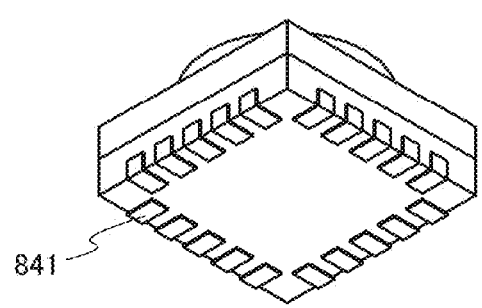

FIG. 48B is an external perspective view showing the bottom surface side of the camera module. On the bottom surface and four side surfaces of the package substrate 811, mounting lands 841 are provided; this structure can be called a quad flat no-lead package (QFN). Although QFN is employed here, a quad flat package (QFP), the above BGA, or the like may be alternatively employed.

Figure 48C:
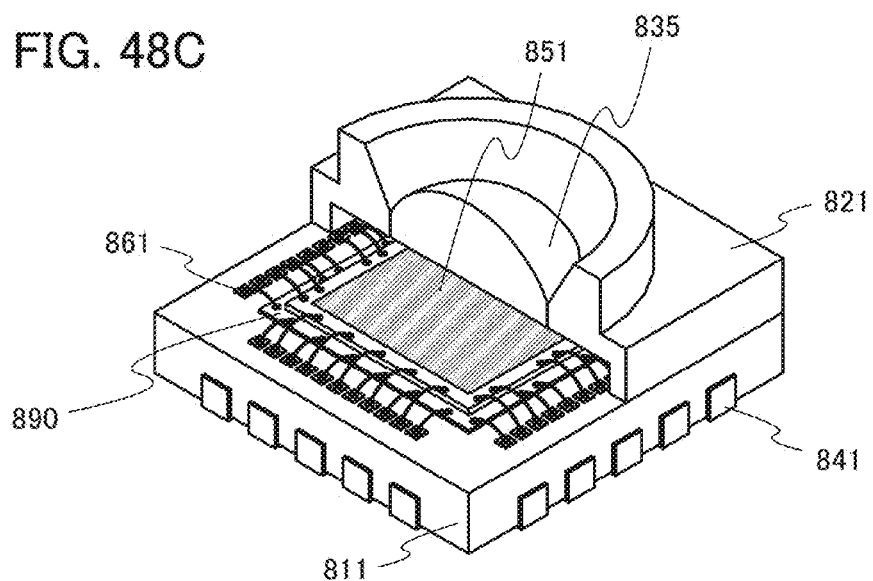
Figure 48D:
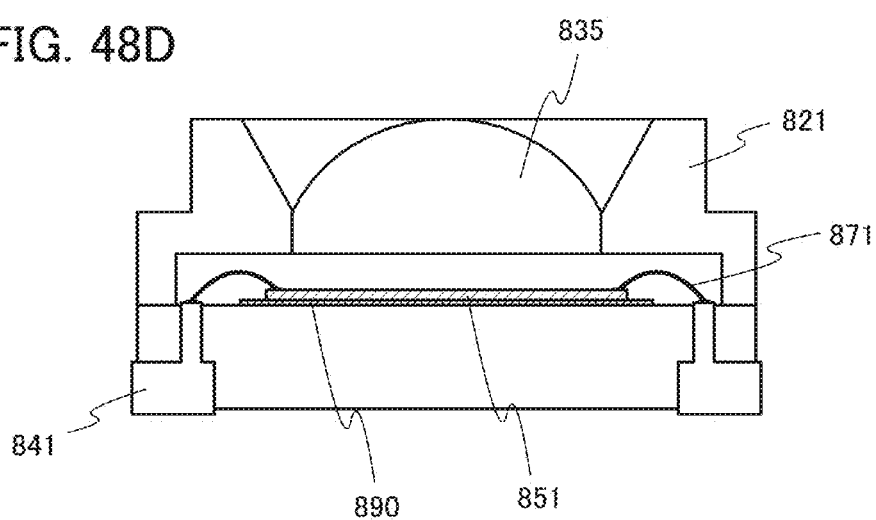

FIG. 48C is a perspective view of the module, in which the lens cover 821 and the lens 835 are partly illustrated. FIG. 48D is a cross-sectional view of the camera module. The lands 841 are partly used as electrode pads 861. The electrode pads 861 are electrically connected to electrodes of the image sensor chip 851 and the IC chip 890 through wires 871.

The image sensor chip can be easily mounted on a printed circuit board or the like by being provided in the package having the above structure, and can be incorporated into a variety of semiconductor devices or a variety of electronic devices.

The structures described in this embodiment can be used in appropriate combination with any of the structures described in the other embodiments.

Embodiment 10

Examples of the imaging device according to one embodiment of the present invention, the display device according to one embodiment of the present invention, and an electronic device that can use both of them include display devices, personal computers, image memory devices or image reproducing devices provided with storage media, mobile phones, game machines (including portable game machines), portable data terminals, e-book readers, cameras such as video cameras and digital still cameras, goggle-type displays (head mounted displays), navigation systems, audio reproducing devices (e.g., car audio players and digital audio players), copiers, facsimiles, printers, multifunction printers, automated teller machines (ATM), and vending machines. FIGS. 49A to 49E illustrate specific examples of these electronic devices.

Figure 49A:
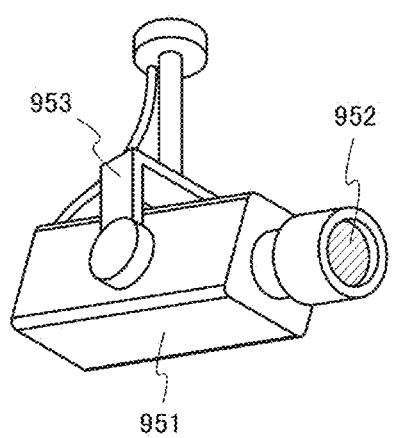
FIGS. 49A to 49E illustrate electronic devices.

FIG. 49A illustrates a monitoring camera, which includes a housing 951, a lens 952, a support portion 953, and the like. The imaging device of one embodiment of the present invention can be included as a component for obtaining an image in the monitoring camera. Note that a "monitoring camera" is a common name and does not limit the uses. For example, a device that has a function of a monitoring camera can also be called a camera or a video camera.

Figure 49B:
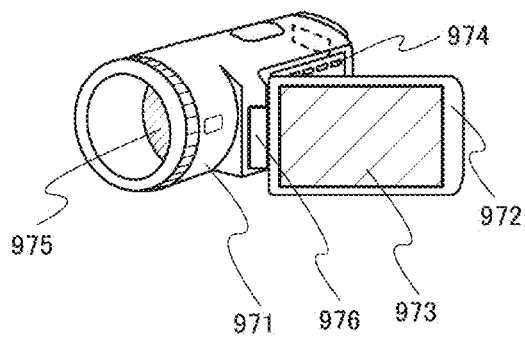

FIG. 49B illustrates a video camera, which includes a first housing 971, a second housing 972, a display portion 973, operation keys 974, a lens 975, a joint 976, and the like. The operation keys 974 and the lens 975 are provided for the first housing 971, and the display portion 973 is provided for the second housing 972. The imaging device of one embodiment of the present invention can be included as a component for obtaining an image in the video camera.

Figure 49C:
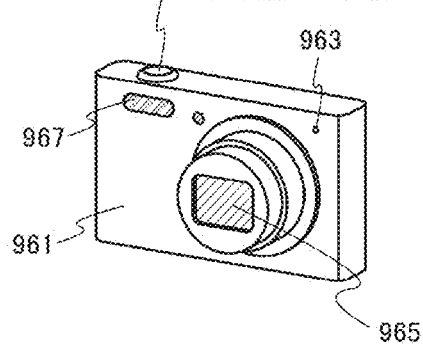

FIG. 49C illustrates a digital camera, which includes a housing 961, a shutter button 962, a microphone 963, a light-emitting portion 967, a lens 965, and the like. The imaging device of one embodiment of the present invention can be included as a component for obtaining an image in the digital camera.

Figure 49D:
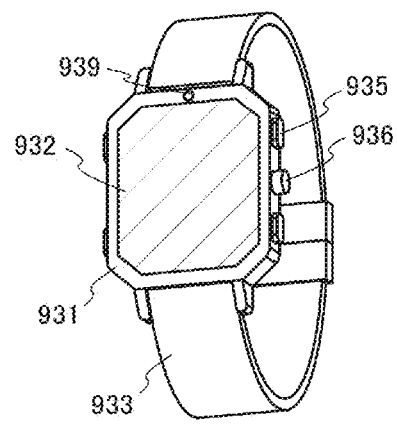

FIG. 49D illustrates a wrist-watch-type information terminal, which includes a housing 931, a display portion 932, a wristband 933, operation buttons 935, a winder 936, a camera 939, and the like. The display portion 932 may be a touch panel. The imaging device of one embodiment of the present invention can be included as a component for obtaining an image in the information terminal.

Figure 49E:
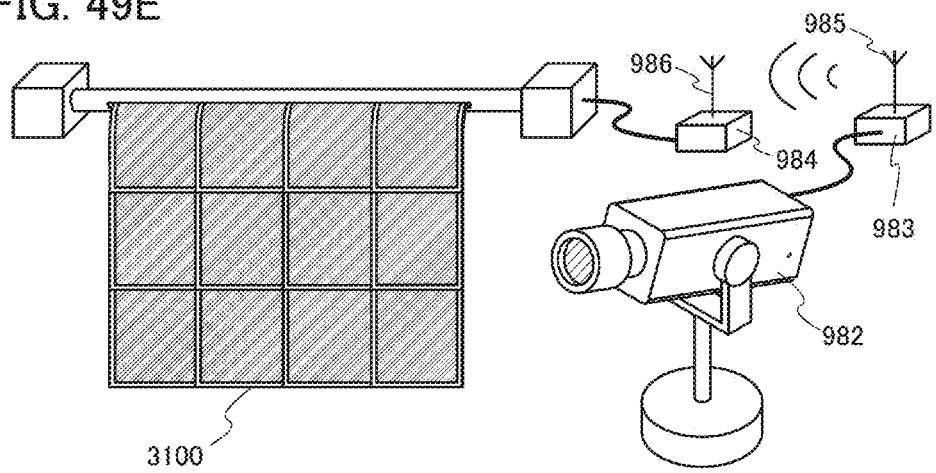

FIG. 49E illustrates an example of a specific structure of the image display system of one embodiment of the present invention, which is described in FIG. 1A. The image display system includes the following: the display device 3100 including a plurality of display regions described in Embodiment 1; a camera 982 having the imaging device including pixels, which is described in Embodiments 1 to 3; the transmitter 983 connected to an antenna 985; and the receiver 984 connected to an antenna 986. The camera 982 is connected to the transmitter 983 with a cable, and image data is transmitted to the receiver 984 wirelessly. The receiver 984 is connected to the display device 3100 and can display received image data on the display device 3100.

Note that this embodiment can be combined with any of the other embodiments in this specification as appropriate.

This application is based on Japanese Patent Application serial no. 2016-005737 filed with Japan Patent Office on Jan. 15, 2016, the entire contents of which are hereby incorporated by reference.

What is claimed is:

1. An image display system comprising:
   an imaging device comprising a first pixel block and a second pixel block; and
   a display device comprising a first display region and a second display region,
   wherein in a first mode, each of the first pixel block and the second pixel block is configured to obtain a first image data,
   wherein each of the first display region and the second display region is configured to retain the first image data and display the first image data as a first image,
   wherein in a second mode, each of the first pixel block and the second pixel block is configured to detect whether an object is changed or not,
   wherein, when one of the first pixel block and the second pixel block detects a change of the object, the one of the first pixel block and the second pixel block is configured to obtain a second image data by switching from the second mode to the first mode, and
   wherein one of the first display region and the second display region corresponding to the one of the first pixel block and the second pixel block is configured to retain the second image data and display the second image data as a second image.

2. The image display system according to claim 1, wherein the first image displayed in the one of the first display region and the second display region is rewritten to the second image.

3. The image display system according to claim 1, wherein, when the other of the first pixel block and the second pixel block detects the change of the object, the first image displayed in the other of the first display region and the second display region is rewritten.

4. The image display system according to claim 1, wherein, when the other of the first pixel block and the second pixel block does not detect the change of the object, the first image displayed in the other of the first display region and the second display region is not rewritten.

5. The image display system according to claim 1, wherein, when the other of the first pixel block and the second pixel block does not detect the change of the object, the other of the first display region and the second display region keeps displaying the first image.

6. The image display system according to claim 1,
   wherein each of the first pixel block and the second pixel block comprises a driver circuit and a first pixel,
   wherein the driver circuit comprises a first transistor comprising silicon,
   wherein the first pixel comprises a photoelectric conversion element, and wherein the first transistor and the photoelectric conversion element overlap each other.

7. The image display system according to claim 1,
wherein each of the first pixel block and the second pixel block comprises a driver circuit and a first pixel,
wherein the driver circuit comprises a first transistor comprising silicon,
wherein the first pixel comprises a photoelectric conversion element and a second transistor comprising an oxide semiconductor,
wherein the first transistor and the photoelectric conversion element overlap each other, and
wherein the photoelectric conversion element and the second transistor overlap each other.

8. The image display system according to claim 1,
wherein each of the first pixel block and the second pixel block comprises a driver circuit, a first pixel, and a data converter circuit,
wherein each of the driver circuit and the data converter circuit comprises a first transistor comprising silicon,
wherein the first pixel comprises a photoelectric conversion element, and
wherein the first transistor of one of the driver circuit and the data converter circuit and the photoelectric conversion element overlap each other.

9. The image display system according to claim 1,
wherein each of the first display region and the second display region comprises a second pixel, and
wherein the second pixel comprises a display element and a transistor comprising an oxide semiconductor.

10. The image display system according to claim 1,
wherein each of the first display region and the second display region comprises a second pixel,
wherein the second pixel comprises a display element and a transistor comprising an oxide semiconductor, and
wherein the oxide semiconductor comprise indium and zinc.

11. The image display system according to claim 1,
wherein each of the first display region and the second display region comprises a second pixel,
wherein the second pixel comprises a display element, and
wherein the display element is a liquid crystal element or a light-emitting element.

12. The image display system according to claim 1, wherein each of the first display region and the second display region has flexibility.

13. An electronic device comprising:
the image display system according to claim 1; and
a transmitter and a receiver.

14. A method for operating an image display system comprising:
the image display system comprising:
an imaging device comprising a first pixel block and a second pixel block; and
a display device comprising a first display region and a second display region,
the method comprising the steps of:
in a first mode, obtaining a first image data in each of the first pixel block and the second pixel block;
transmitting the first image data to the display device;
retaining the first image data in the first display region and the second display region and displaying the first image data as a first image in the first display region and the second display region;
in a second mode, detecting whether an object is changed or not in the first pixel block and the second pixel block;
obtaining a second image data in one of the first pixel block and the second pixel block by switching from the second mode to the first mode when the one of the first pixel block and the second pixel block detects a change of the object;
transmitting the second image data to the display device; and
retaining the second image data in one of the first display region and the second display region corresponding to the one of the first pixel block and the second pixel block, and displaying the second image data as a second image in the one of the first display region and the second display region.

15. The method for operating an image display system, according to claim 14, wherein the first image displayed in the one of the first display region and the second display region is rewritten to the second image.

16. The method for operating an image display system, according to claim 14, wherein, when the other of the first pixel block and the second pixel block detects the change of the object, the first image displayed in the other of the first display region and the second display region is rewritten.

17. The method for operating an image display system, according to claim 14, wherein, when the other of the first pixel block and the second pixel block does not detect the change of the object, the first image displayed in the other of the first display region and the second display region is not rewritten.

18. The method for operating an image display system, according to claim 14, wherein, when the other of the first pixel block and the second pixel block does not detect the change of the object, the other of the first display region and the second display region keeps displaying the first image.

* * * * *